United States Patent
Shuto

(10) Patent No.: US 11,074,972 B2
(45) Date of Patent: Jul. 27, 2021

(54) SEMICONDUCTOR CIRCUIT AND SEMICONDUCTOR CIRCUIT SYSTEM

(71) Applicant: SONY SEMICONDUCTOR SOLUTIONS CORPORATION, Kanagawa (JP)

(72) Inventor: Yusuke Shuto, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/768,879

(22) PCT Filed: Dec. 4, 2018

(86) PCT No.: PCT/JP2018/044540
§ 371 (c)(1),
(2) Date: Jun. 1, 2020

(87) PCT Pub. No.: WO2019/116961
PCT Pub. Date: Jun. 20, 2019

(65) Prior Publication Data
US 2021/0166759 A1  Jun. 3, 2021

(30) Foreign Application Priority Data

Dec. 12, 2017 (JP) ............................. JP2017-237979

(51) Int. Cl.
*G11C 14/00* (2006.01)
(52) U.S. Cl.
CPC ........ *G11C 14/0081* (2013.01); *G11C 14/009* (2013.01); *G11C 14/0072* (2013.01)
(58) Field of Classification Search
CPC .................................................. G11C 14/009
(Continued)

(56) References Cited

U.S. PATENT DOCUMENTS

2013/0308373 A1\* 11/2013 Shukh ................ G11C 14/0081
365/158
2014/0355330 A1\* 12/2014 Endoh .................. G11C 15/046
365/148
(Continued)

FOREIGN PATENT DOCUMENTS

CN        108701477 A    10/2018
JP      2013-030240 A    2/2013
(Continued)

OTHER PUBLICATIONS

International Search Report and Written Opinion of PCT Application No. PCT/JP2018/044540, dated Feb. 19, 2019, 06 pages of ISRWO.

*Primary Examiner* — Min Huang
(74) *Attorney, Agent, or Firm* — Chip Law Group

(57) ABSTRACT

A semiconductor circuit of the present disclosure includes: a first circuit that is configured to apply an inverted voltage of a voltage at a first node to a second node; a second circuit that is configured to apply an inverted voltage of a voltage at the second node to the first node; a first transistor that is configured to couple the first node to a third node to which a first memory element is coupled; a second transistor having a drain coupled to the third node and a gate coupled to a first predetermined node; a third transistor having a drain coupled to the third node and a gate coupled to a second predetermined node; a fourth transistor that is configured to couple the second node to a fourth node to which a second memory element is coupled; a fifth transistor having a drain coupled to the fourth node and a gate coupled to the second predetermined node; and a sixth transistor having a drain coupled to the fourth node and a gate coupled to the first predetermined node.

19 Claims, 46 Drawing Sheets

(58) Field of Classification Search
USPC .......................................................... 365/148
See application file for complete search history.

(56) References Cited

U.S. PATENT DOCUMENTS

2016/0283149 A1* 9/2016 Chiou ................ G11C 13/0069
2019/0325959 A1* 10/2019 Bhargava ........... G11C 14/0081

FOREIGN PATENT DOCUMENTS

| | | |
|---|---|---|
| JP | 2013-030249 A | 2/2013 |
| JP | 2013-125567 A | 6/2013 |
| JP | 2014-194834 A | 10/2014 |
| JP | 2016-018573 A | 2/2016 |
| JP | 2017-208146 A | 11/2017 |
| KR | 10-2018-0115268 A | 10/2018 |
| TW | 201812772 A | 4/2018 |
| WO | 2009/028298 A1 | 3/2009 |
| WO | 2017/150028 A1 | 9/2017 |
| WO | 2017/199677 A1 | 11/2017 |

* cited by examiner

[FIG. 1]
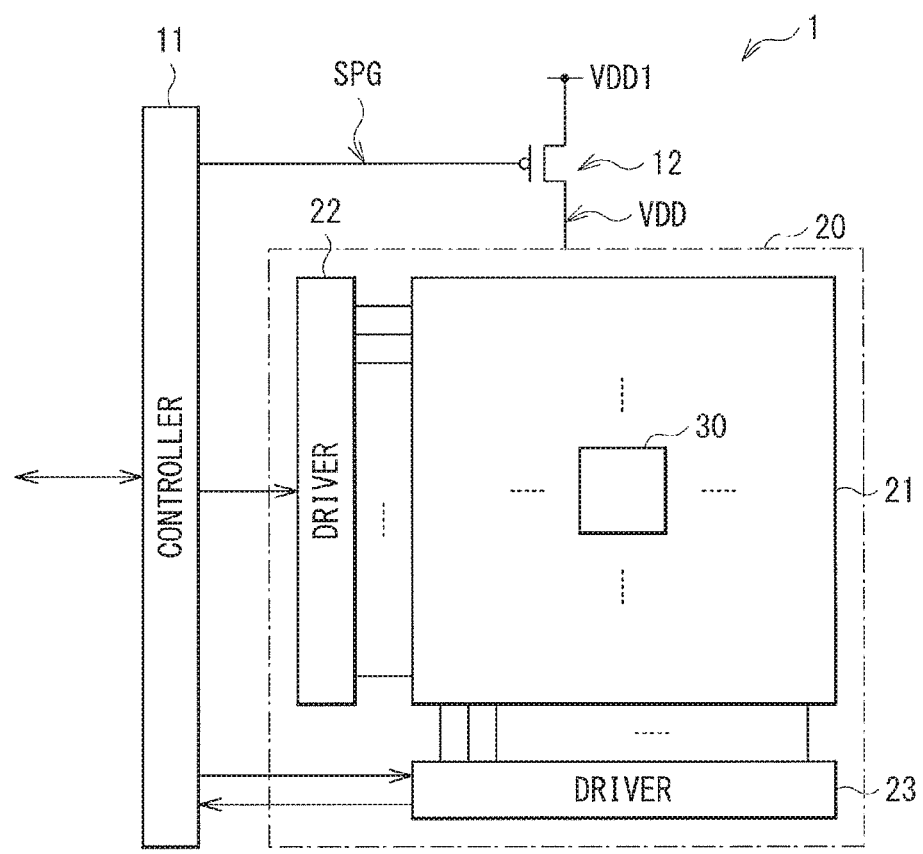

[FIG. 2]
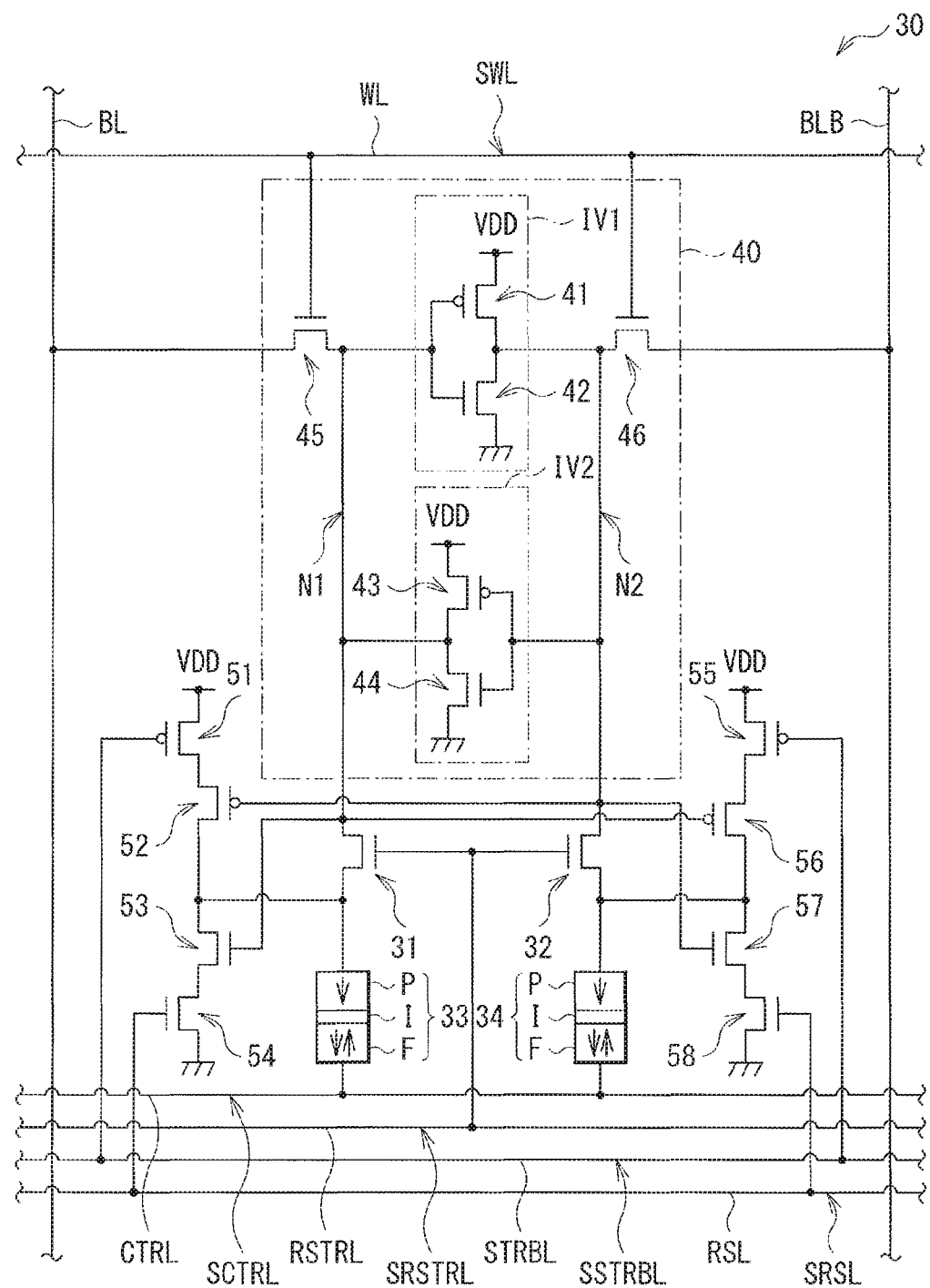

[FIG. 3]
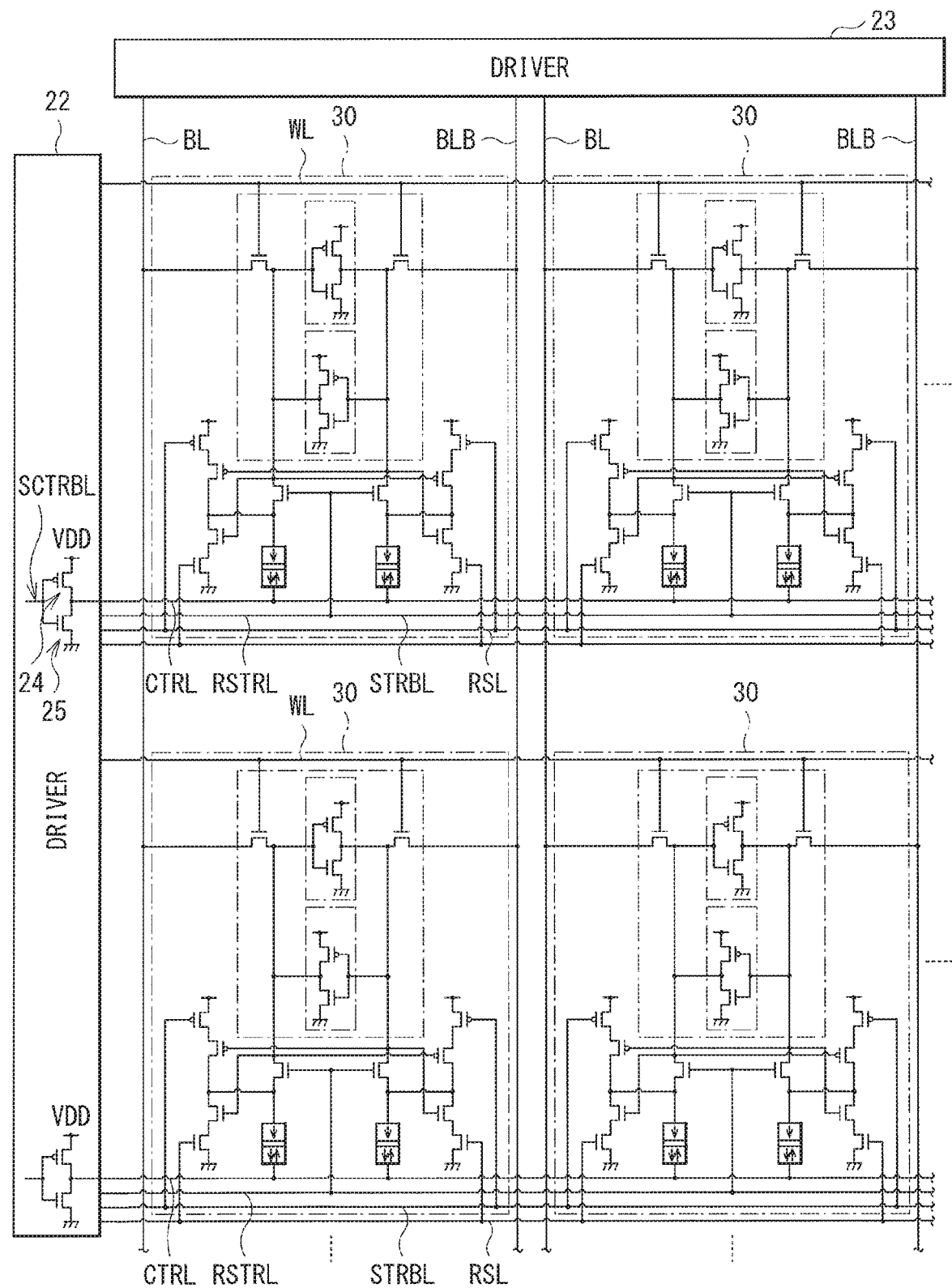

[FIG. 4]
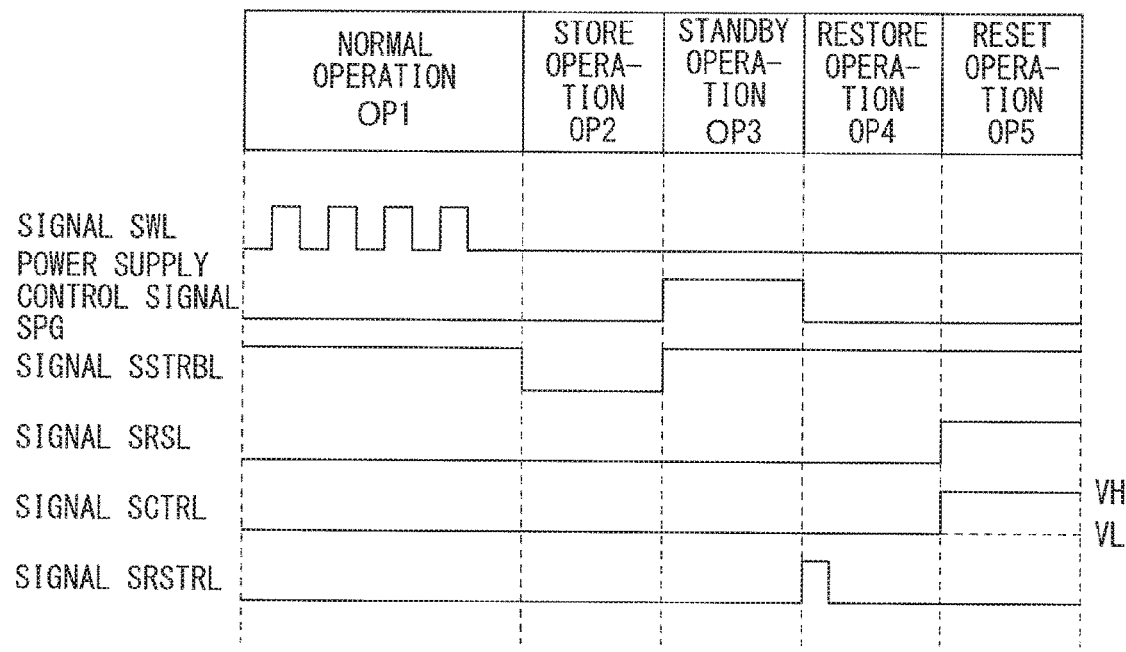

[FIG. 5A]
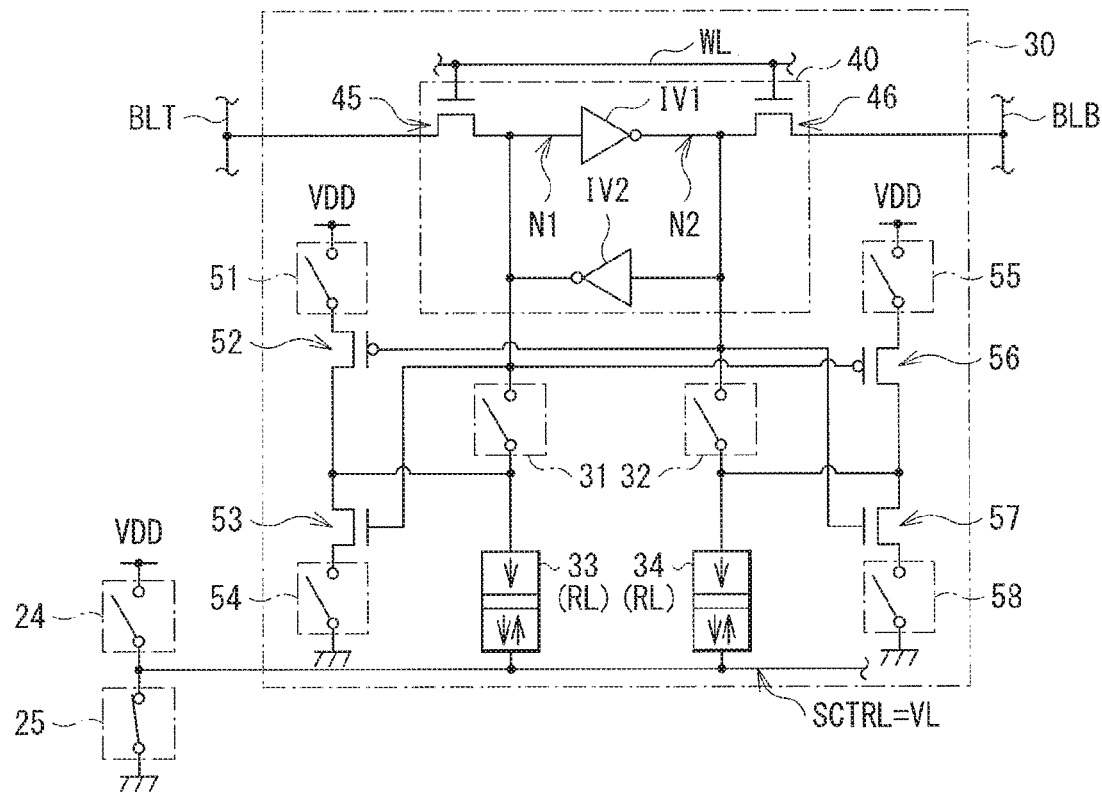
[FIG. 5B]
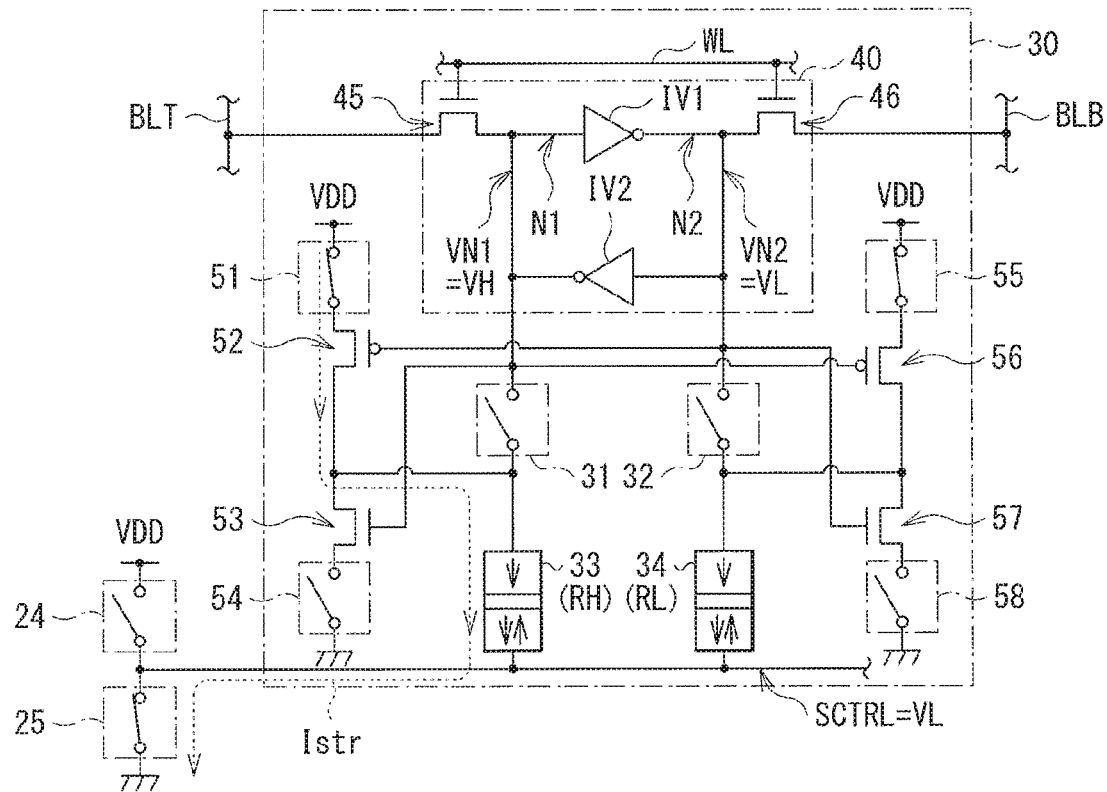

[FIG. 5C]
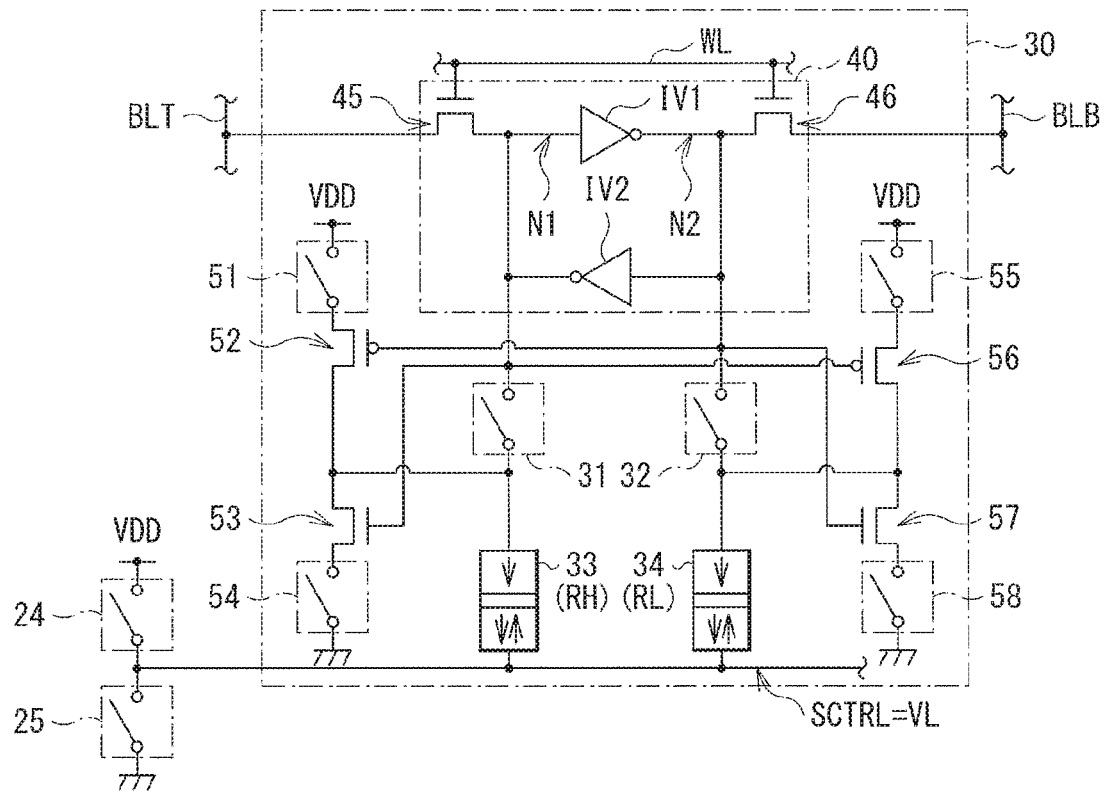
[FIG. 5D]
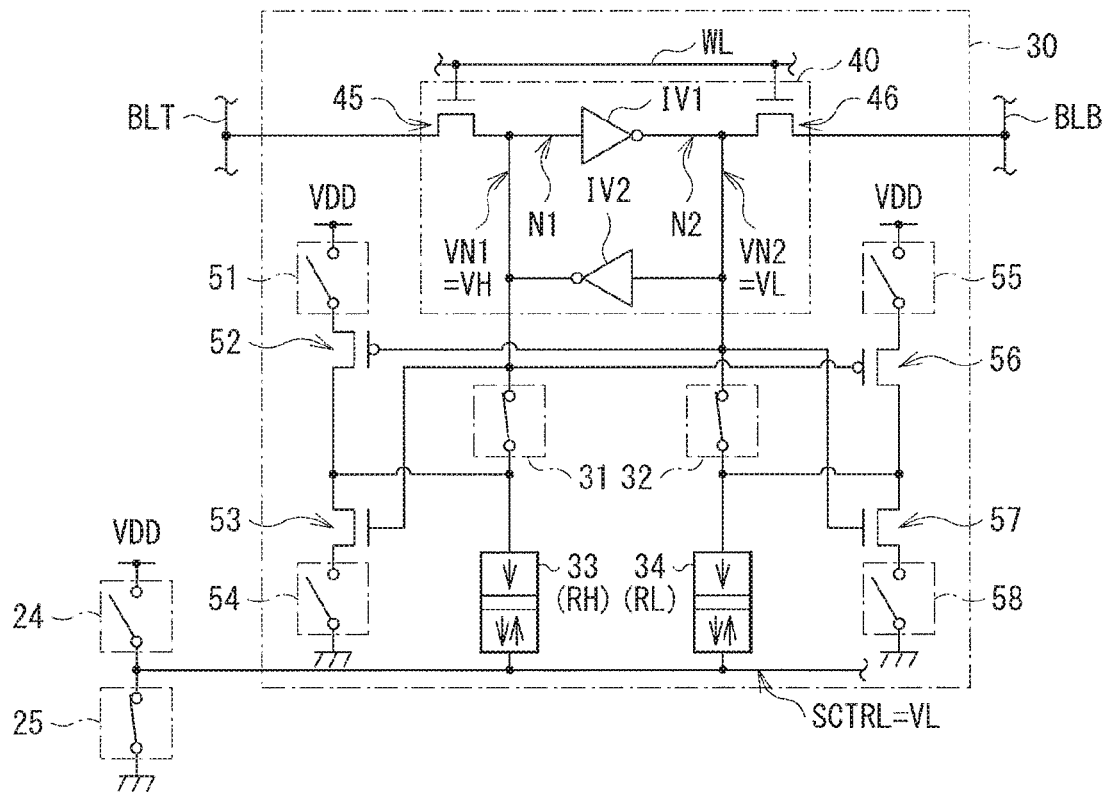

[FIG. 5E]
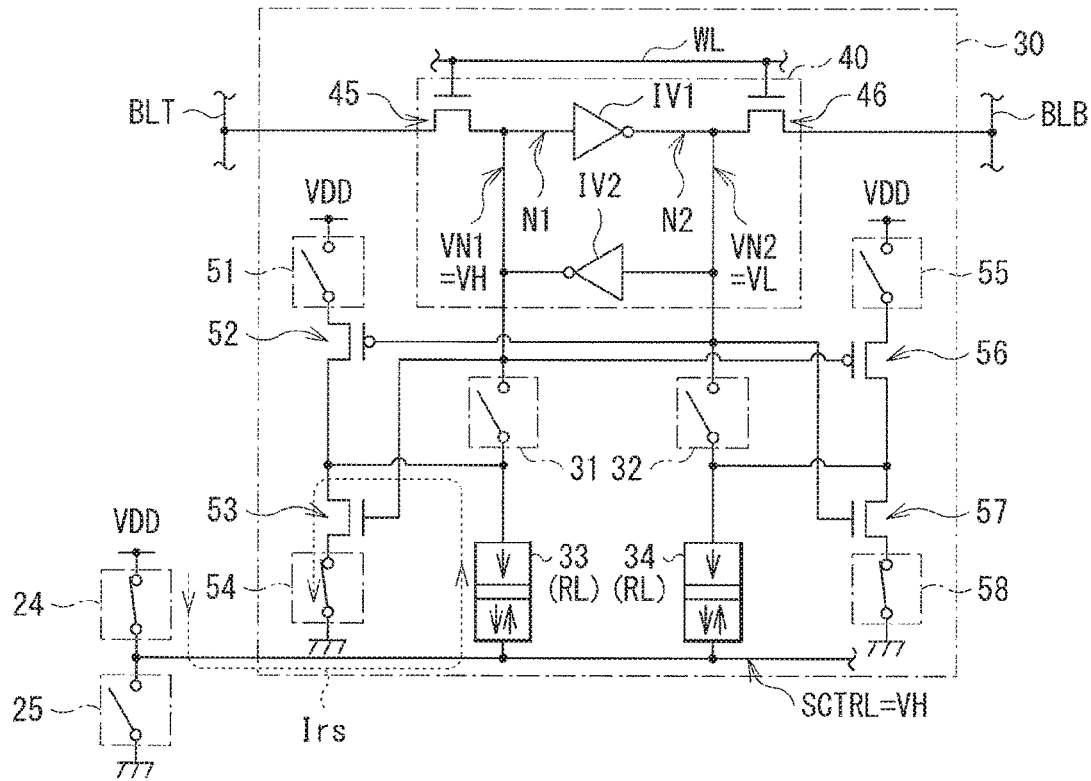
[FIG. 6]
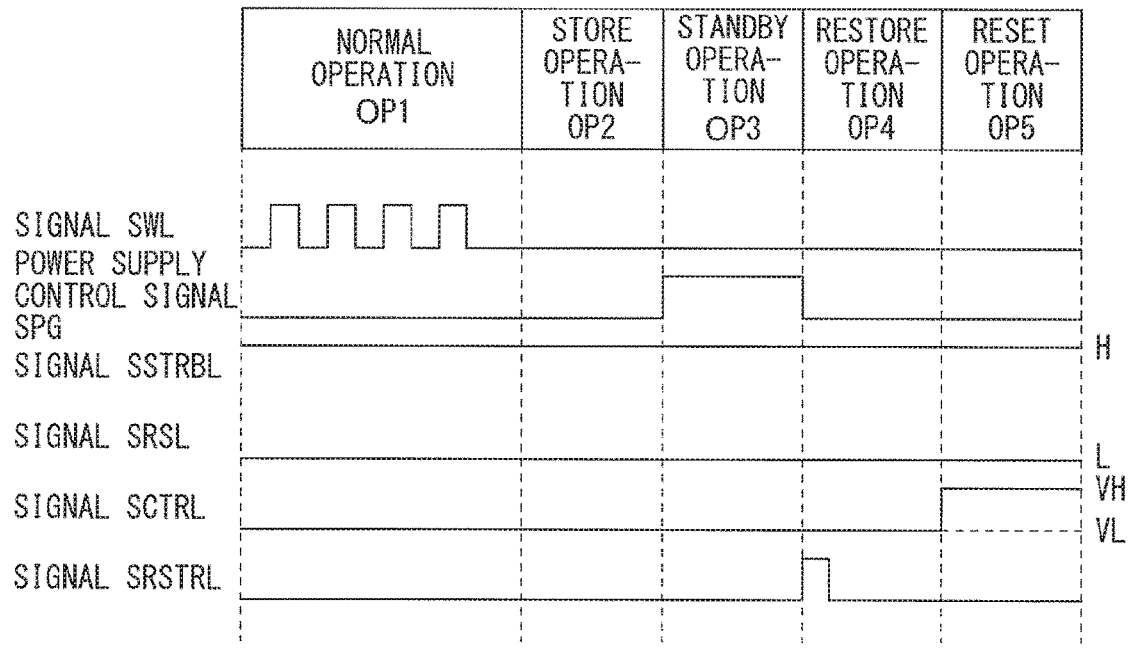

[FIG. 7]
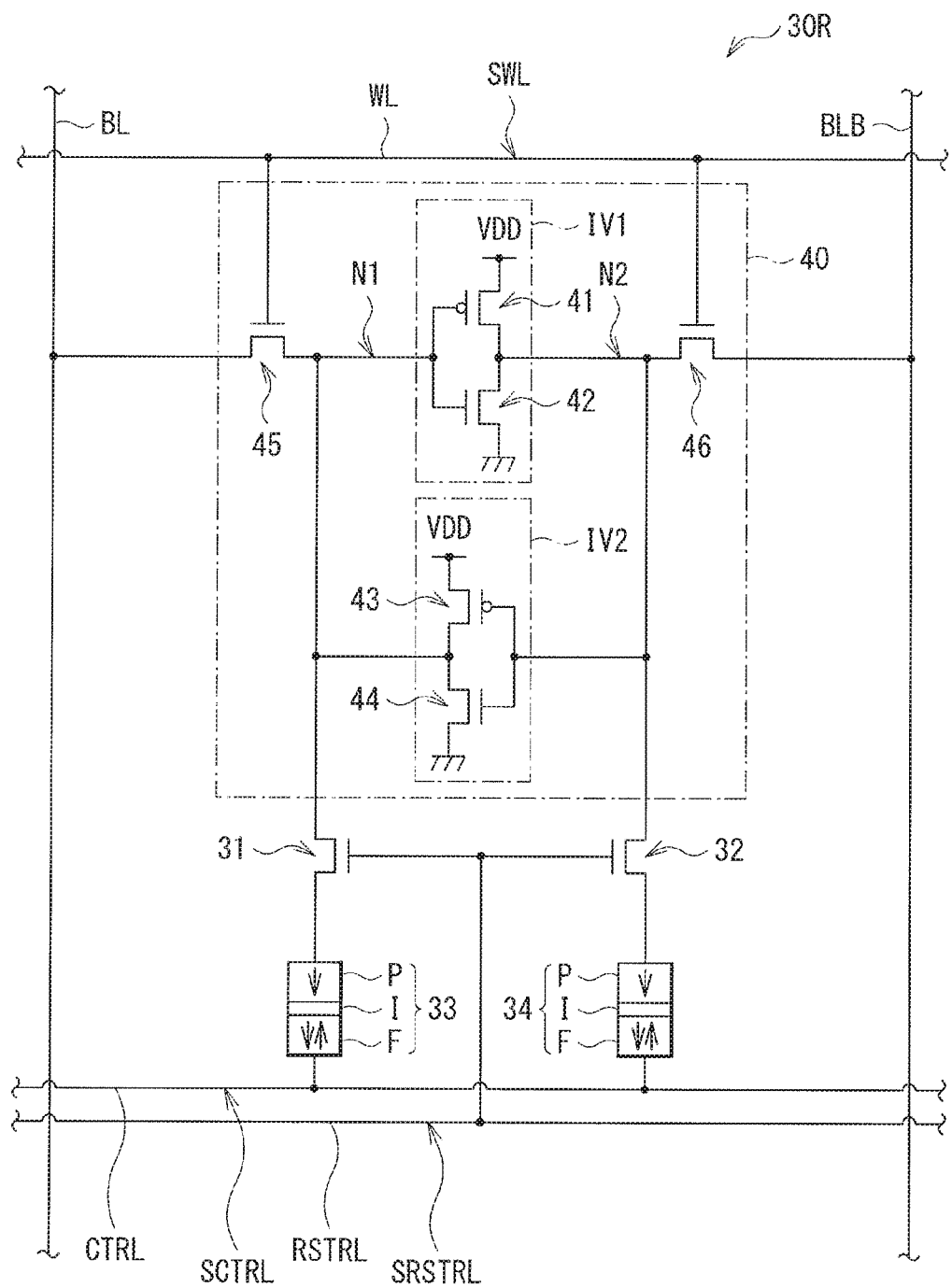

[FIG. 8]
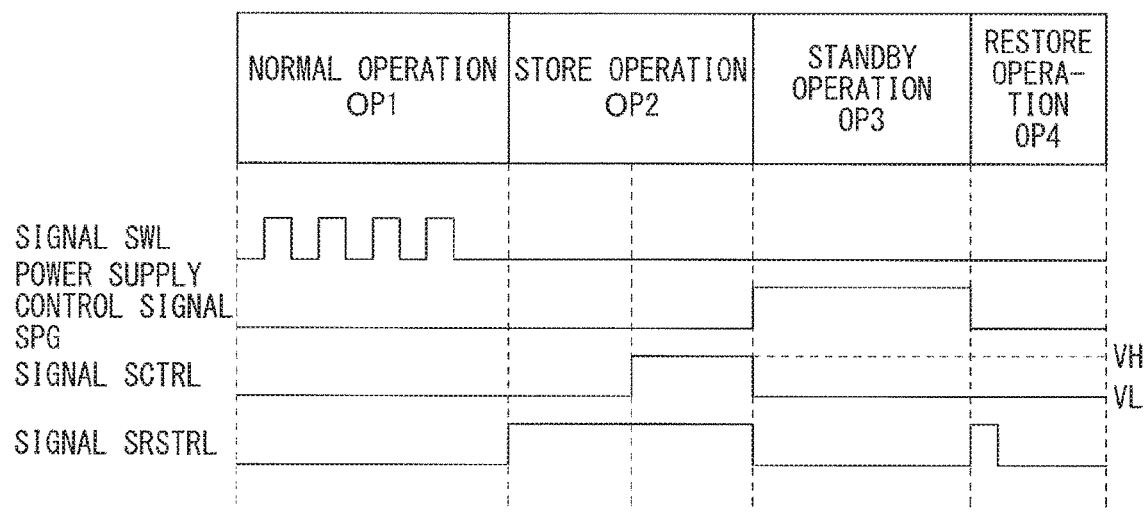

[FIG. 9A]
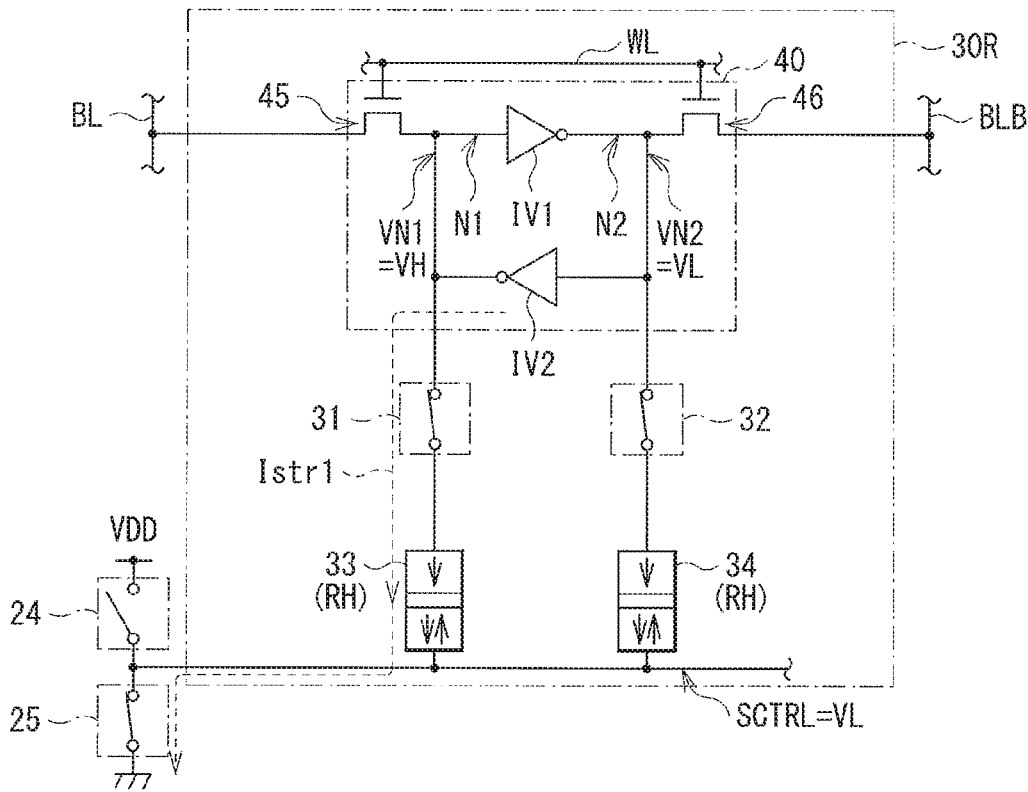
[FIG. 9B]
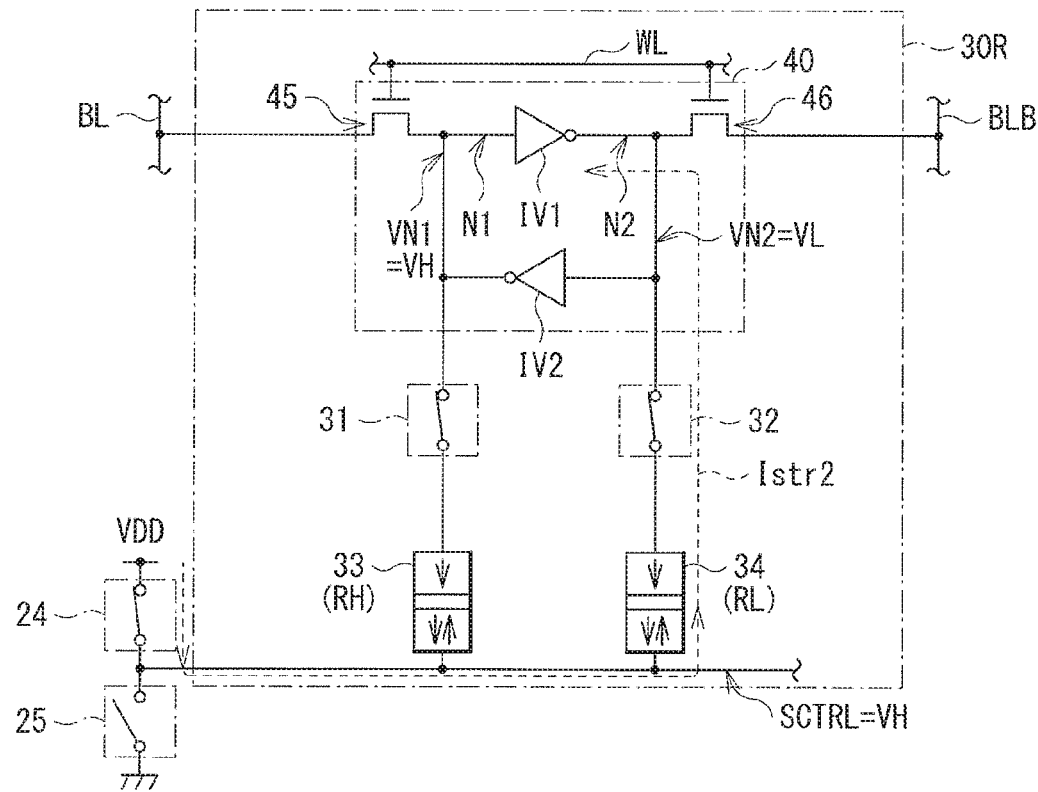

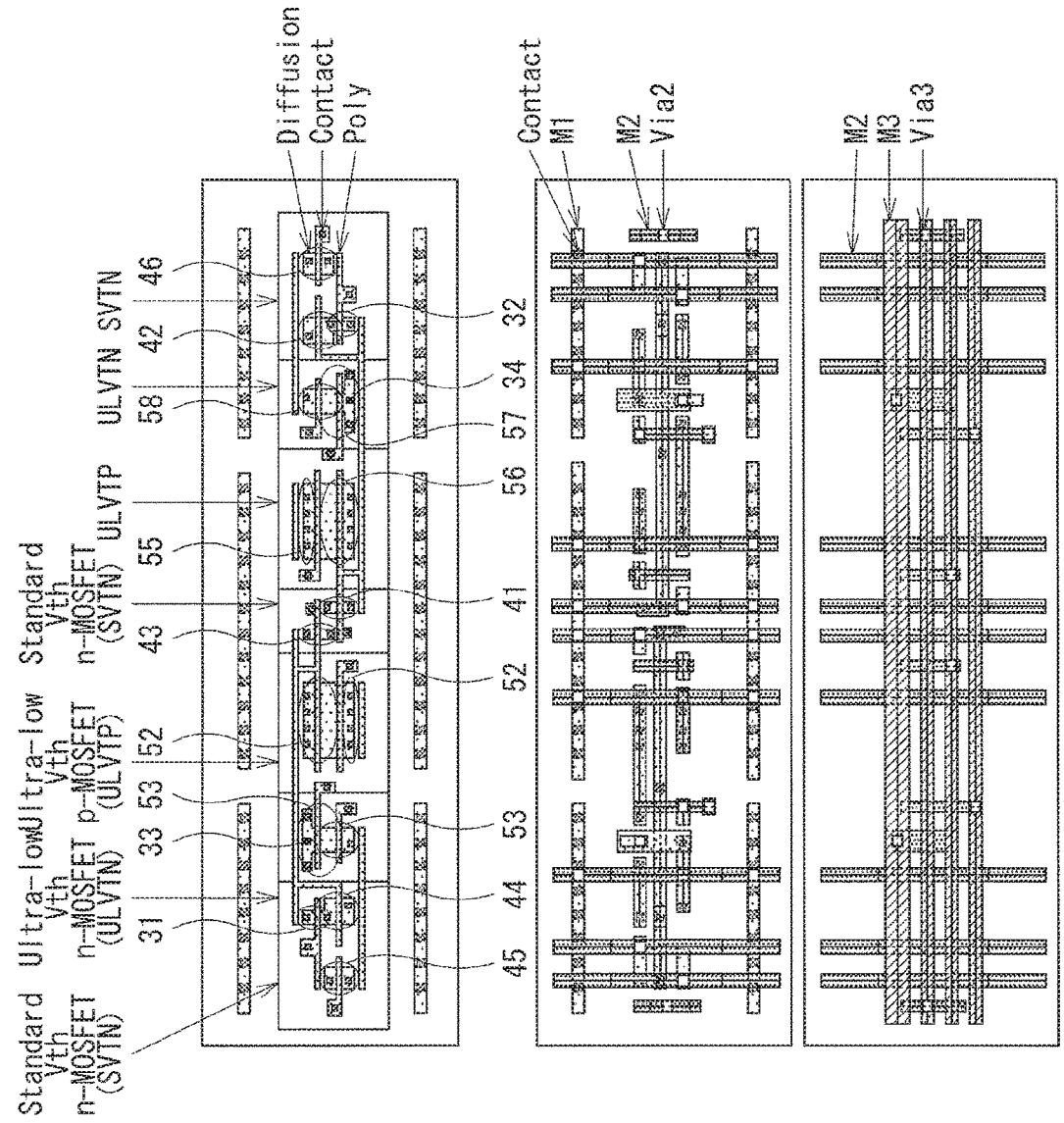
[FIG. 10]

[FIG. 11]
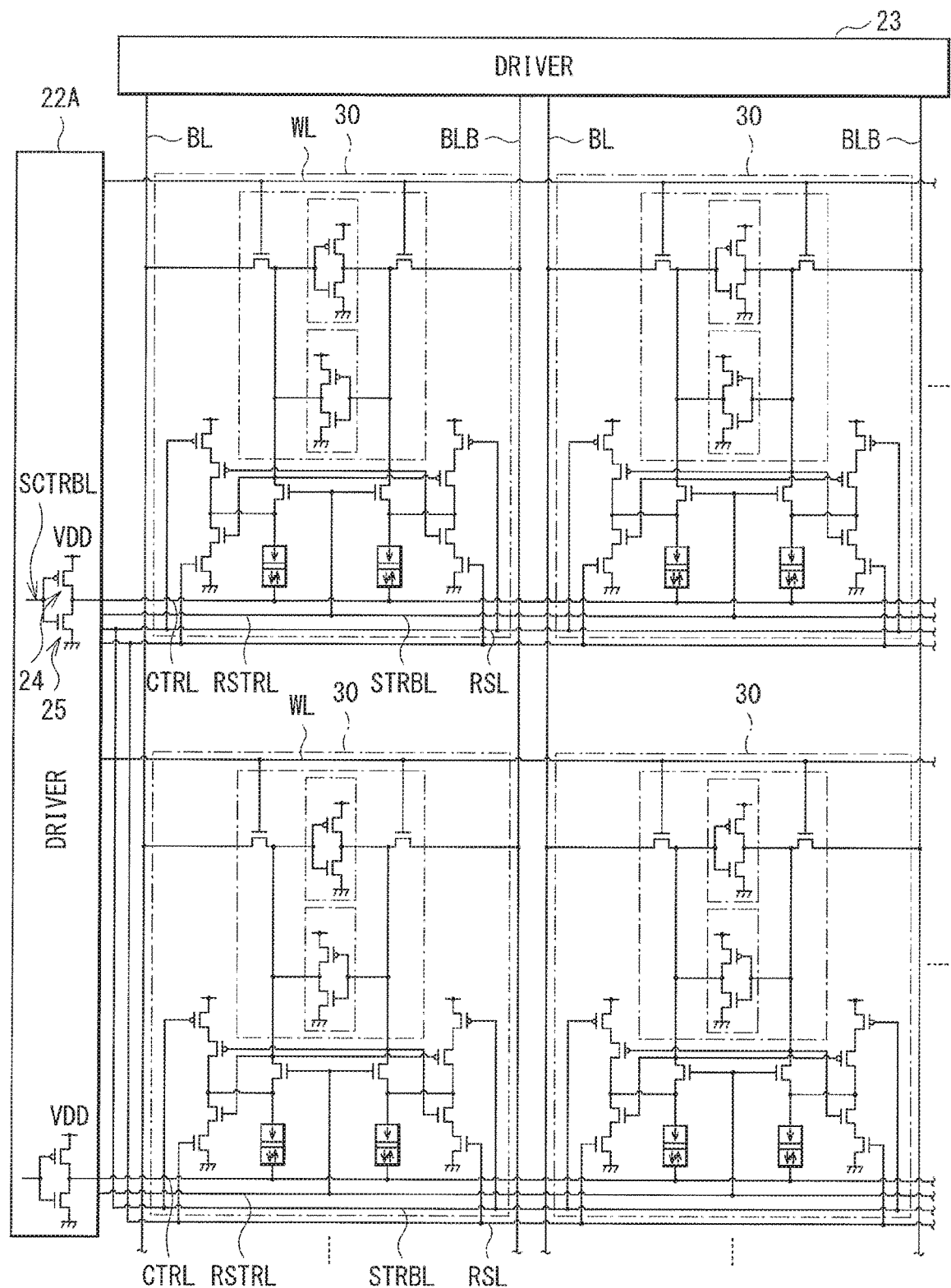

[FIG. 12]
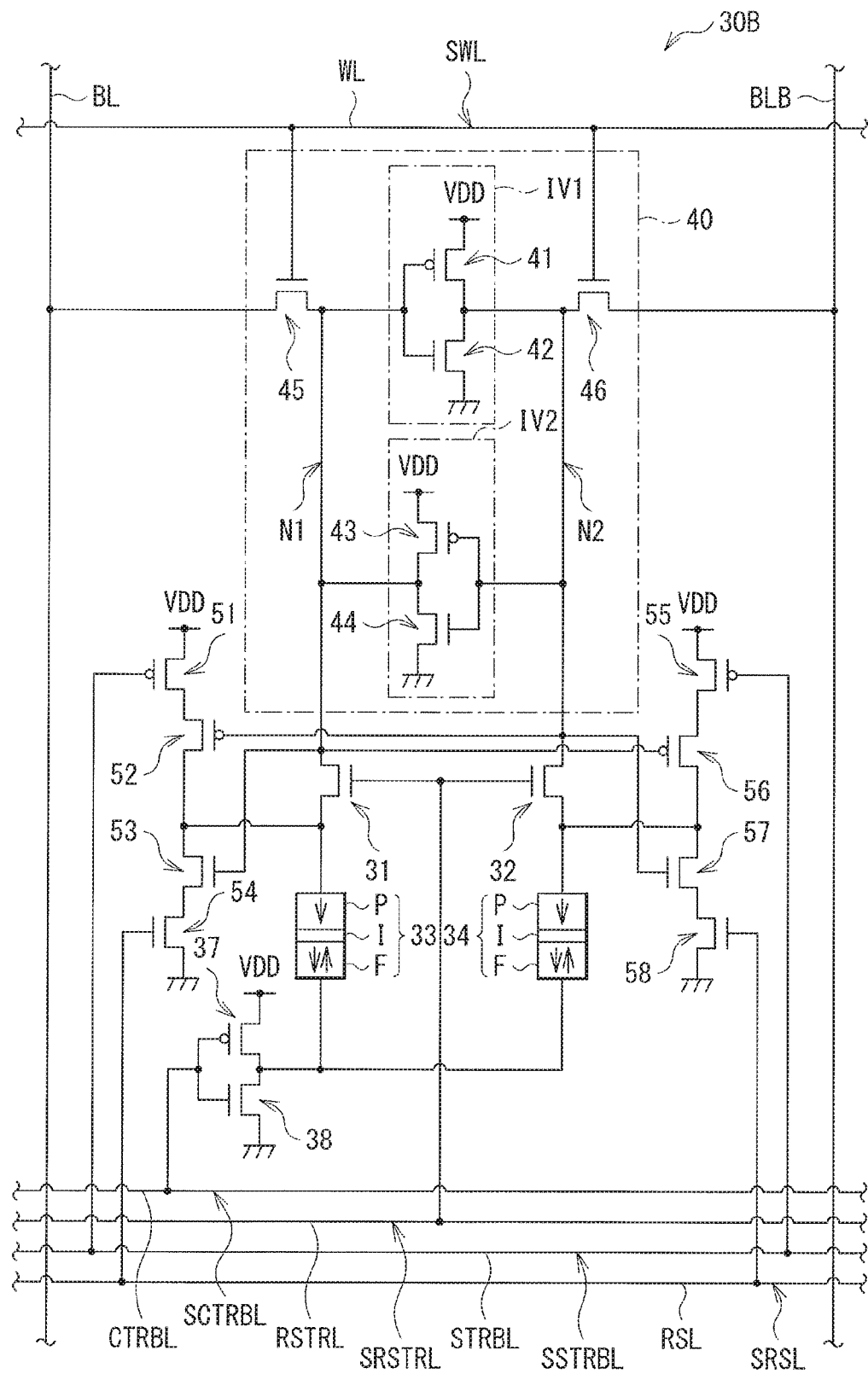

[FIG. 13]
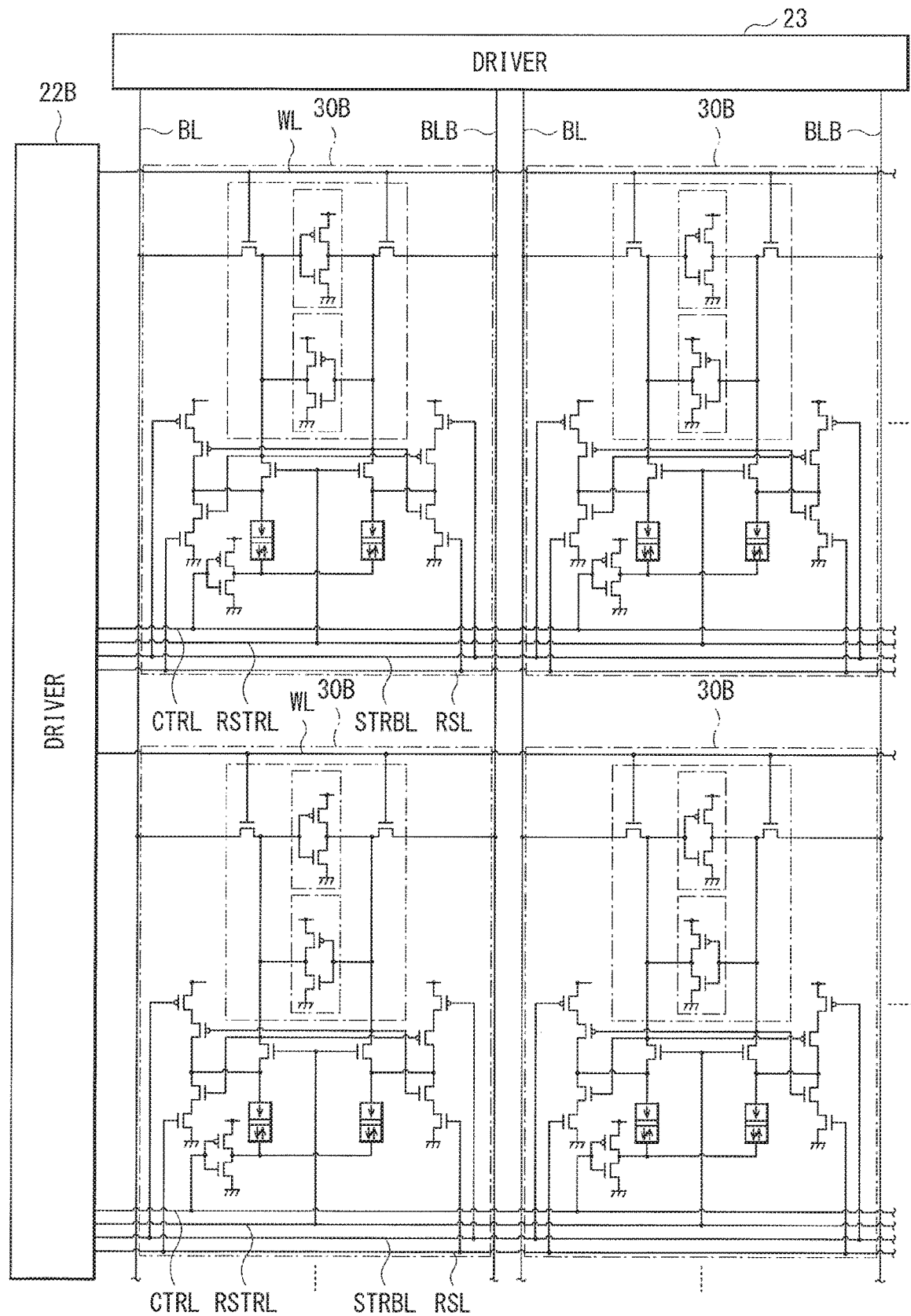

[FIG. 14]
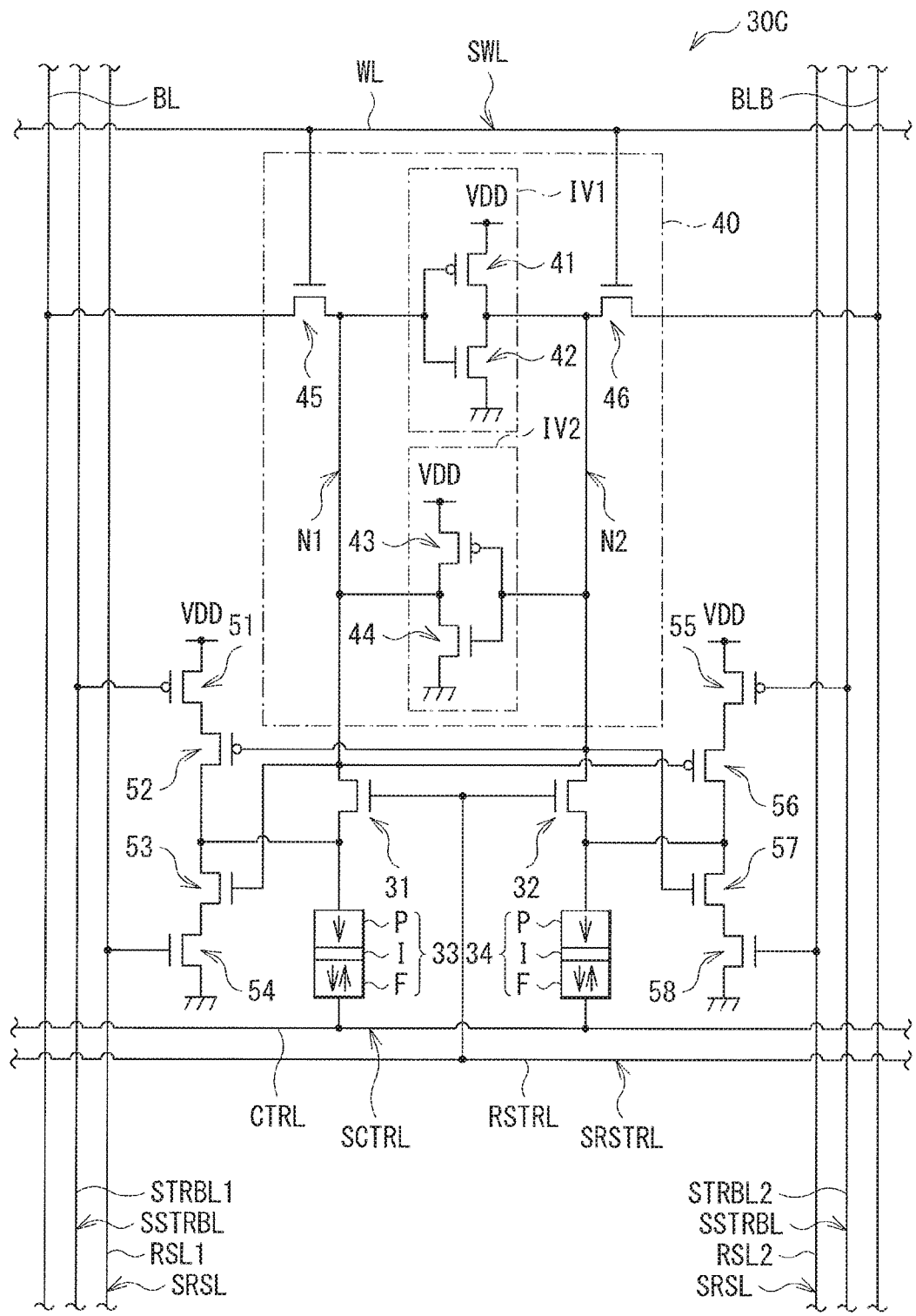

[FIG. 15]
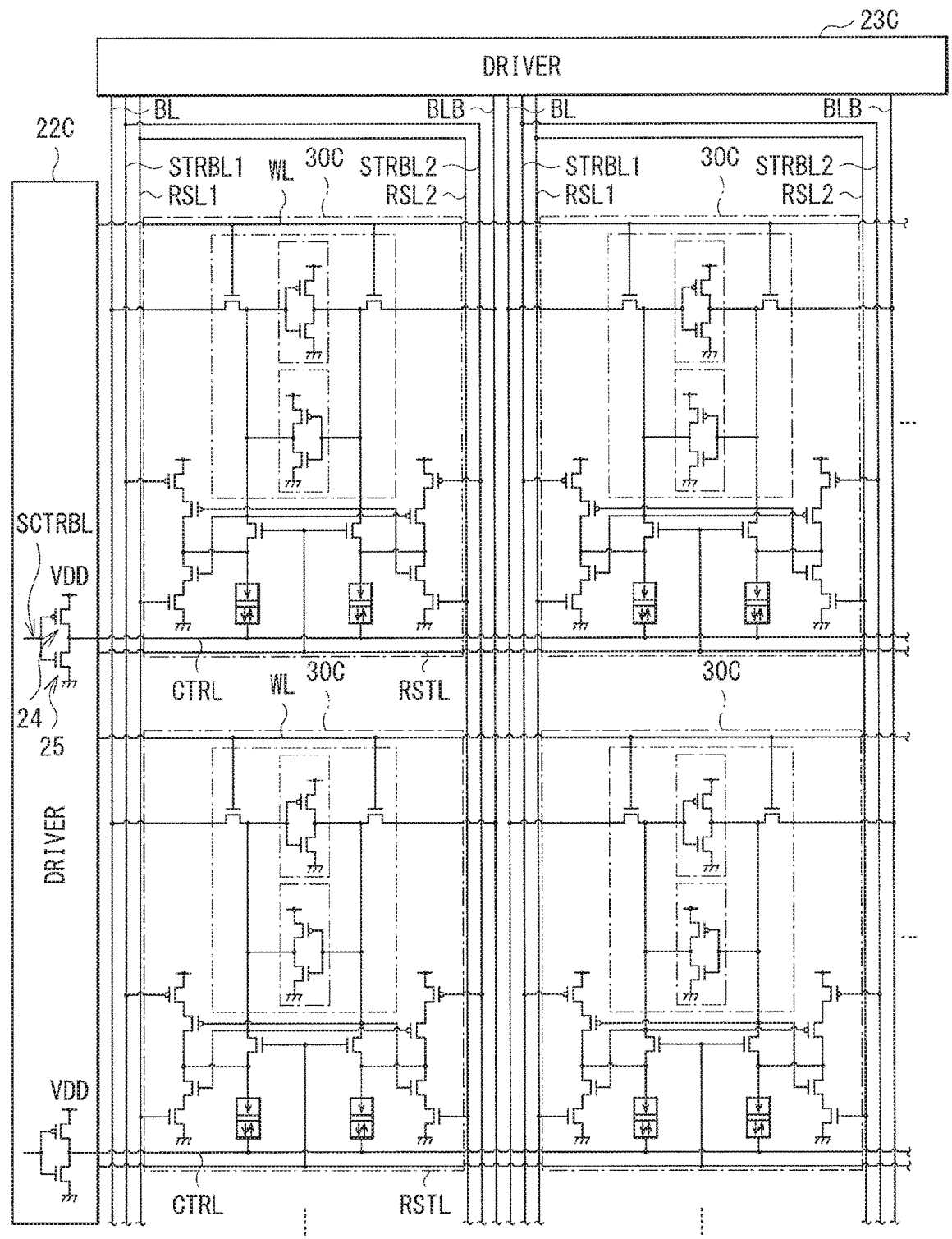

[FIG. 16]
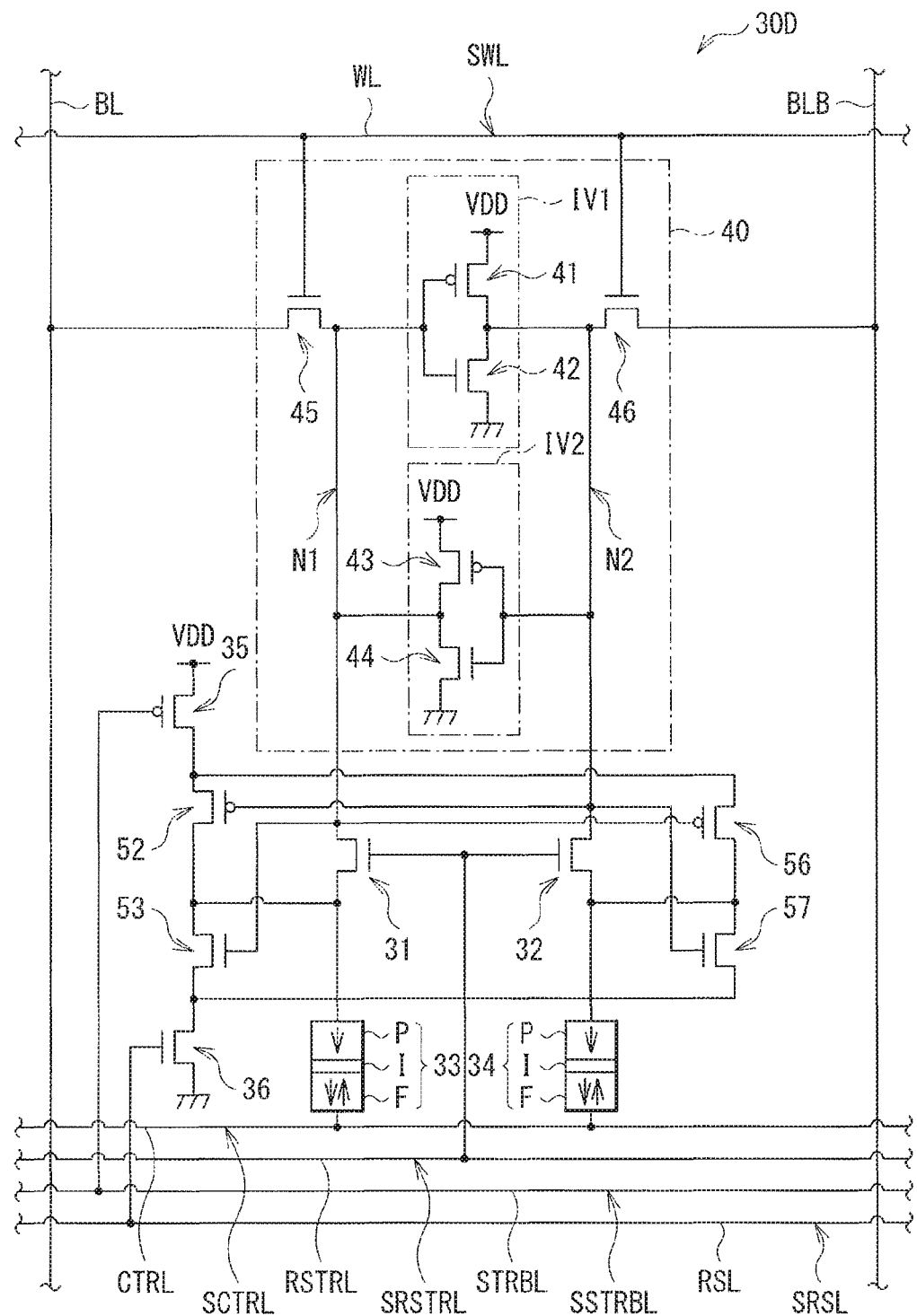

[FIG. 17A]
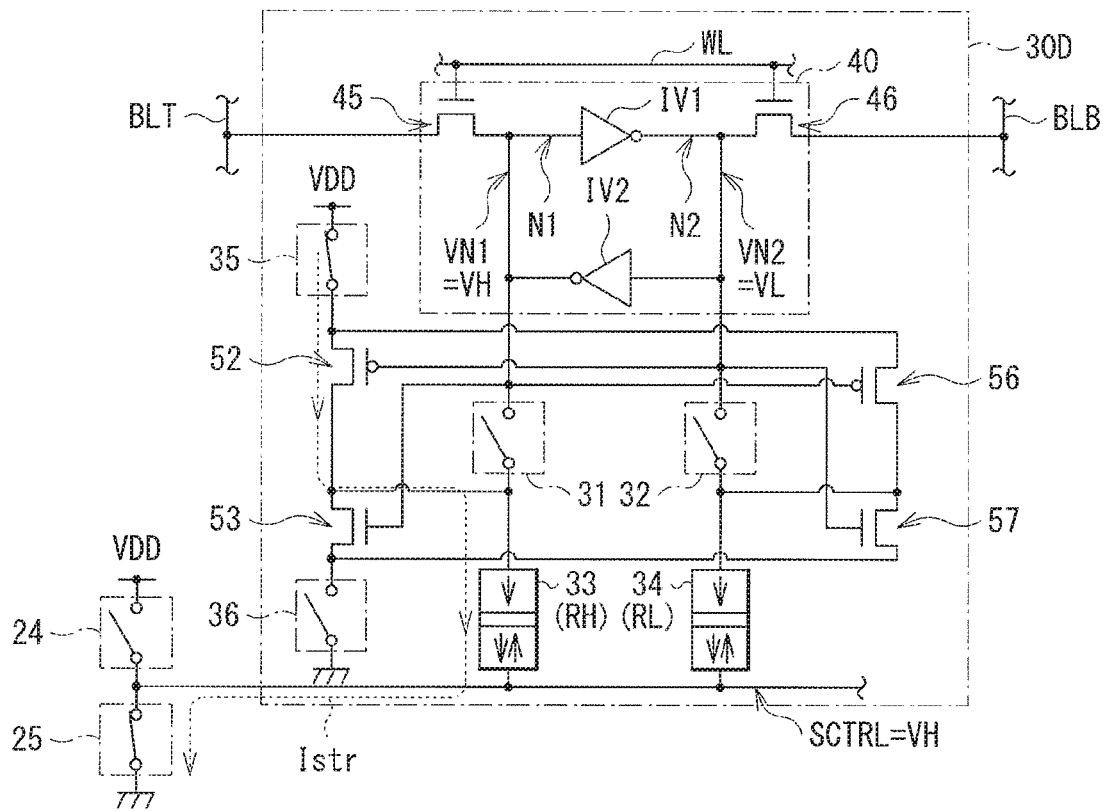
[FIG. 17B]
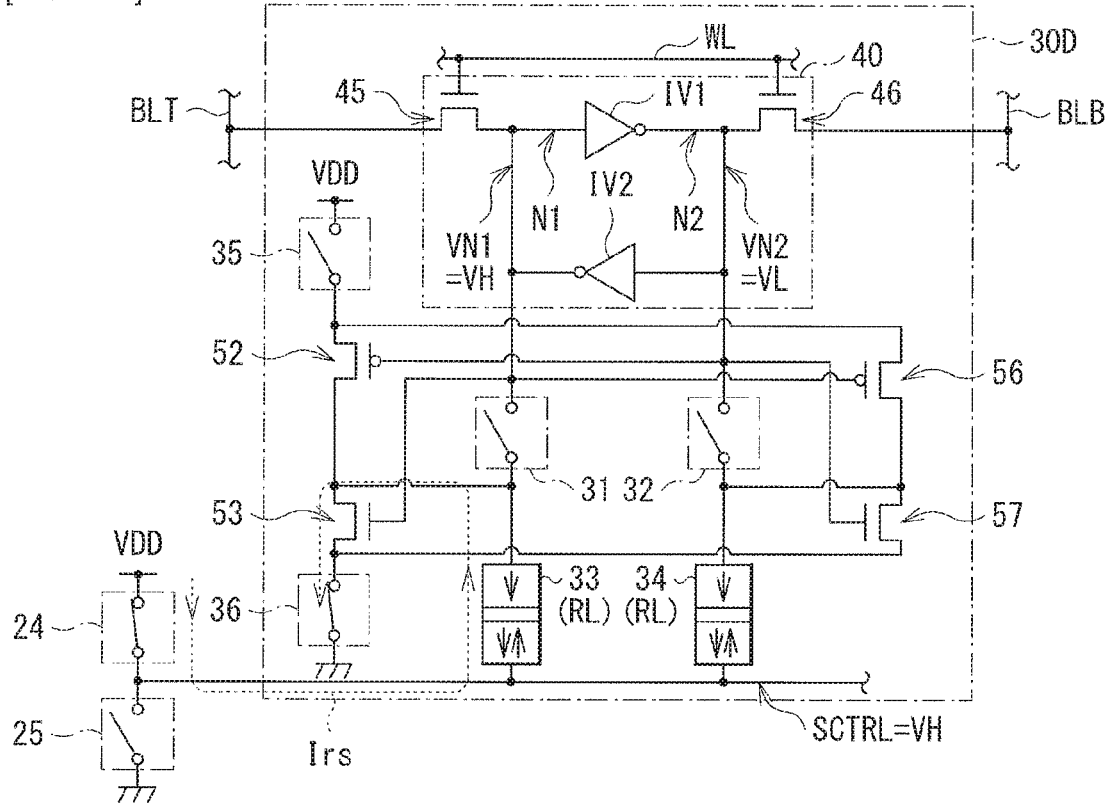

[FIG. 18]
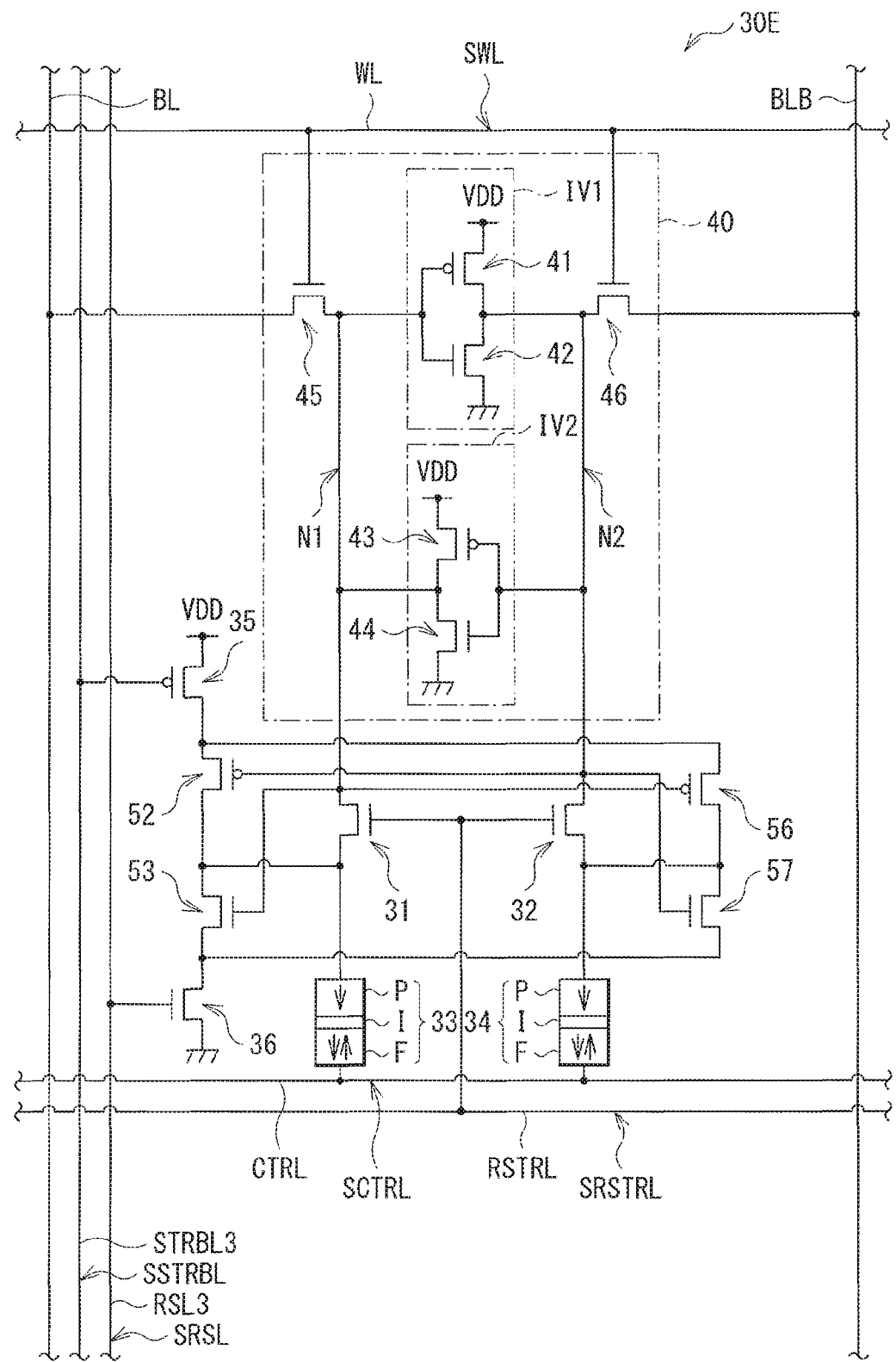

[FIG. 19]
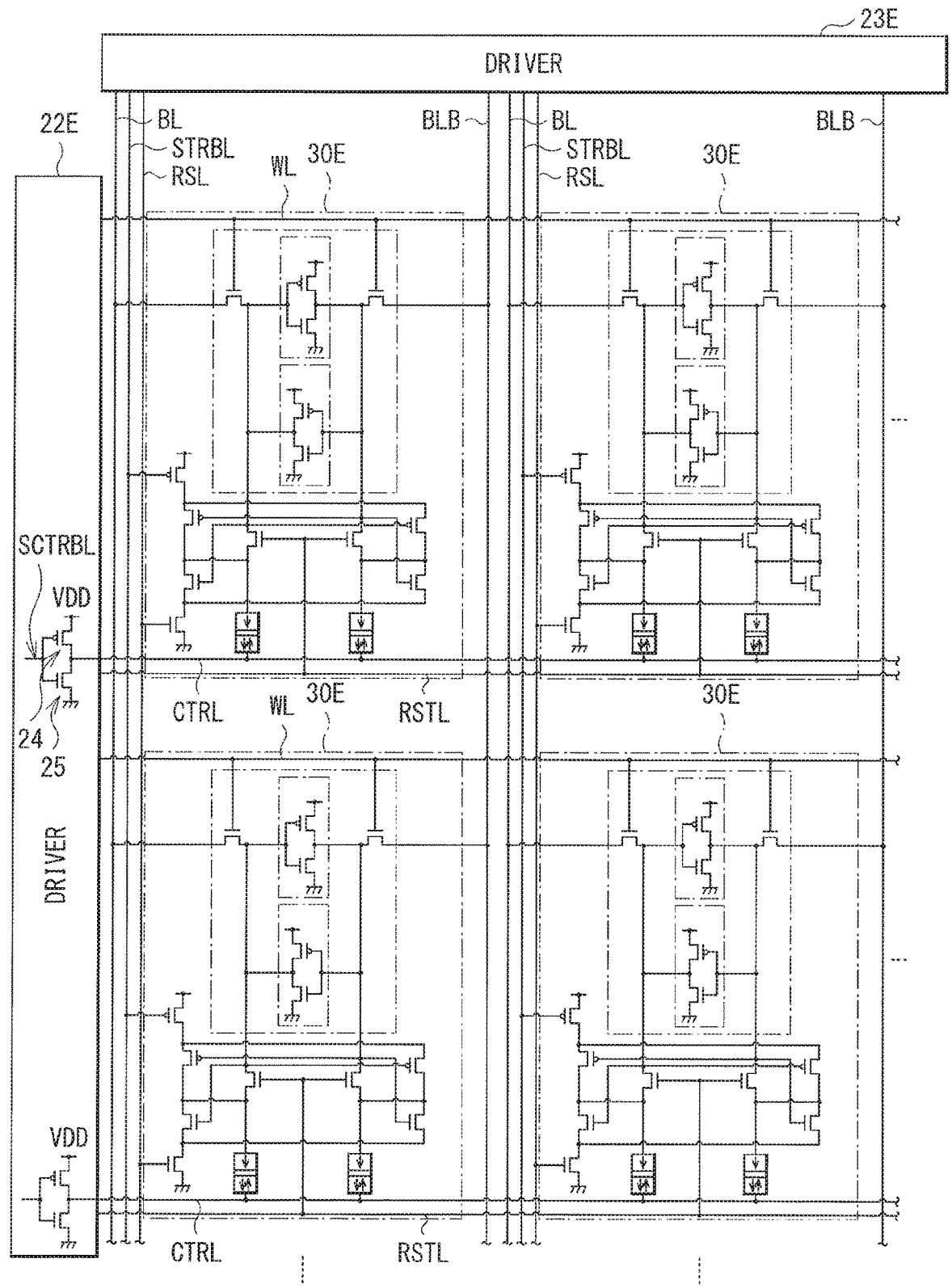

[FIG. 20]
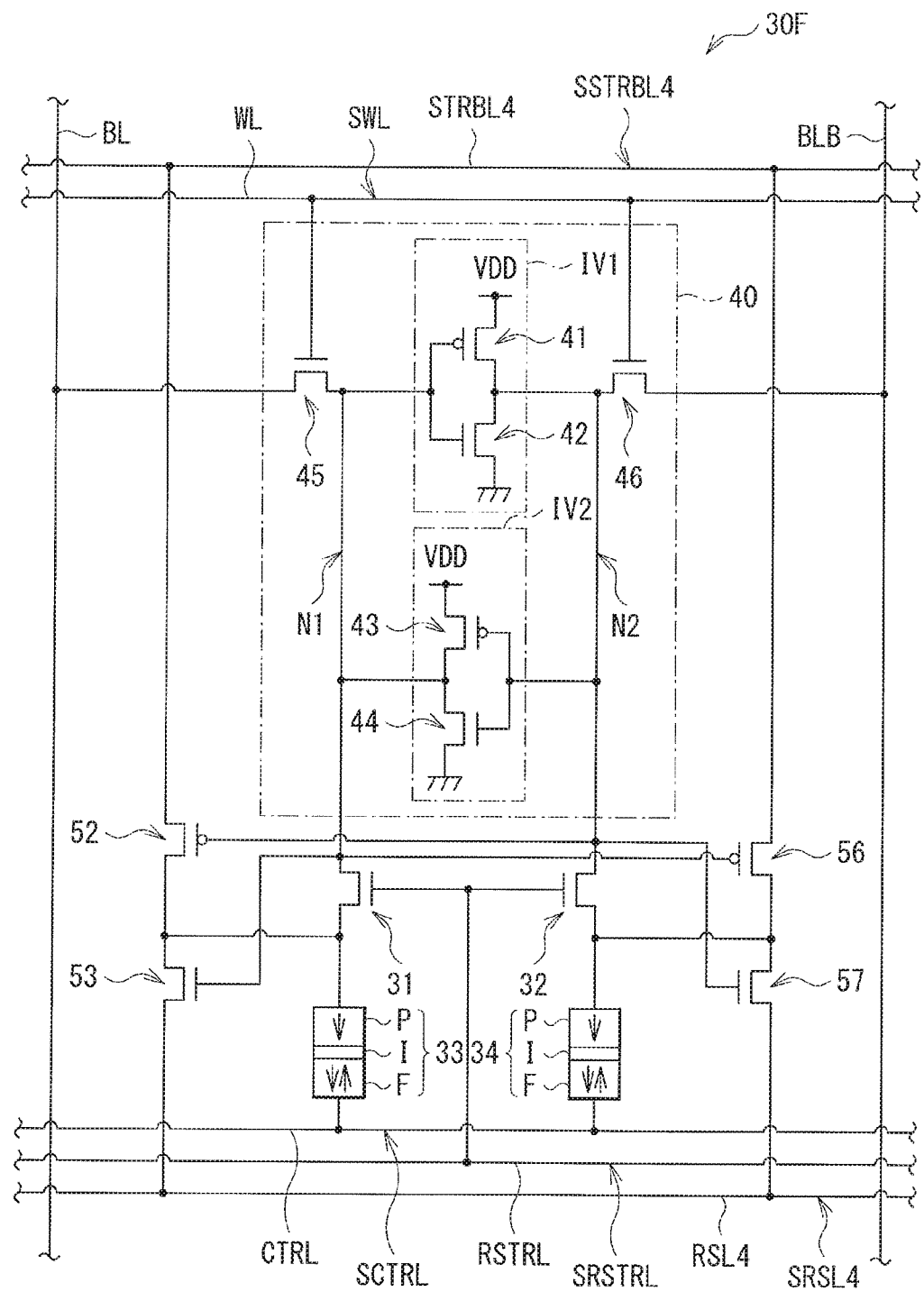

[FIG. 21]
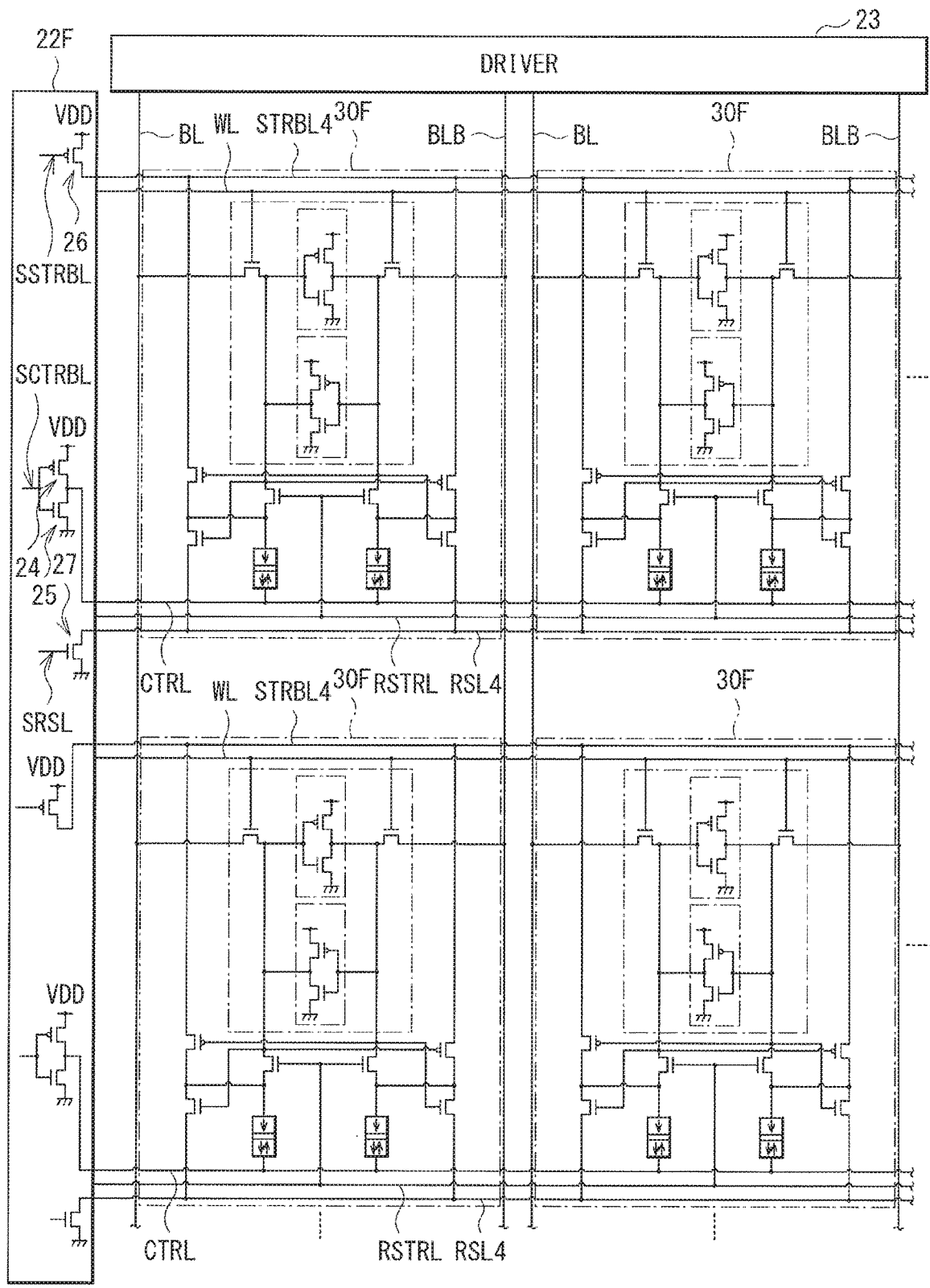

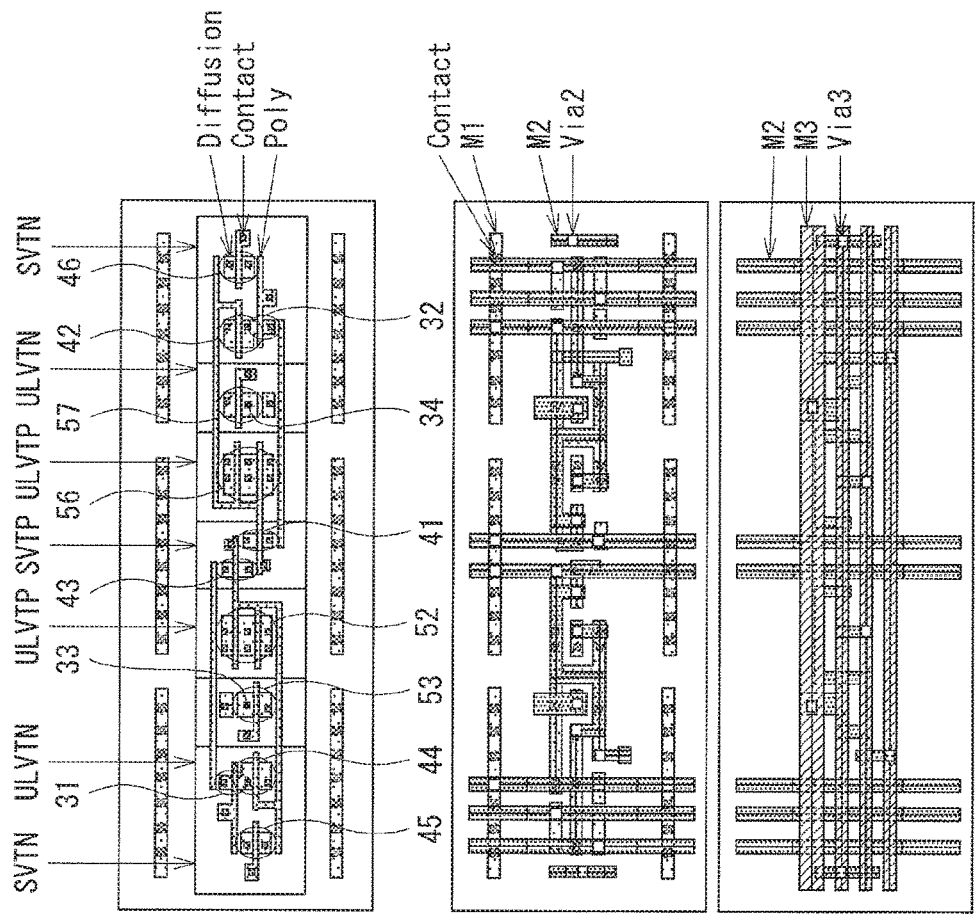
[FIG. 22]

[FIG. 23]
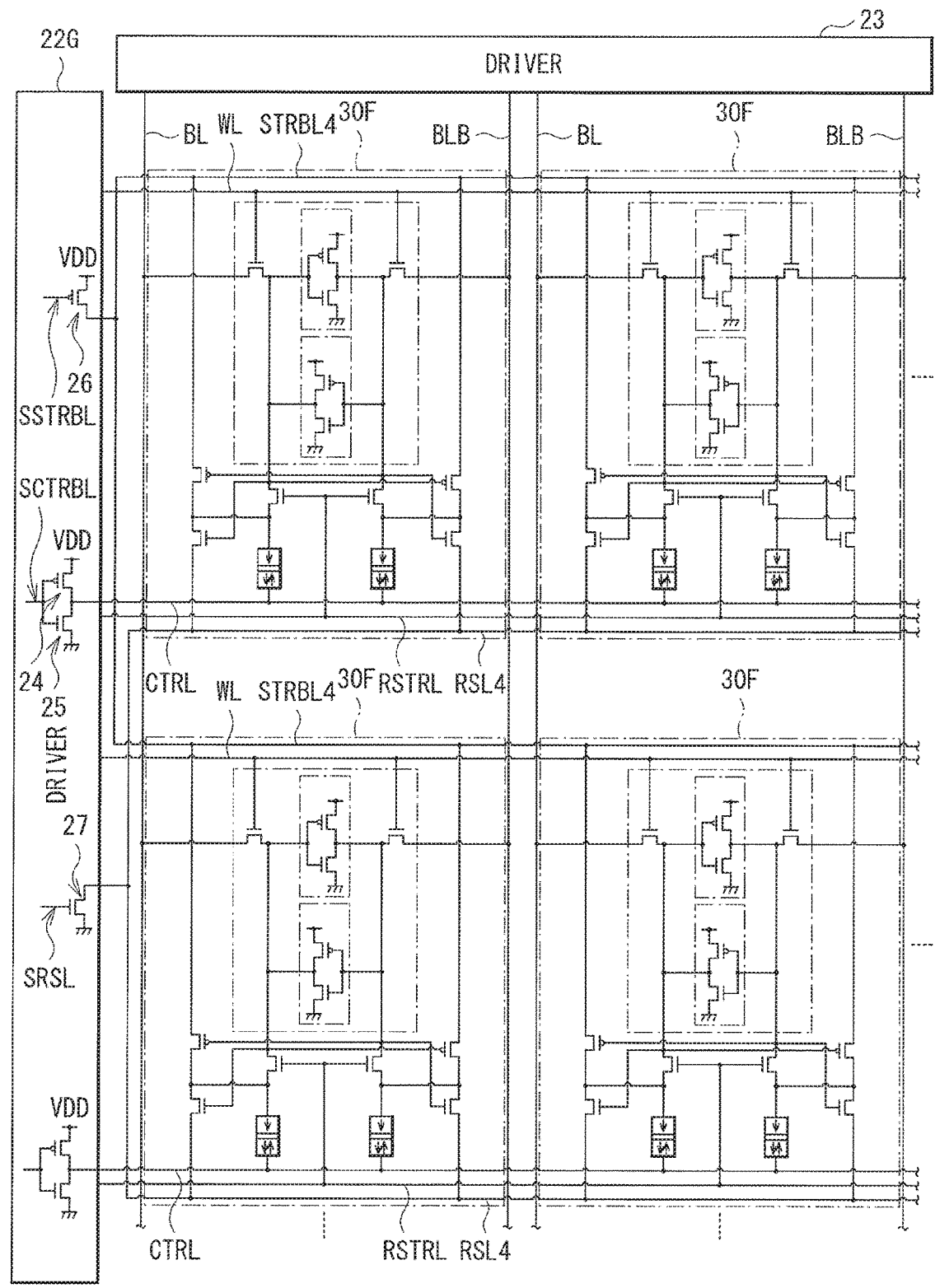

[FIG. 24]
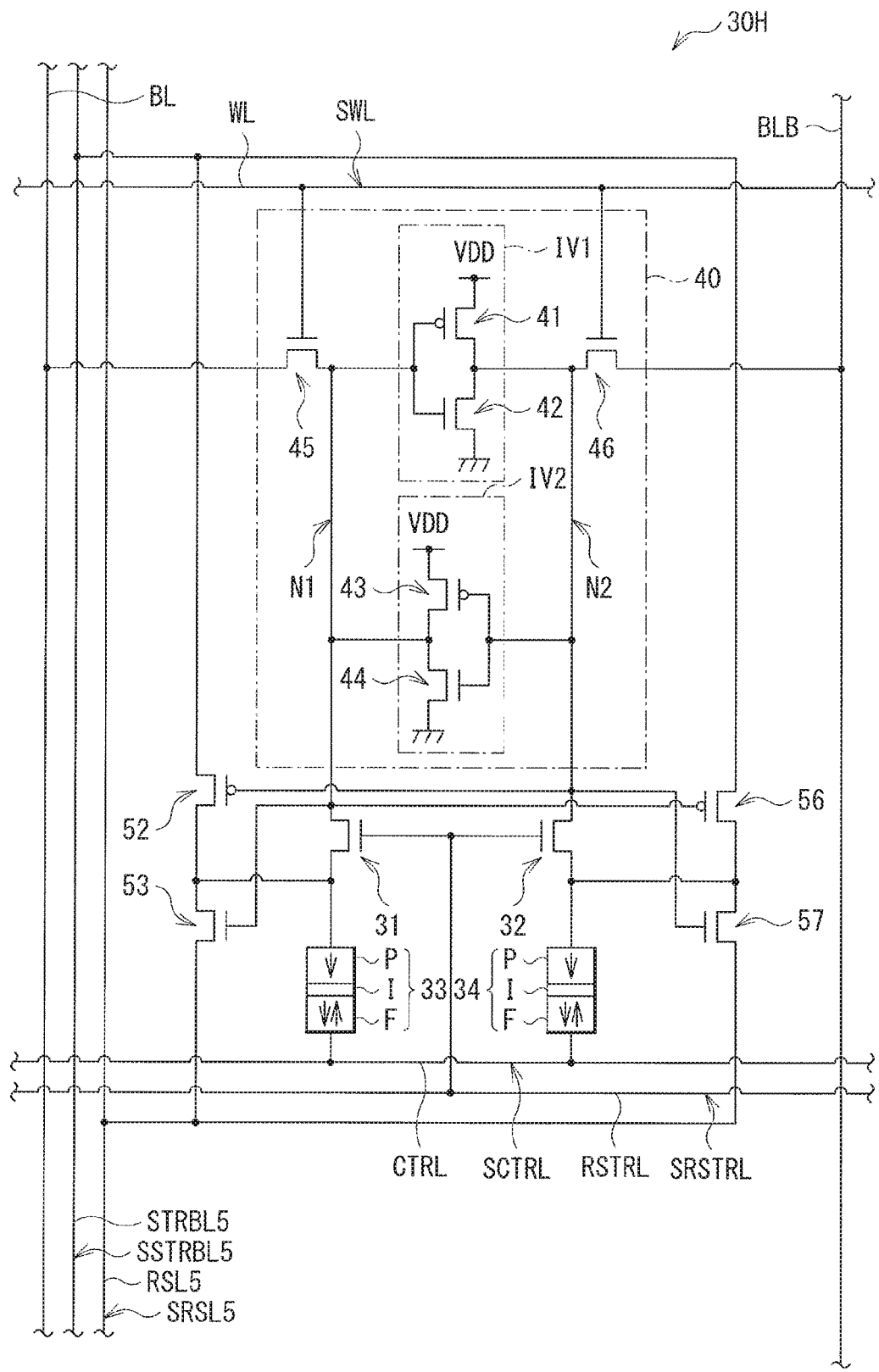

[FIG. 25]
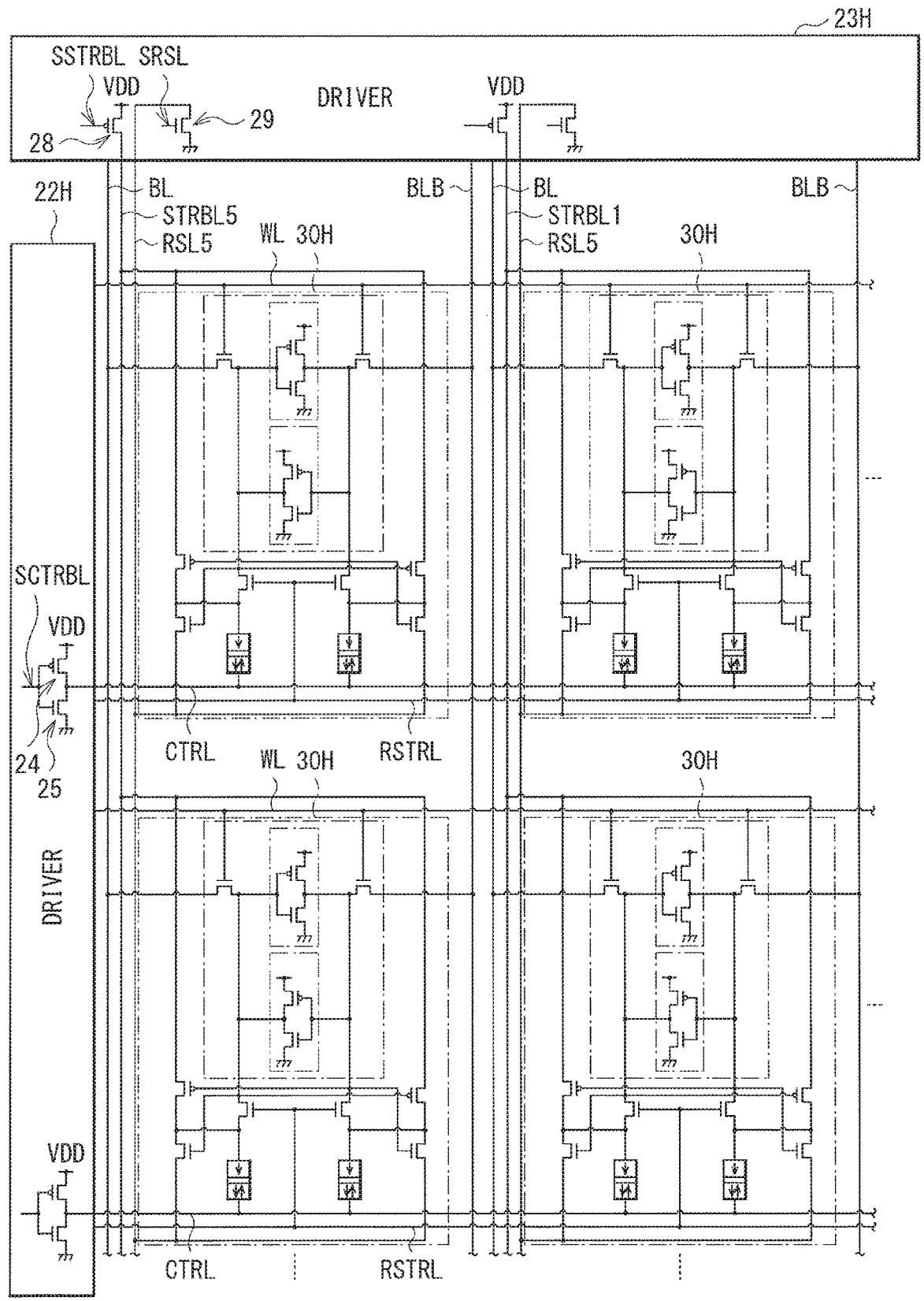

[FIG. 26]
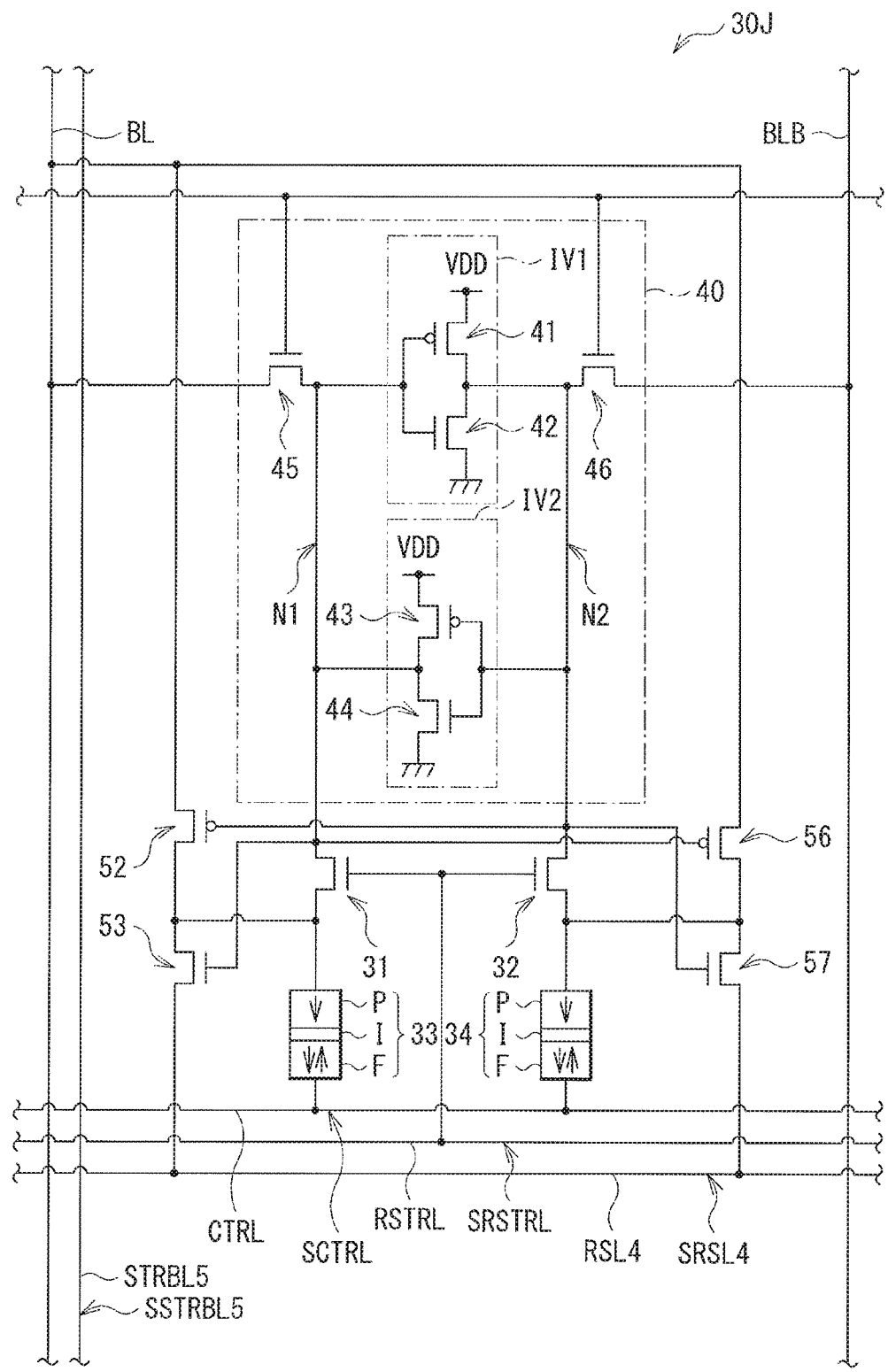

[FIG. 27]
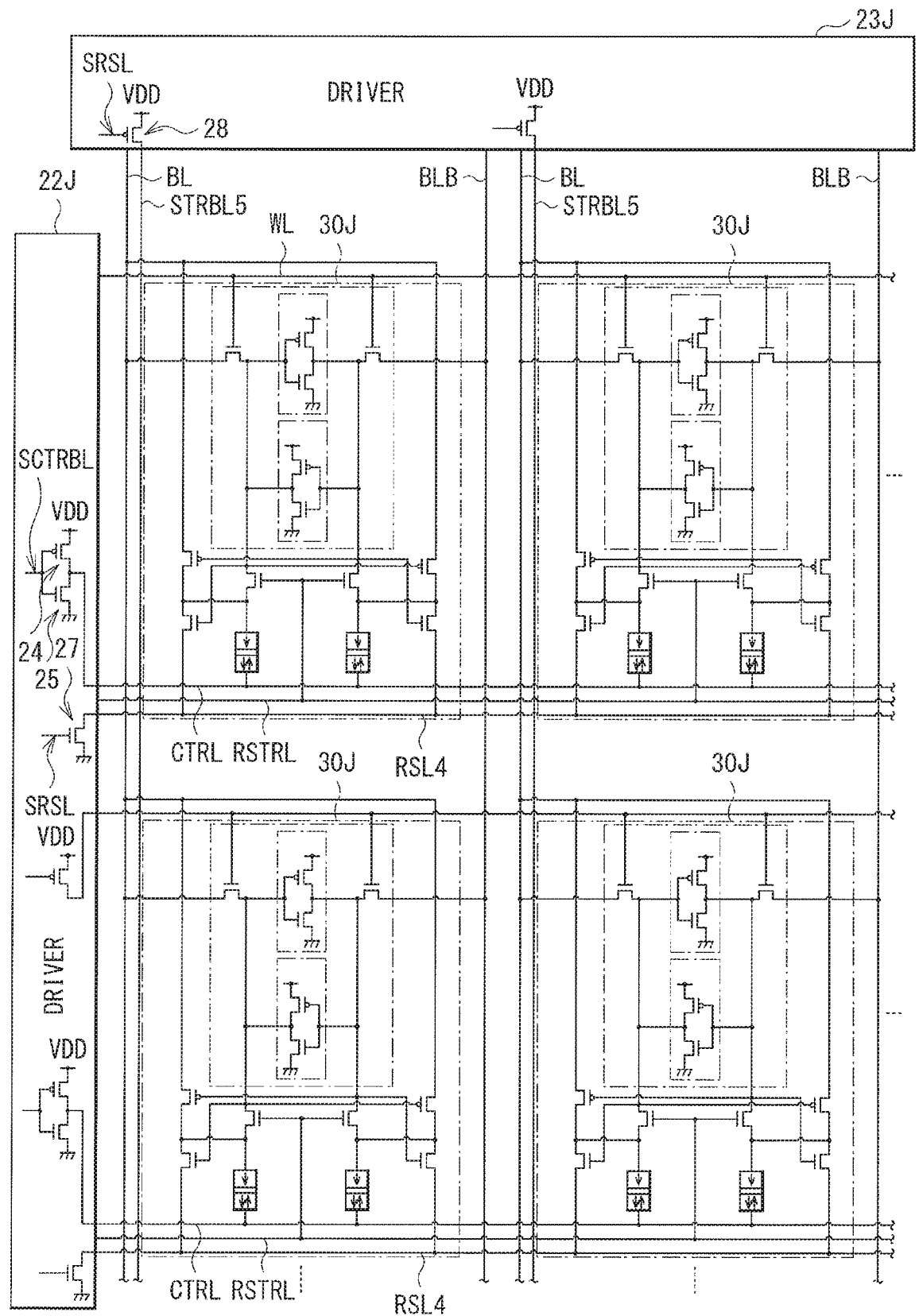

[FIG. 28]
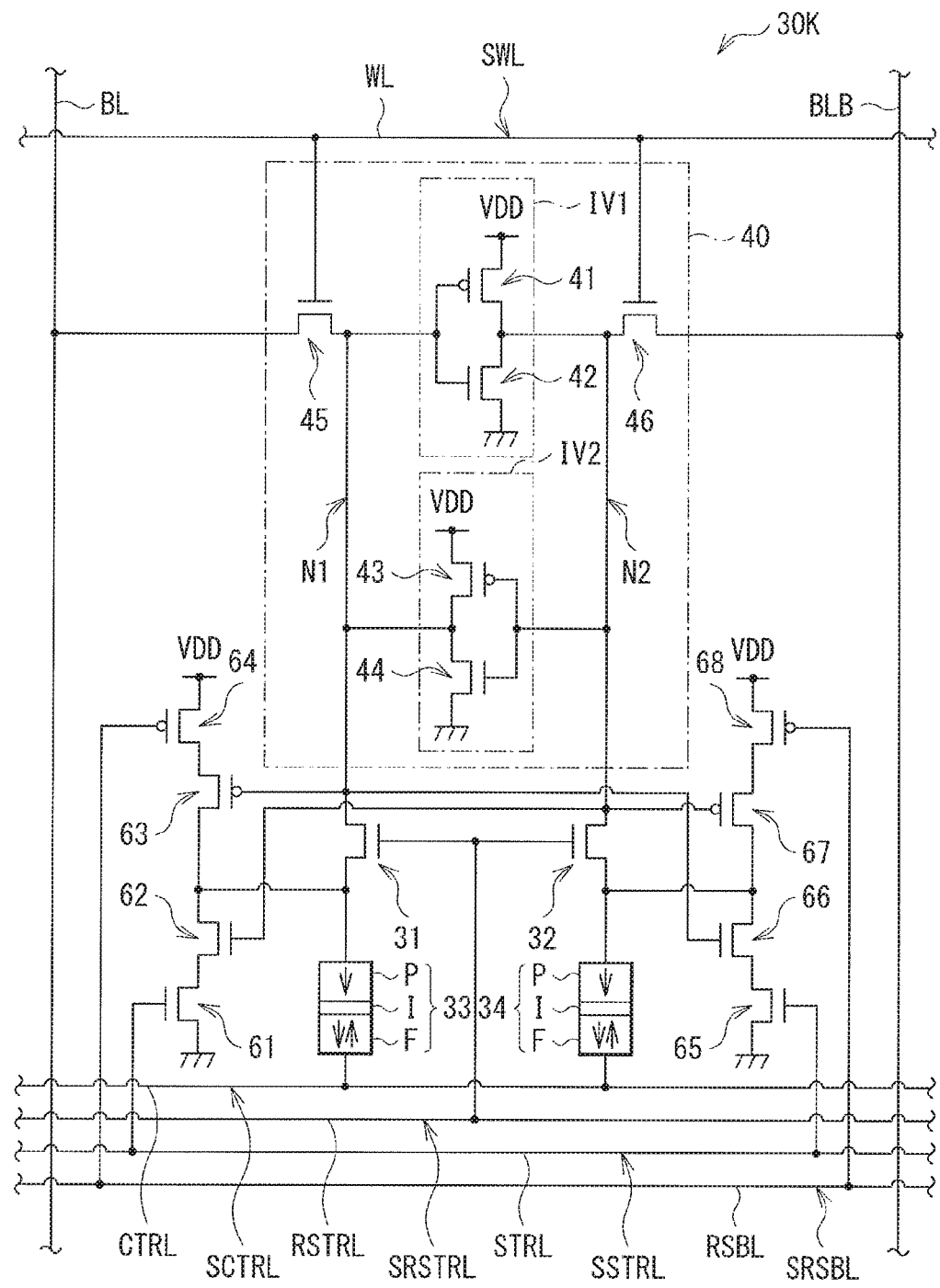

[FIG. 29]
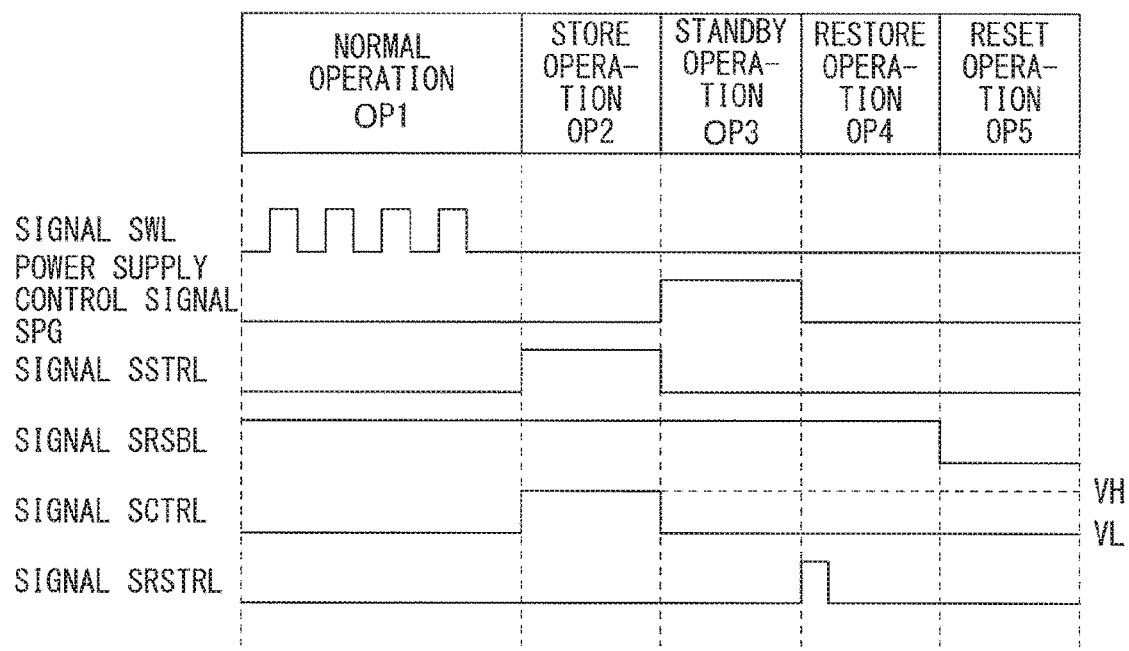

[FIG. 30A]
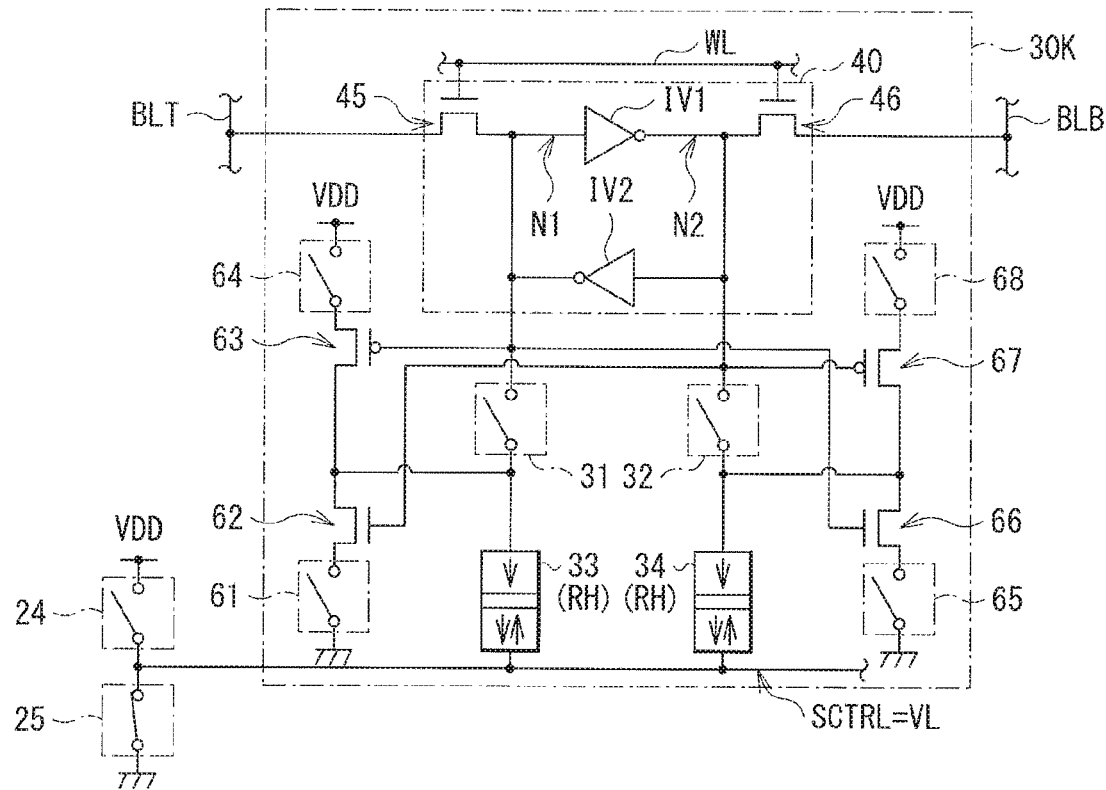
[FIG. 30B]
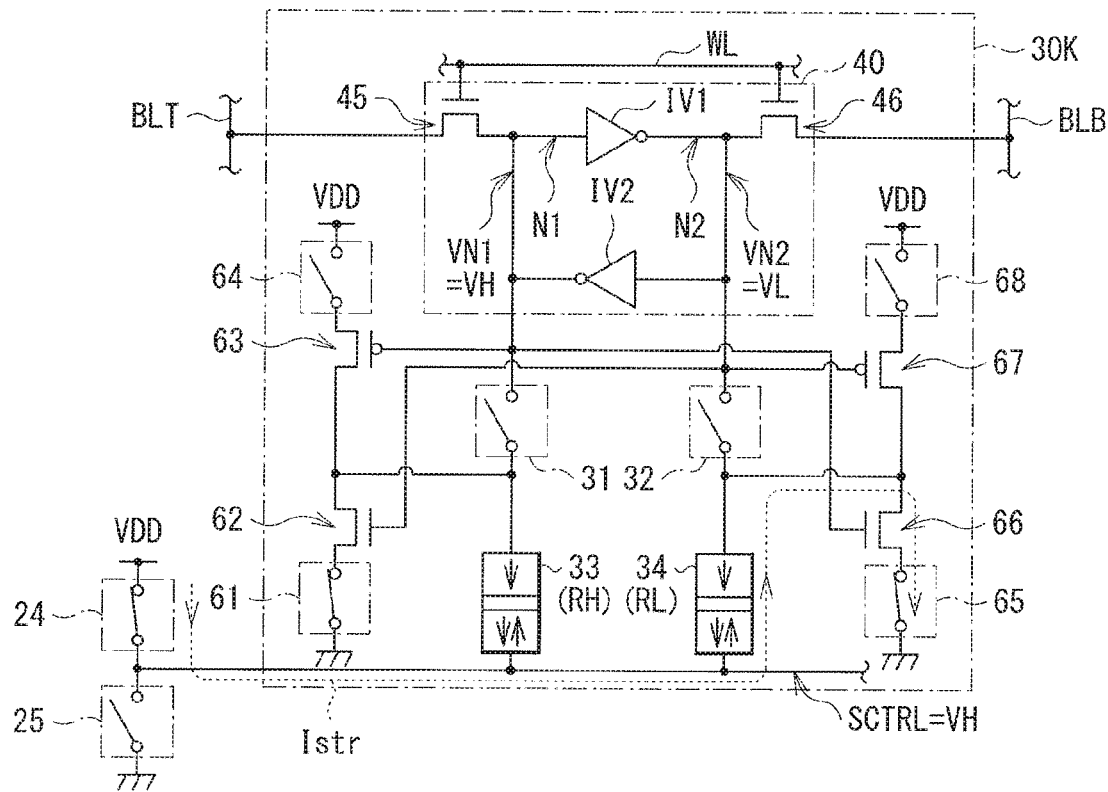

[FIG. 30C]
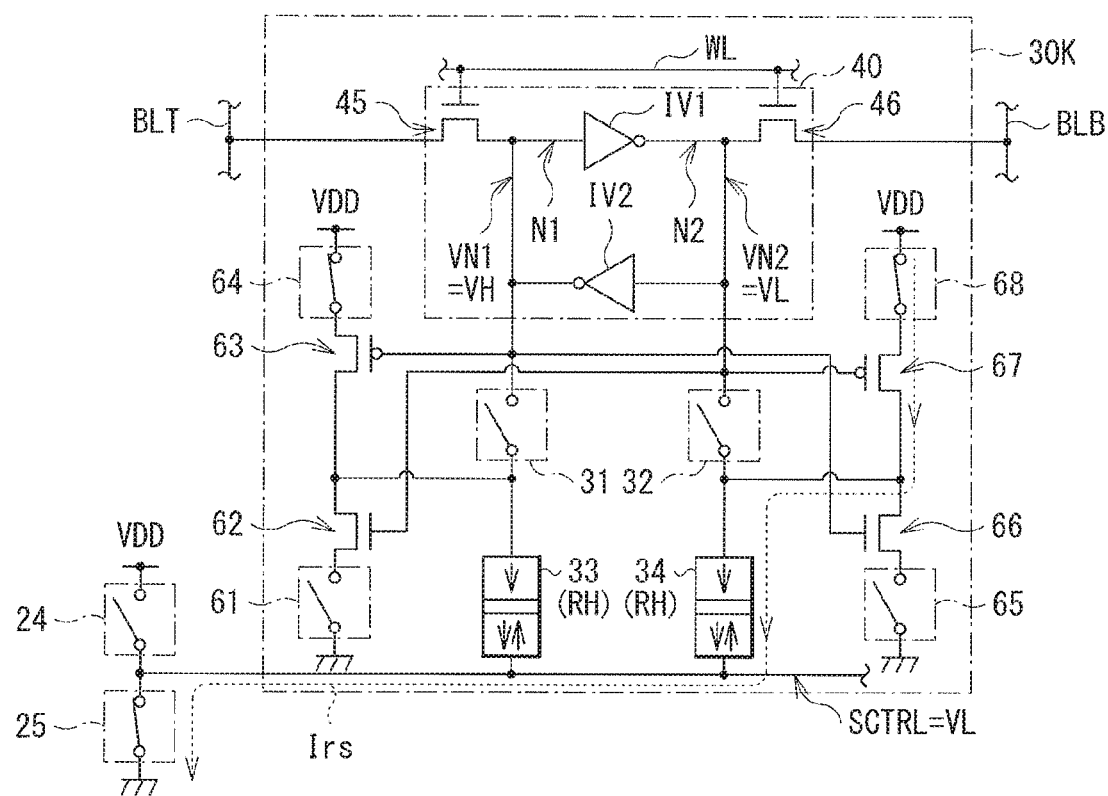

[FIG. 31]
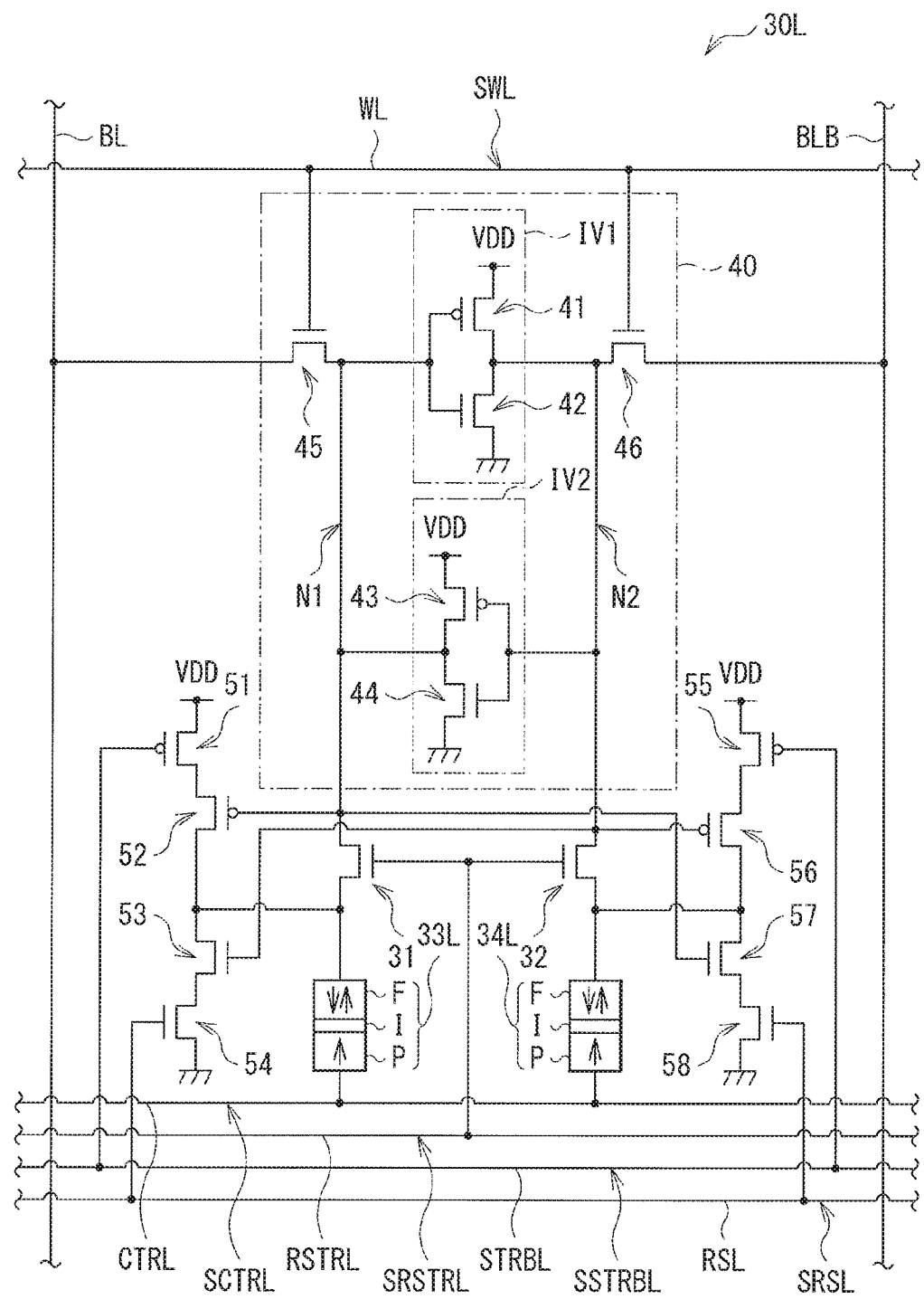

[FIG. 32A]
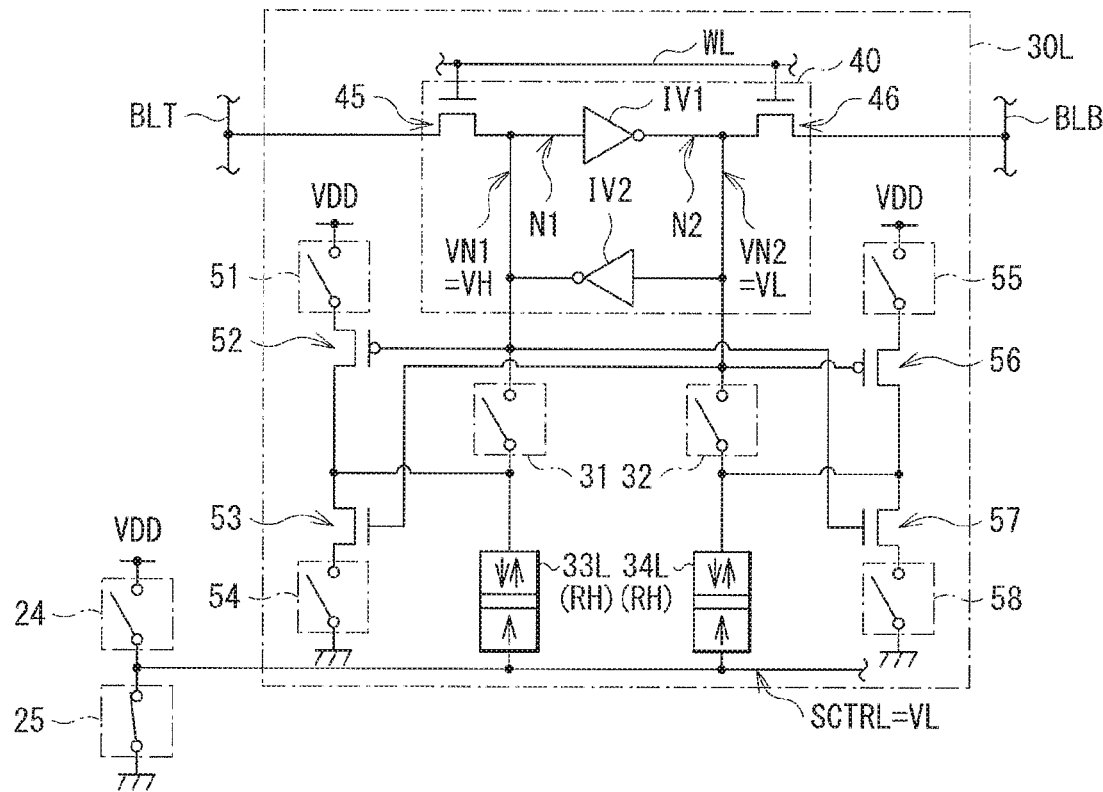
[FIG. 32B]
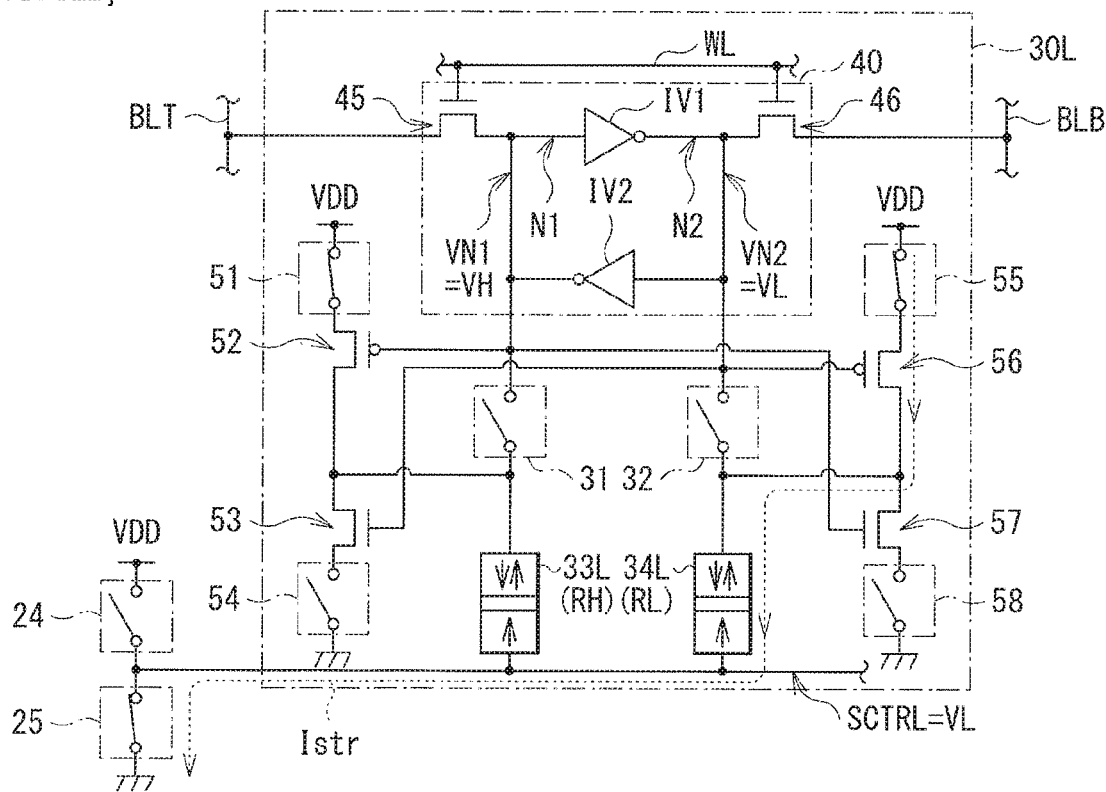

[FIG. 32C]
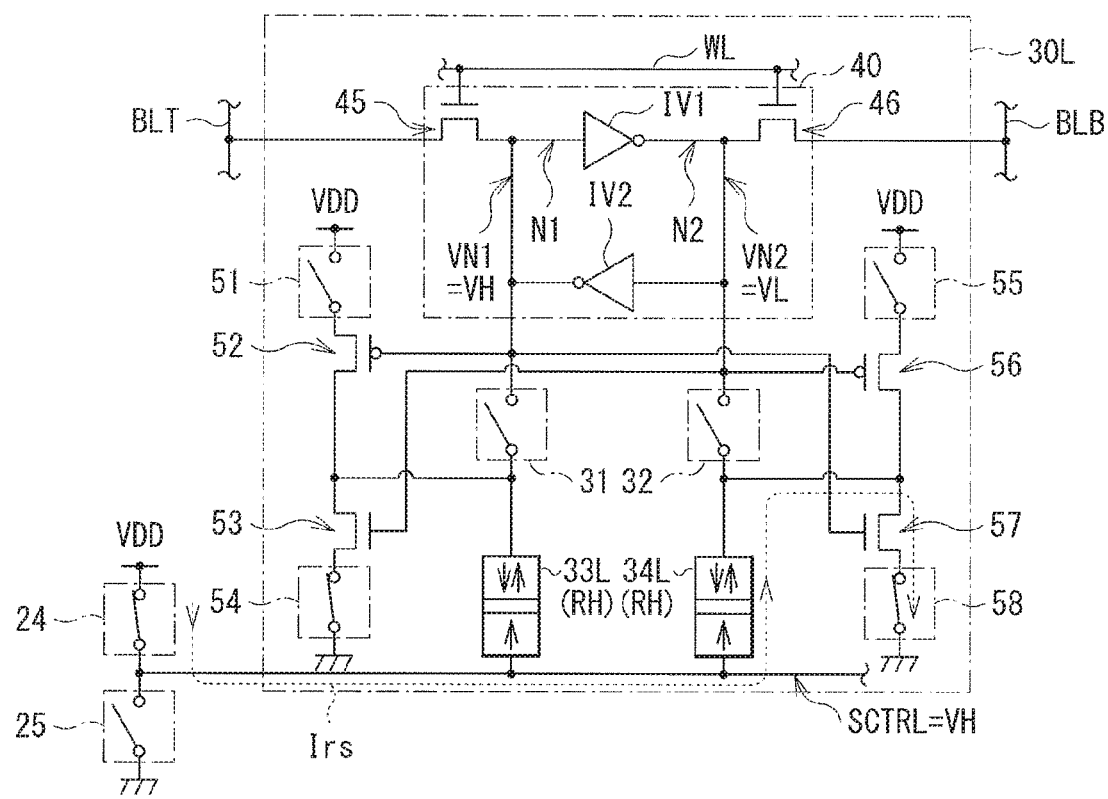

[FIG. 33]
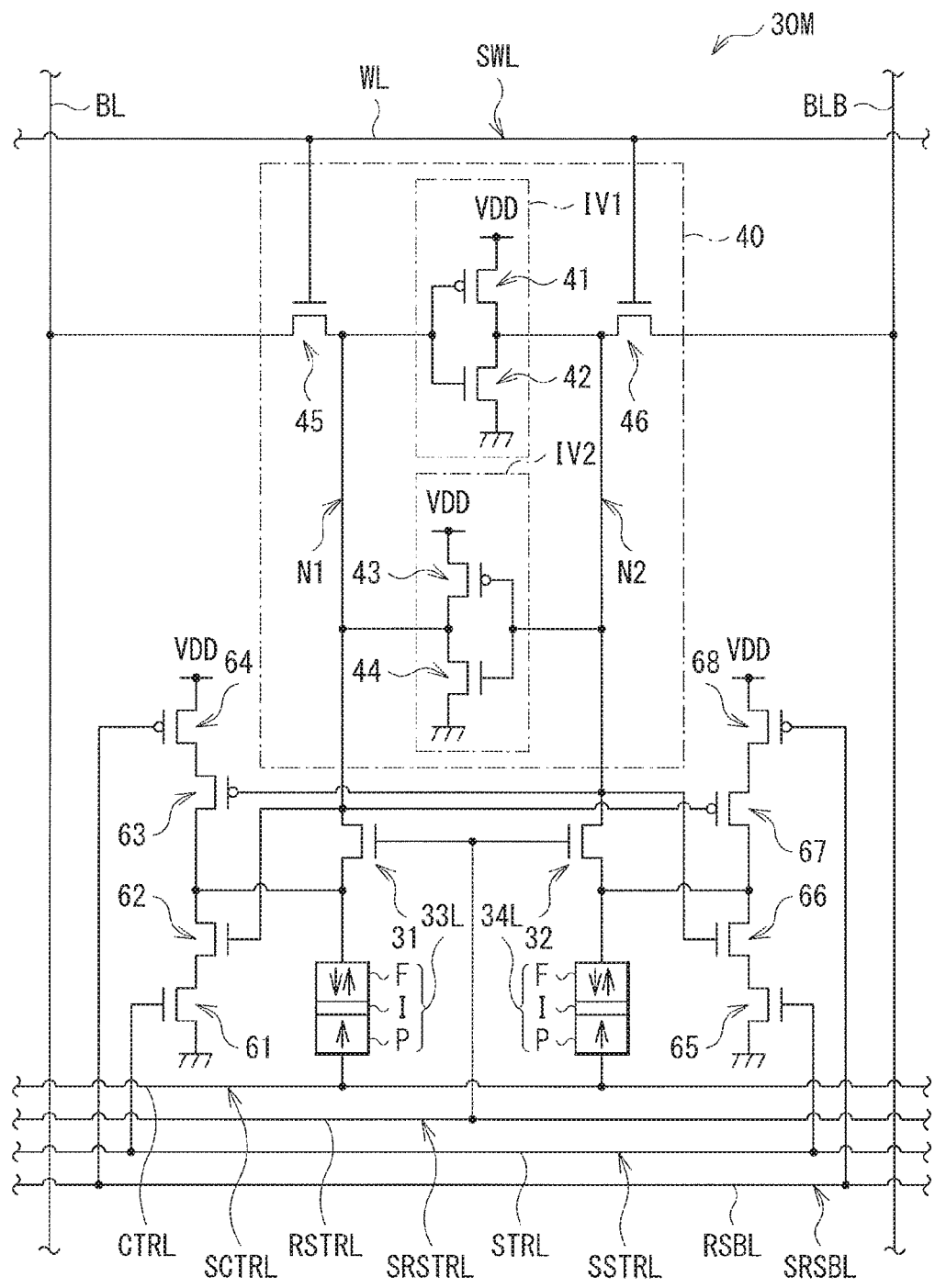

[FIG. 34A]
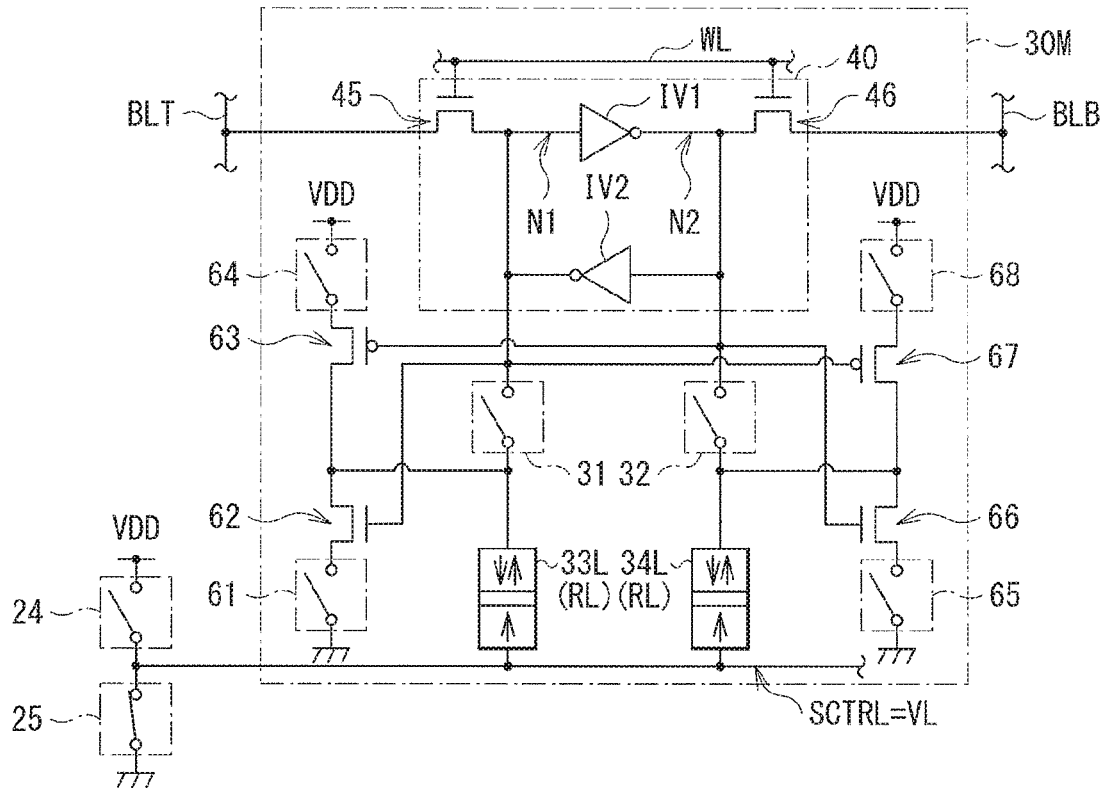
[FIG. 34B]
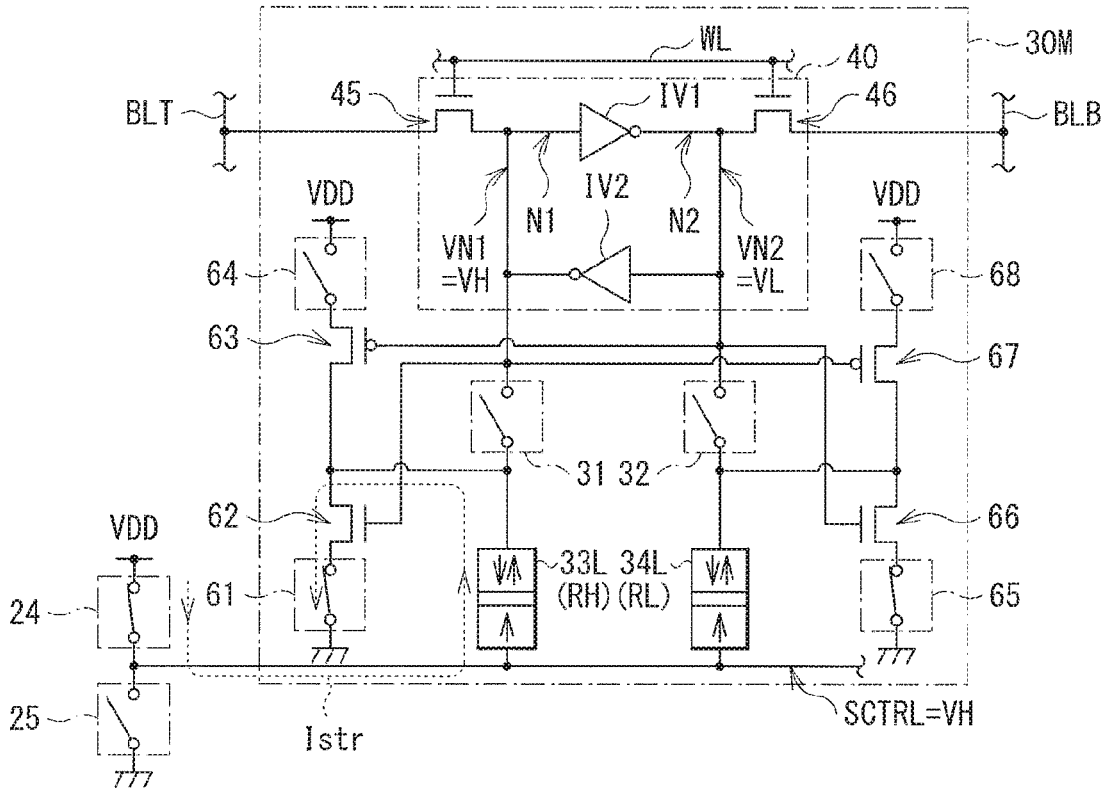

[FIG. 34C]
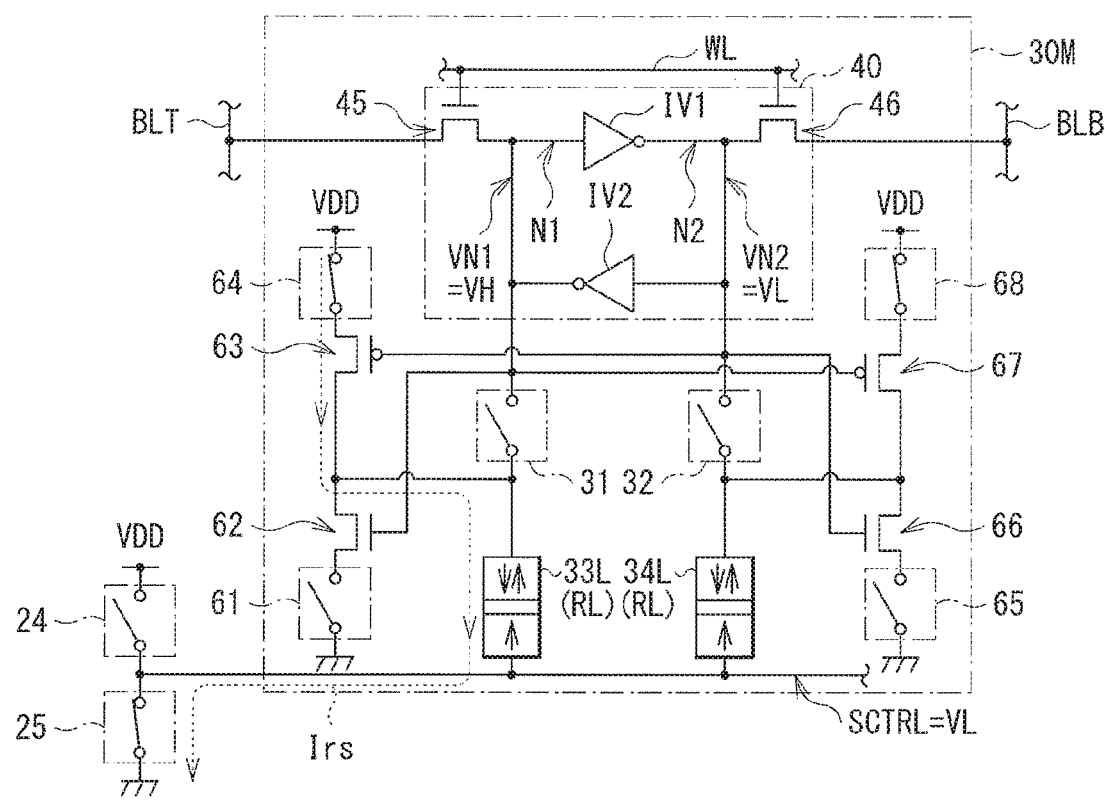

[FIG. 35]
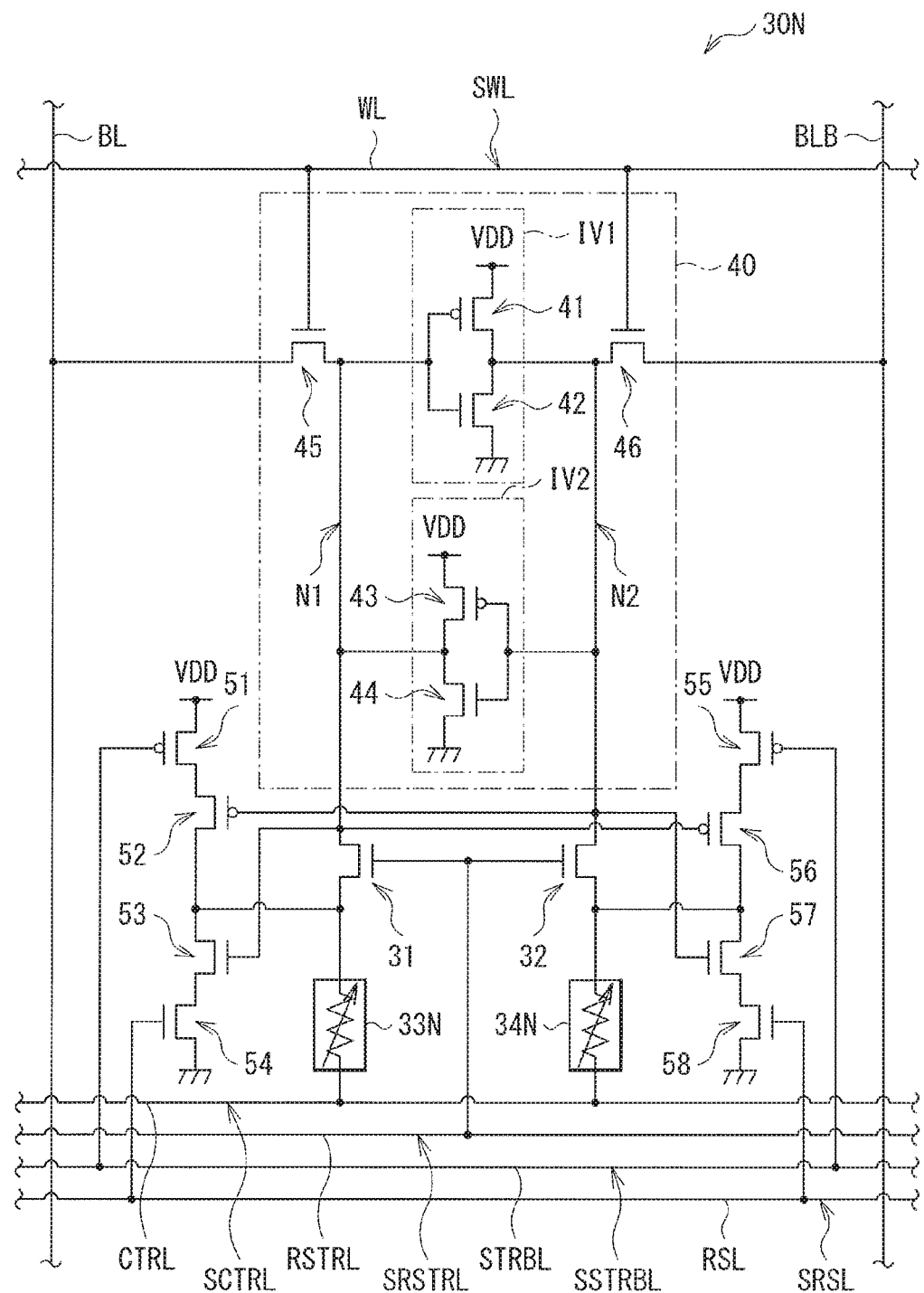

[FIG. 36]
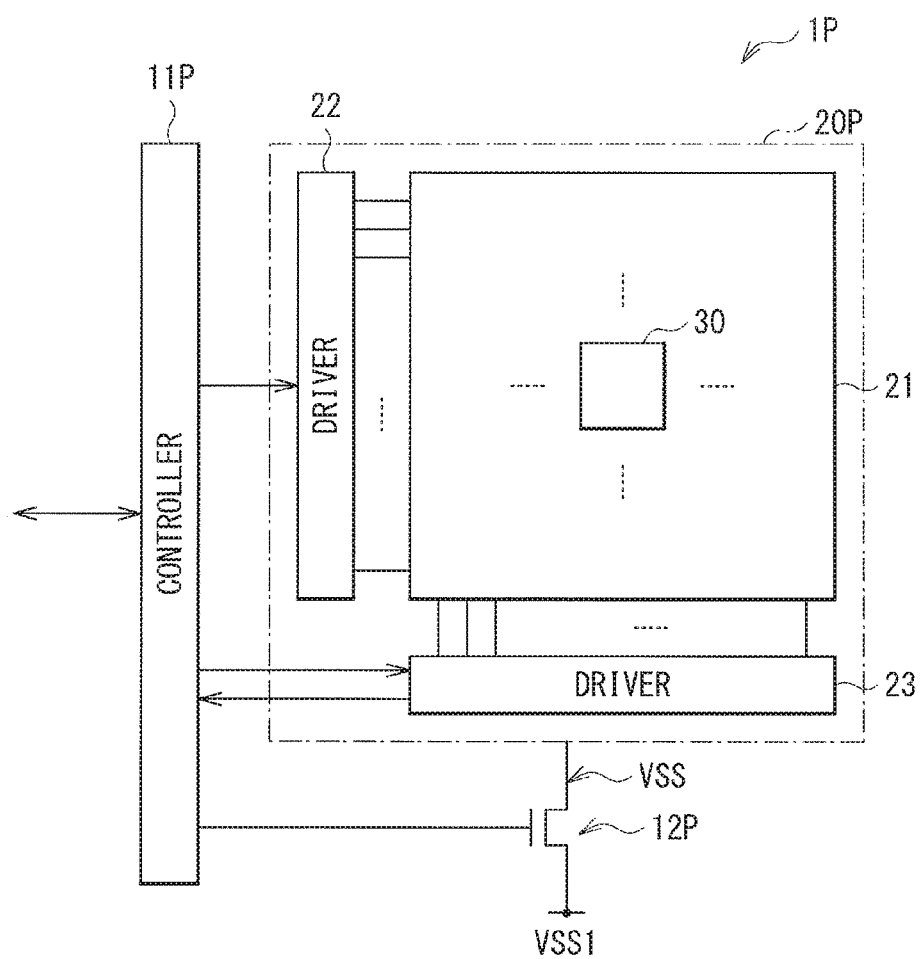

[FIG. 37]
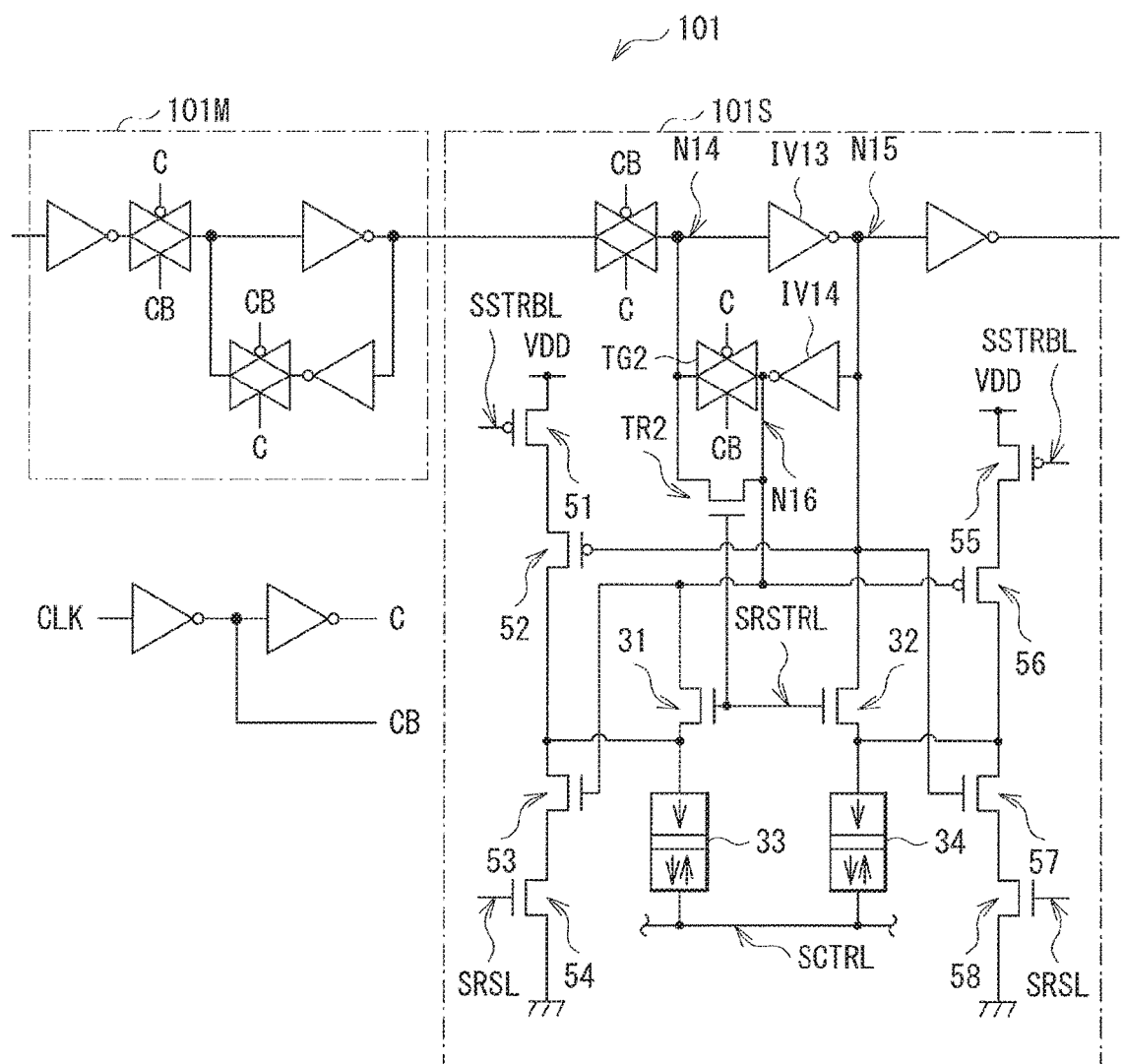

[FIG. 38]
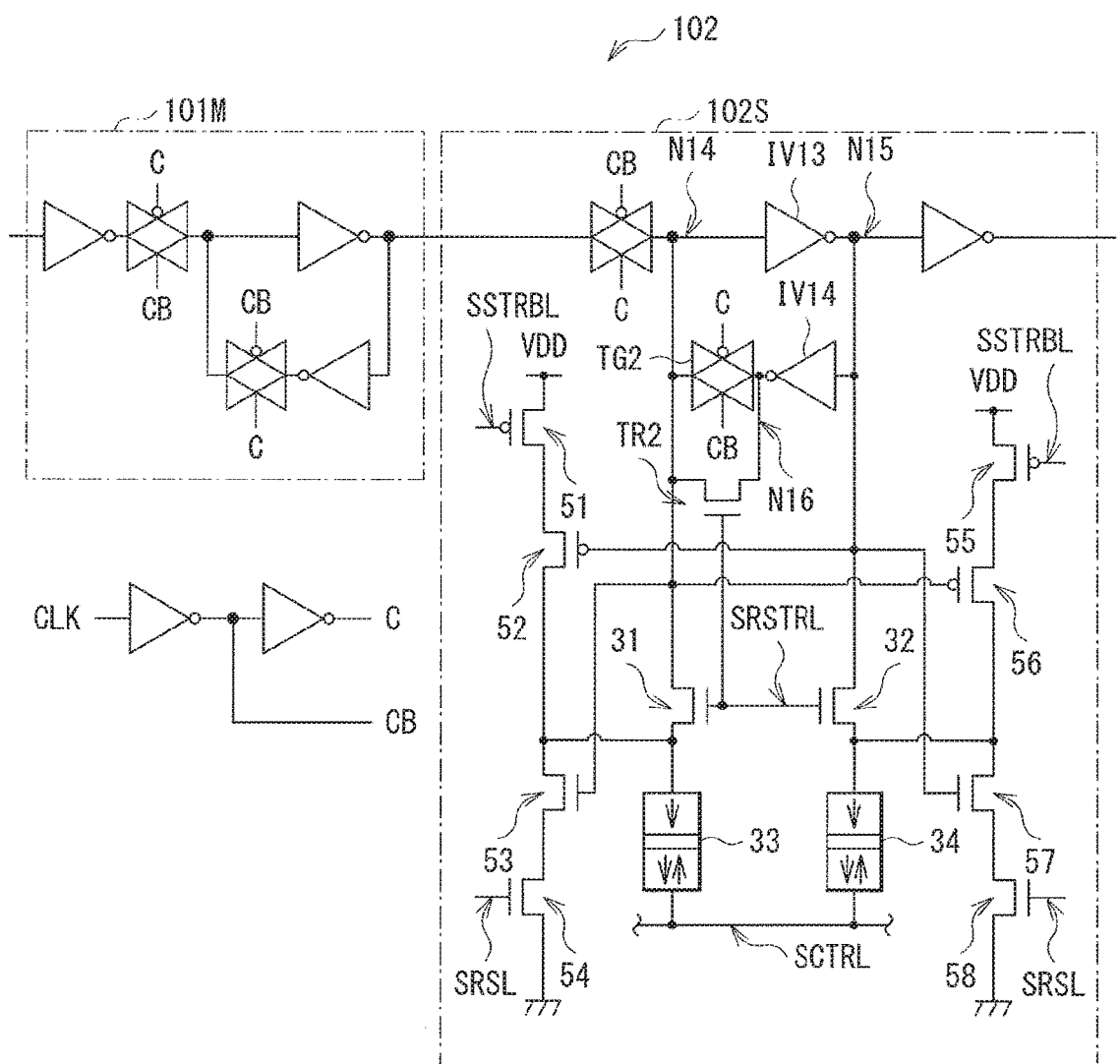

[FIG. 39]
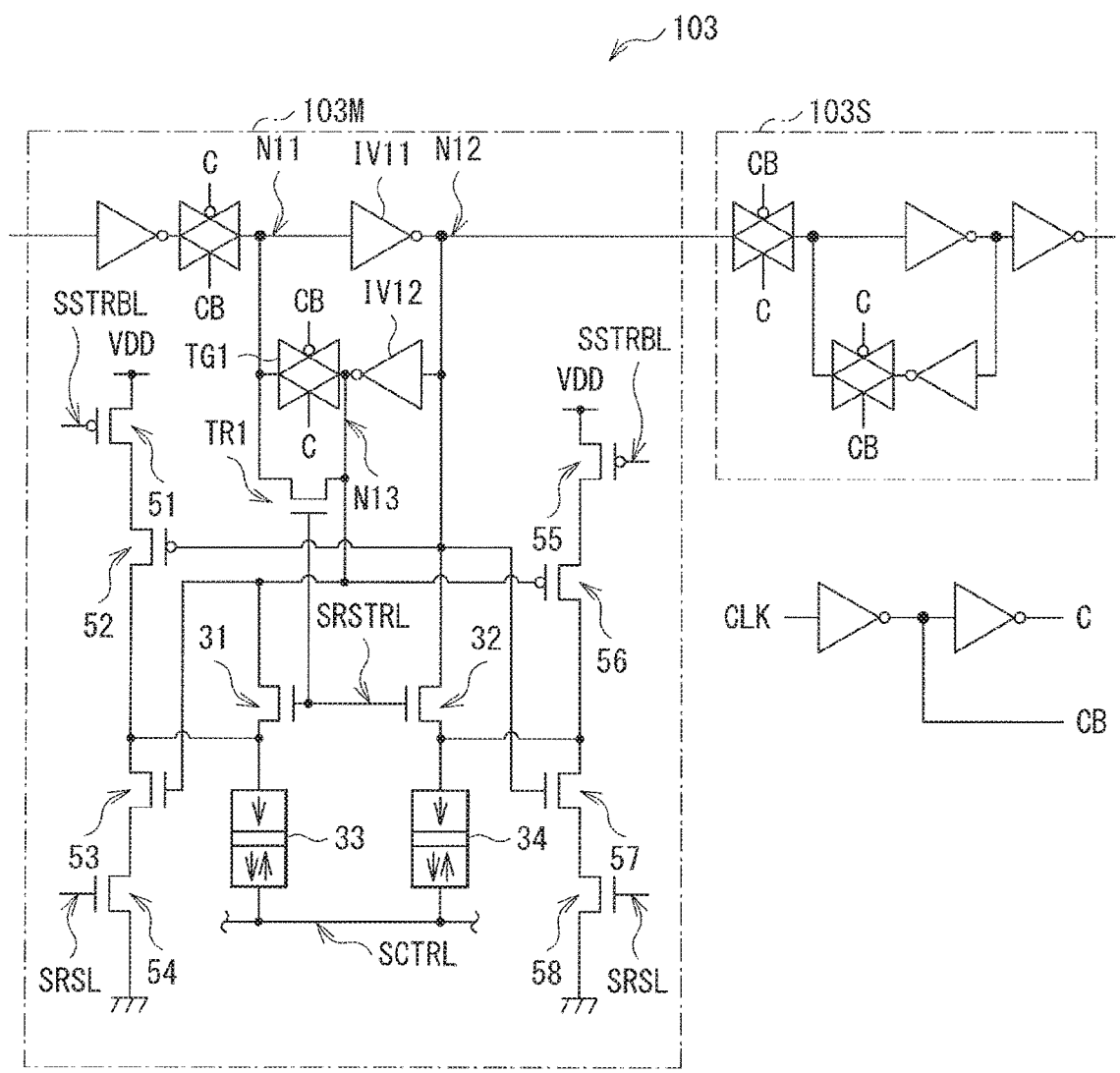

[FIG. 40]
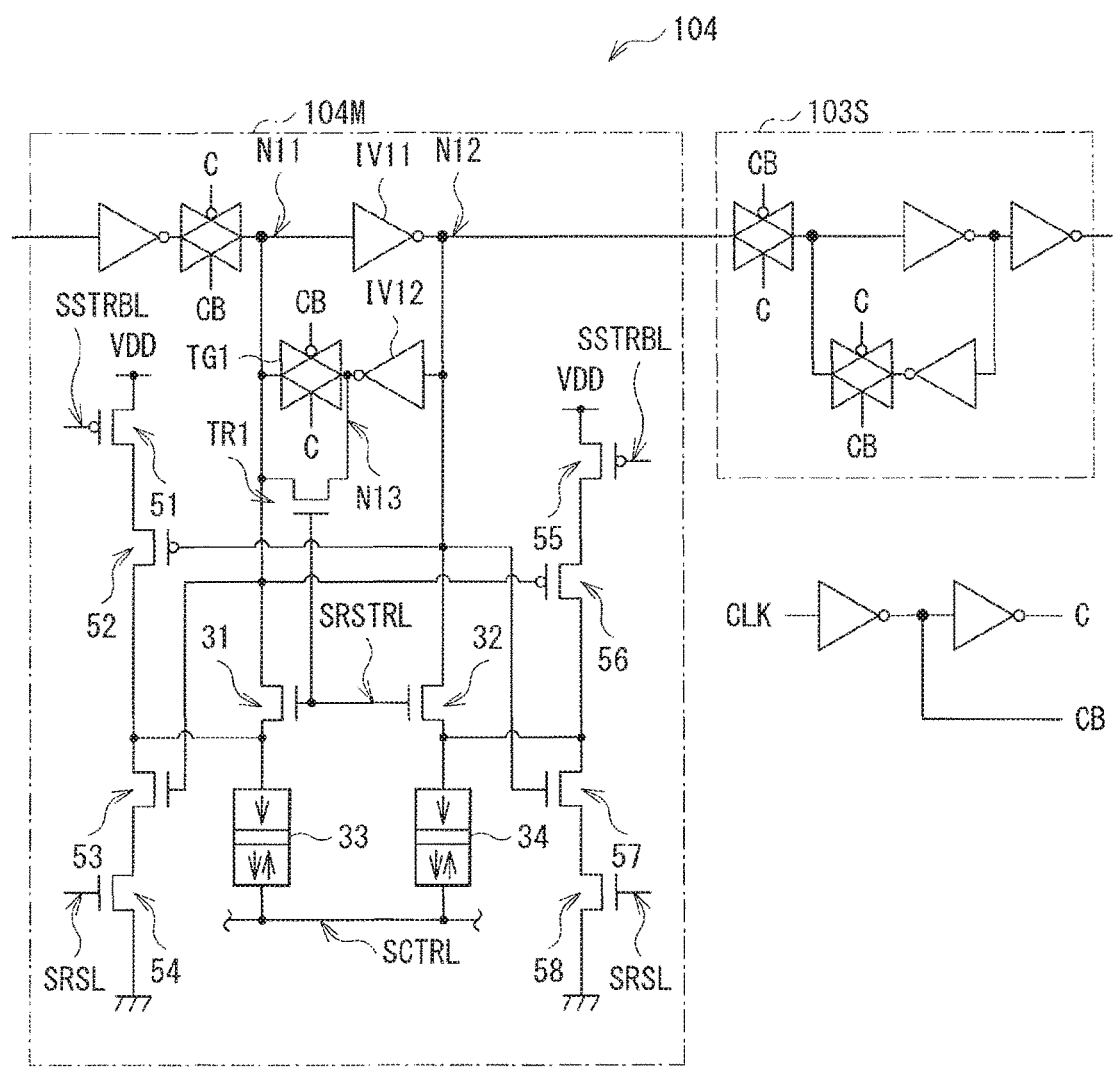

[FIG. 41]
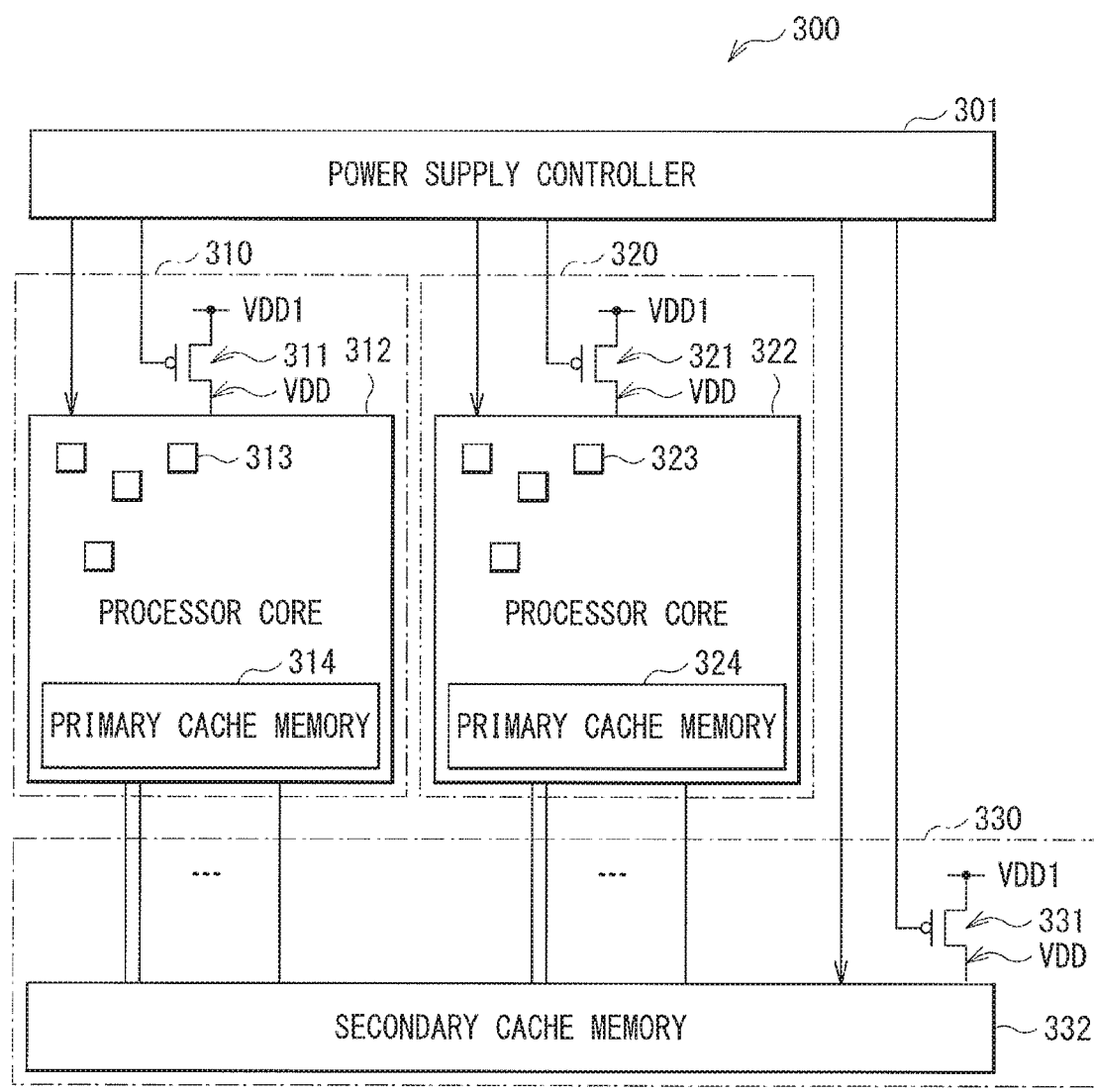

[FIG. 42]
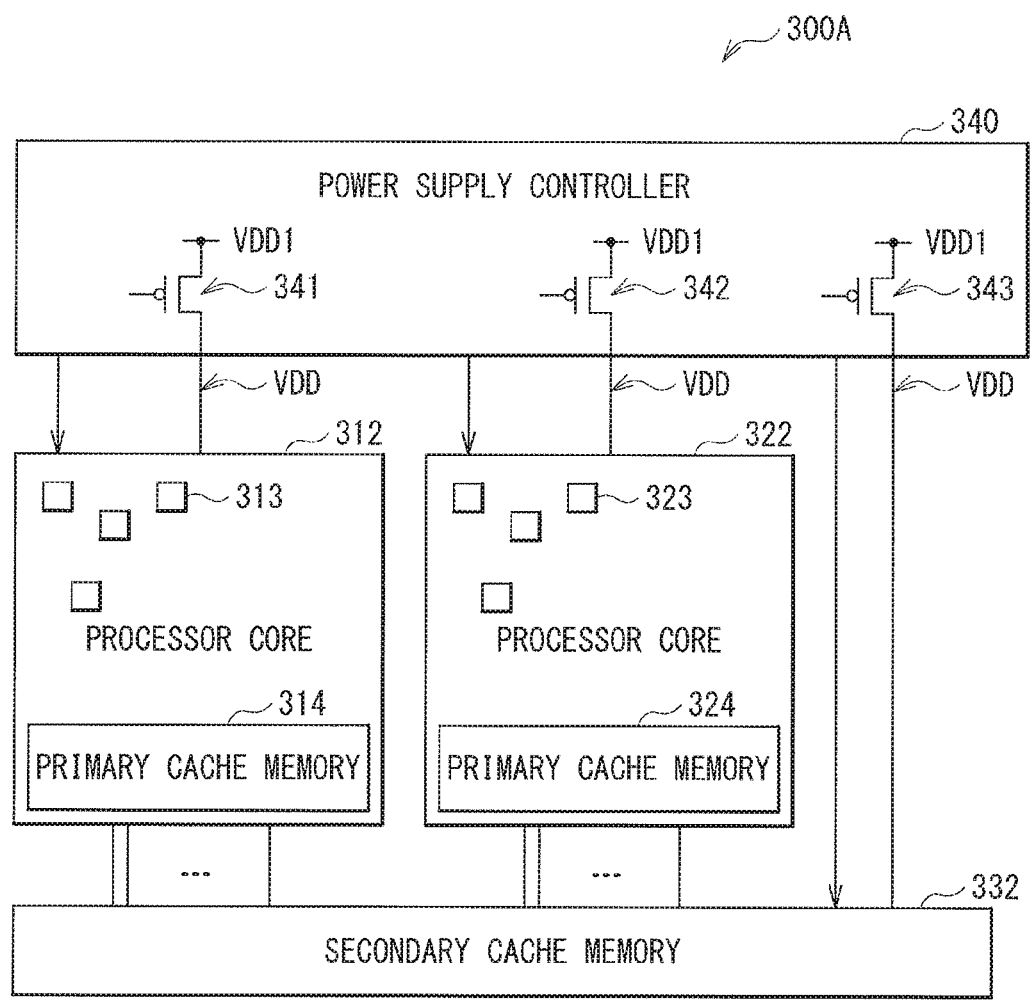

1

SEMICONDUCTOR CIRCUIT AND SEMICONDUCTOR CIRCUIT SYSTEM

CROSS REFERENCE TO RELATED APPLICATIONS

This application is a U.S. National Phase of International Patent Application No. PCT/JP2018/044540 filed on Dec. 4, 2018, which claims priority benefit of Japanese Patent Application No. JP 2017-237979 filed in the Japan Patent Office on Dec. 12, 2017. Each of the above-referenced applications is hereby incorporated herein by reference in its entirety.

TECHNICAL FIELD

The present disclosure relates to a semiconductor circuit and a semiconductor circuit system.

BACKGROUND ART

Electronic devices are desired to have low power consumption from the viewpoint of ecology. For semiconductor circuits, for example, a so-called power gating technique is often used in which power consumption is reduced by selectively stopping power supply to a portion of the circuits. The circuits the power supply to which is stopped in this manner are desired to return to an operation state in which the power supply has not yet been stopped, immediately after the power supply is restarted. One method of achieving such a short-time return operation is to incorporate a nonvolatile memory element in a circuit. For example, PTL 1 discloses a circuit in which an SRAM (Static Random Access Memory) that is a volatile memory and a spin transfer torque type memory element are combined.

CITATION LIST

Patent Literature

PTL 1: International Publication No. WO 2009/028298

SUMMARY OF THE INVENTION

Incidentally, it is desired that a circuit including such memory elements be less likely to have disturbance, and a further improvement is expected.

It is desirable to provide a semiconductor circuit and a semiconductor circuit system that make it possible to suppress disturbance.

A semiconductor circuit according to an embodiment of the present disclosure includes a first circuit, a second circuit, a first transistor, a first memory element, a second transistor, a third transistor, a fourth transistor, a second memory element, a fifth transistor, a sixth transistor, and a driver. The first circuit is configured to generate an inverted voltage of a voltage at a first node and apply the inverted voltage to a second node. The second circuit is configured to generate an inverted voltage of a voltage at the second node and apply the inverted voltage to the first node. The first transistor is configured to couple the first node to a third node by being turned on. The first memory element has a first terminal coupled to the third node and a second terminal to which a control voltage is to be applied, and is allowed to take a first resistance state or a second resistance state. The second transistor has a source to which a first voltage is to be applied, a drain coupled to the third node, and a gate coupled to a first predetermined node that is one of the first node and the second node. The third transistor has a source to which a second voltage is to be applied, a drain coupled to the third node, and a gate coupled to a second predetermined node that is the other of the first node and the second node. The fourth transistor is configured to couple the second node to a fourth node by being turned on. The second memory element has a first terminal coupled to the fourth node and a second terminal to which the control voltage is to be applied, and is allowed to take the first resistance state or the second resistance state. The fifth transistor has a source to which the first voltage is to be applied, a drain coupled to the fourth node, and a gate coupled to the second predetermined node. The sixth transistor has a source to which the second voltage is to be applied, a drain coupled to the fourth node, and a gate coupled to the first predetermined node. The driver is configured to control operations of the first transistor and the fourth transistor and set the control voltage.

A semiconductor circuit system according to an embodiment of the present disclosure includes a memory section and a controller that controls power supply to the memory section. The memory section includes the above-described semiconductor circuit.

In the semiconductor circuit and the semiconductor circuit system according to the embodiments of the present disclosure, mutually inverted voltages appear at the first node and the second node by the first circuit and the second circuit. The first node is coupled to the third node by turning on the first transistor. The third node is coupled to one end of the first memory element. The second node is coupled to the fourth node by turning on the fourth transistor. The fourth node is coupled to one end of the second memory element. The control voltage is applied to another end of the first memory element and another end of the second memory element. The third node is coupled to the drain of the second transistor and the drain of the third transistor. The first voltage is applied to the source of the second transistor, and the gate of the second transistor is coupled to the first predetermined node that is one of the first node and the second node. The second voltage is applied to the source of the third transistor, and the gate of the third transistor is coupled to the second predetermined node that is the other of the first node and the second node. The fourth node is coupled to the drain of the fifth transistor and the drain of the sixth transistor. The first voltage is applied to the source of the fifth transistor, and the gate of the fifth transistor is coupled to the second predetermined node. The second voltage is applied to the source of the sixth transistor, and the gate of the sixth transistor is coupled to the first predetermined node.

According to the semiconductor circuit and the semiconductor circuit system according to the embodiments of the present disclosure, the gate of the second transistor is coupled to the first predetermined node, the gate of the third transistor is coupled to the second predetermined node, the drains of the second transistor and the third transistor are coupled to the third node, the gate of the fifth transistor is coupled to the second predetermined node, the gate of the sixth transistor is coupled to the first predetermined node, and the drains of the fifth transistor and the sixth transistor are coupled to the fourth node, which makes it possible to be less likely to cause disturbance. It is to be noted that the effects described here are not necessarily limited, but any of effects described in the present disclosure may be included.

BRIEF DESCRIPTION OF DRAWING

FIG. 1 is a block diagram illustrating a configuration example of a semiconductor circuit according to an embodiment of the present disclosure.

FIG. 2 is a circuit diagram illustrating a configuration example of a memory cell illustrated in FIG. 1.

FIG. 3 is a circuit diagram illustrating a configuration example of a memory cell array including the memory cell illustrated in FIG. 2.

FIG. 4 is a table illustrating an operation example of the memory cell illustrated in FIG. 2.

FIG. 5A is a circuit diagram illustrating an operation example of the memory cell illustrated in FIG. 2.

FIG. 5B is another circuit diagram illustrating an operation example of the memory cell illustrated in FIG. 2.

FIG. 5C is another circuit diagram illustrating an operation example of the memory cell illustrated in FIG. 2.

FIG. 5D is another circuit diagram illustrating an operation example of the memory cell illustrated in FIG. 2.

FIG. 5E is another circuit diagram illustrating an operation example of the memory cell illustrated in FIG. 2.

FIG. 6 is another table illustrating an operation example of the memory cell illustrated in FIG. 2.

FIG. 7 is a circuit diagram illustrating a configuration example of a memory cell according to a comparative example.

FIG. 8 is an explanatory diagram illustrating an operation example of the memory cell illustrated in FIG. 7.

FIG. 9A is a circuit diagram illustrating an operation example of the memory cell illustrated in FIG. 7.

FIG. 9B is another circuit diagram illustrating an operation example of the memory cell illustrated in FIG. 7.

FIG. 10 is a layout diagram illustrating a configuration example of the memory cell array illustrated in FIG. 2.

FIG. 11 is a circuit diagram illustrating a configuration example of a memory cell array according to a modification example.

FIG. 12 is a circuit diagram illustrating a configuration example of a memory cell according to another modification example.

FIG. 13 is a circuit diagram illustrating a configuration example of a memory cell array including the memory cell illustrated in FIG. 12.

FIG. 14 is a circuit diagram illustrating a configuration example of a memory cell according to another modification example.

FIG. 15 is a circuit diagram illustrating a configuration example of a memory cell array including the memory cell illustrated in FIG. 14.

FIG. 16 is a circuit diagram illustrating a configuration example of a memory cell according to another modification example.

FIG. 17A is a circuit diagram illustrating an operation example of the memory cell illustrated in FIG. 16.

FIG. 17B is another circuit diagram illustrating an operation example of the memory cell illustrated in FIG. 16.

FIG. 18 is a circuit diagram illustrating a configuration example of a memory cell according to another modification example.

FIG. 19 is a circuit diagram illustrating a configuration example of a memory cell array including the memory cell illustrated in FIG. 18.

FIG. 20 is a circuit diagram illustrating a configuration example of a memory cell according to another modification example.

FIG. 21 is a circuit diagram illustrating a configuration example of a memory cell array including the memory cell illustrated in FIG. 20.

FIG. 22 is a layout diagram illustrating a configuration example of the memory cell illustrated in FIG. 20.

FIG. 23 is a circuit diagram illustrating another configuration example of a memory cell array including the memory cell illustrated in FIG. 20.

FIG. 24 is a circuit diagram illustrating a configuration example of a memory cell according to another modification example.

FIG. 25 is a circuit diagram illustrating a configuration example of a memory cell array including the memory cell illustrated in FIG. 24.

FIG. 26 is a circuit diagram illustrating a configuration example of a memory cell according to another modification example.

FIG. 27 is a circuit diagram illustrating a configuration example of a memory cell array including the memory cell illustrated in FIG. 26.

FIG. 28 is a circuit diagram illustrating a configuration example of a memory cell according to another modification example.

FIG. 29 is a table illustrating an operation example of the memory cell illustrated in FIG. 28.

FIG. 30A is a circuit diagram illustrating an operation example of the memory cell illustrated in FIG. 28.

FIG. 30B is another circuit diagram illustrating an operation example of the memory cell illustrated in FIG. 28.

FIG. 30C is another circuit diagram illustrating an operation example of the memory cell illustrated in FIG. 28.

FIG. 31 is a circuit diagram illustrating a configuration example of a memory cell according to another modification example.

FIG. 32A is a circuit diagram illustrating an operation example of the memory cell illustrated in FIG. 31.

FIG. 32B is another circuit diagram illustrating an operation example of the memory cell illustrated in FIG. 31.

FIG. 32C is another circuit diagram illustrating an operation example of the memory cell illustrated in FIG. 31.

FIG. 33 is a circuit diagram illustrating a configuration example of a memory cell according to another modification example.

FIG. 34A is a circuit diagram illustrating an operation example of the memory cell illustrated in FIG. 33.

FIG. 34B is another circuit diagram illustrating an operation example of the memory cell illustrated in FIG. 33.

FIG. 34C is another circuit diagram illustrating an operation example of the memory cell illustrated in FIG. 33.

FIG. 35 is a circuit diagram illustrating a configuration example of a memory cell according to another modification example.

FIG. 36 is a block diagram illustrating a configuration example of a semiconductor circuit according to another modification example.

FIG. 37 is a circuit diagram illustrating a configuration example of a flip-flop circuit to which the technology of an embodiment is applied.

FIG. 38 is a circuit diagram illustrating another configuration example of the flip-flop circuit to which the technology of the embodiment is applied.

FIG. 39 is a circuit diagram illustrating another configuration example of the flip-flop circuit to which the technology of the embodiment is applied.

FIG. 40 is a circuit diagram illustrating another configuration example of the flip-flop circuit to which the technology of the embodiment is applied.

FIG. 41 is a block diagram illustrating a configuration example of an information processor to which the technology of an embodiment is applied.

FIG. 42 is a block diagram illustrating another configuration example of the information processor to which the technology of the embodiment is applied.

MODES FOR CARRYING OUT THE INVENTION

The following describes embodiments of the present disclosure in detail with reference to the drawings. It is to be noted that description is given in the following order.
1. Embodiment
2. Application Example
<1. Embodiment>
[Configuration Example]

FIG. 1 illustrates a configuration example of a semiconductor circuit (semiconductor circuit 1) according to a first embodiment. The semiconductor circuit 1 is a circuit that stores information. The semiconductor circuit 1 includes a controller 11, a power supply transistor 12, and a memory circuit 20.

The controller 11 controls an operation of the memory circuit 20. Specifically, the controller 11 writes information to the memory circuit 20 on the basis of a write command and write data supplied from the outside, and reads information from the memory circuit 20 on the basis of a read command supplied from the outside. In addition, the controller 11 also has a function of controlling power supply to the memory circuit 20 by supplying a power supply control signal SPG to the power supply transistor 12 to turn on and off the power supply transistor 12.

In this example, the power supply transistor 12 is a P-type MOS (Metal Oxide Semiconductor) transistor, and has a gate to be supplied with the power supply control signal SPG, a source to be supplied with a power supply voltage VDD1, and a drain coupled to the memory circuit 20.

With this configuration, in the semiconductor circuit 1, in a case where the memory circuit 20 is used, the power supply transistor 12 is turned on, and the power supply voltage VDD1 is supplied to the memory circuit 20 as a power supply voltage VDD. In addition, in the semiconductor circuit 1, in a case where the memory circuit 20 is not used, the power supply transistor 12 is turned off. In the semiconductor circuit 1, it is possible to reduce power consumption by such so-called power gating.

The memory circuit 20 stores data. The memory circuit 20 includes a memory cell array 21 and drivers 22 and 23.

The memory cell array 21 includes memory cells 30 arranged in a matrix.

FIG. 2 illustrates a configuration example of the memory cell 30. FIG. 3 illustrates a configuration example of the memory cell array 21. This FIG. 3 also illustrates the drivers 22 and 23 in addition to the memory cell array 21. The memory cell array 21 includes a plurality of word lines WL, a plurality of bit lines BL, a plurality of bit lines BLB, a plurality of control lines CTRL, a plurality of restore control lines RSTRL, a plurality of store control line STRBL, and a plurality of reset control lines RSL. The word lines WL extend in a horizontal direction of FIGS. 2 and 3, and one end of each of the word lines WL is coupled to the driver 22. The driver 22 applies a signal SWL to each of the word lines WL. The bit lines BLT extend in a vertical direction of FIGS. 2 and 3, and one end of each of the bit lines BLT is coupled to the driver 23. The bit lines BLB extend in the vertical direction of FIGS. 2 and 3, and one end of each of the bit lines BLB is coupled to the driver 23. The control lines CTRL extend in the horizontal direction of FIGS. 2 and 3, and one end of each of the control lines CTRL is coupled to the driver 22. The driver 22 applies a signal SCTRL to each of the control lines CTRL. The restore control lines RSTRL extend in the horizontal direction of FIGS. 2 and 3, and one end of each of the restore control lines RSTRL is coupled to the driver 22. The driver 22 applies a signal SRSTRL to each of the restore control lines RSTRL. The store control lines STRBL extend in the horizontal direction of FIGS. 2 and 3, and one end of each of the store control lines STRBL is coupled to the driver 22. The driver 22 applies a signal SSTRBL to each of the store control lines STRBL. The reset control lines RSL extend in the horizontal direction of FIGS. 2 and 3, and one end of each of the reset control lines RSL is coupled to the driver 22. The driver 22 applies a signal SRSL to each of the reset control lines RSL.

The memory cell 30 includes an SRAM (Static Random Access Memory) circuit 40, transistors 31, 32, and 51 to 58, and memory elements 33 and 34.

The SRAM circuit 40 stores one-bit information by positive feedback. The SRAM circuit 40 includes transistors 41 to 46. The transistors 41 and 43 are P-type MOS transistors, and the transistors 42, 44, 45, and 46 are N-type MOS transistors.

The transistor 41 has a gate coupled to a node N1, a source to be supplied with the power supply voltage VDD, and a drain coupled to a node N2. The transistor 42 has a gate coupled to the node N1, a source grounded, and a drain coupled to the node N2. The transistors 41 and 42 are included in an inverter IV1. The inverter IV1 inverts a voltage VN1 at the node N1, and outputs a result of such inversion to the node N2. The transistor 43 has a gate coupled to the node N2, a source to be supplied with the power supply voltage VDD, and a drain coupled to the node N1. The transistor 44 has a gate coupled to the node N2, a source grounded, and a drain coupled to the node N1. The transistors 43 and 44 are included in an inverter IV2. The inverter IV2 inverts a voltage VN2 at the node N2, and outputs a result of such inversion to the node N1. The transistor 45 has a gate coupled to the word line WL, a source coupled to the bit line BL, and a drain coupled to the node N1. The transistor 46 has a gate coupled to the word line WL, a source coupled to the bit line BLB, and a drain coupled to the node N2.

With this configuration, an input terminal of the inverter IV1 and an output terminal of the inverter IV2 are coupled to each other via the node N1, and an input terminal of the inverter IV2 and an output terminal of the inverter IV1 are coupled to each other via the node N2. This causes the SRAM circuit 40 to store one-bit information by positive feedback. Turning on the transistors 45 and 46 then causes information to be written into the SRAM circuit 40 via the bit lines BL and BLB, or to be read from the SRAM circuit 40.

The transistors 31 and 32 are N-type MOS transistors. The transistor 31 has a gate coupled to the restore control line RSTRL, a drain coupled to the node N1, and a source coupled to drains of the transistors 52 and 53 and one end of the memory element 33. The transistor 32 has a gate coupled to the restore control line RSTRL, a drain coupled to the node N2, and a source coupled to drains of the transistors 56 and 57 and one end of the memory element 34. It is to be noted that, in this example, N-type MOS transistors are used as the transistors 31 and 32, but the transistors 31 and 32 are not limited thereto. For example, P-type MOS transistors may be used instead of the N-type MOS transistors. In this case, for example, it is desirable to change polarity or the like of the signal SRSTRL.

The transistors 51 and 52 are P-type MOS transistors, and the transistors 53 and 54 are N-type MOS transistors. The transistor 51 has a gate coupled to the store control line STRBL, a source to be supplied with the power supply voltage VDD, and a drain coupled to a source of the transistor 52. The transistor 52 has a gate coupled to the node N2, the source coupled to the drain of the transistor 51, and the drain coupled to the drain of the transistor 53, the source of the transistor 31, and the one end of the memory element 33. The transistor 53 has a gate coupled to the node N1, the drain coupled to the drain of the transistor 52, the source of the transistor 31, and the one end of the memory element 33, and a source coupled to a drain of the transistor 54. The transistor 54 has a gate coupled to the reset control line RSL, the drain coupled to the source of the transistor 53, and a source grounded.

The transistors 55 and 56 are P-type MOS transistors, and the transistors 57 and 58 are N-type MOS transistors. The transistor 55 has a gate coupled to the store control line STRBL, a source to be supplied with the power supply voltage VDD, and a drain coupled to a source of the transistor 56. The transistor 56 has a gate coupled to the node N1, the source coupled to the drain of the transistor 55, and the drain coupled to the drain of the transistor 57, the source of the transistor 32, and the one end of the memory element 34. The transistor 57 has a gate coupled to the node N2, the drain coupled to the drain of the transistor 56, the source of the transistor 32, and the one end of the memory element 34, and a source coupled to a drain of the transistor 58. The transistor 58 has a gate coupled to the reset control line RSL, the drain coupled to the source of the transistor 57, and a source grounded.

The memory elements 33 and 34 are nonvolatile memory elements, and are, in this example, spin transfer torque (STT) magnetic tunnel junction (MTJ) elements that change a magnetization direction of a free layer F (to be described later) by spin injection to store information. The memory element 33 has the one end coupled to the source of the transistor 31 and the drains of the transistors 52 and 53 and another end coupled to the control line CTRL. The memory element 34 has the one end coupled to the source of the transistor 32 and the drains of the transistors 56 and 57 and another end coupled to the control line CTRL.

Next, the memory element 33 is described in detail below. It is to be noted that the same applies to the memory element 34. The memory element 33 includes a pinned layer P, a tunnel barrier layer I, and the free layer F. In this example, the pinned layer P is coupled to the source of the transistor 31 and the drains of the transistors 52 and 53, and the free layer F is coupled to the control line CTRL. In this example, the memory element 33 has a so-called bottom pin structure in which the pinned layer P, the tunnel barrier layer I, and the free layer F are stacked in this order from a lower layer side of the semiconductor circuit 1.

The pinned layer P includes a ferromagnetic material of which a magnetization direction is fixed to a direction perpendicular to a film surface, for example. The free layer F includes a ferromagnetic material of which a magnetization direction is changed in the direction perpendicular to the film surface in response to an incoming spin polarized current. The tunnel barrier layer I performs functions of disconnecting magnetic coupling between the pinned layer P and the free layer F and causing a tunnel current to pass therethrough.

With this configuration, in the memory element 33, for example, a current flows from the free layer F to the pinned layer P, which causes polarized electrons having a moment (spin) in the same direction as the magnetization direction of the pinned layer P to be injected from the pinned layer P to the free layer F, thereby changing the magnetization direction of the free layer F to the same direction as the magnetization direction of the pinned layer P (parallel state). In a case where the memory element 33 is turned to such a parallel state, a resistance value between both ends becomes lower (low resistance state RL).

In addition, for example, a current flowing from the pinned layer P to the free layer F causes electrons to be injected from the free layer F to the pinned layer P. At this time, polarized electrons having a moment in the same direction as the magnetization direction of the pinned layer P of the injected electrons pass through the pinned layer P, and polarized electrons having a moment in a direction opposite to the magnetization direction of the pinned layer P are reflected by the pinned layer P and injected into the free layer F. Thus, the magnetization direction of the free layer F is changed to a direction opposite to the magnetization direction of the pinned layer P (antiparallel state). In a case where the memory element 33 is turned to such an antiparallel state, the resistance value between both ends becomes higher (high resistance state RH).

As described above, in the memory elements 33 and 34, the magnetization direction of the free layer F is changed in accordance with a direction where a current flows, thereby switching a resistance state between the high resistance state RH and the low resistance state RL. Setting the resistance state in such a manner allows the memory elements 33 and 34 to store information.

As described above, the memory cell 30 includes the transistors 31, 32, and 51 to 58, and the memory elements 33 and 34 in addition to the SRAM circuit 40. Accordingly, for example, in a case where the power supply transistor 12 is turned off to perform a standby operation, performing a store operation immediately before the standby operation makes it possible to cause the memory elements 33 and 34 each of which is a nonvolatile memory to store information stored in the SRAM circuit 40 that is a volatile memory. Then, in the semiconductor circuit 1, performing a restore operation immediately after the standby operation makes it possible to cause the SRAM circuit 40 to store the information stored in the memory elements 33 and 34. This allows the semiconductor circuit 1 to return, in a short time, a state of each of the memory cells 30 to a state in which power supply has not yet been stopped after the power supply is restarted.

The driver 22 respectively applies the signal SWL, the signal SCTRL, the signal SRSTRL, the signal SSTRBL, and the signal SRSL to the word lines WL, the control lines CTRL, the restore control lines RSTRL, the store control lines STRBL, and the reset control lines RSL on the basis of a control signal supplied from the controller 11.

As illustrated in FIG. 3, the driver 22 includes transistors 24 and 25. The transistor 24 is a P-type MOS transistor, and has a gate to be supplied with a signal SCTRBL, a source to be supplied with the power supply voltage VDD, and a drain coupled to the control line CTRL. The transistor 25 is an N-type MOS transistor, and has a gate to be supplied with the signal SCTRBL, a drain coupled to the control line CTRL, and a source grounded. The transistors 24 and 25 are included in an inverter, and the driver 22 drives the control lines CTRL with use of this inverter.

The driver 23 writes information to the memory cell array 21 or reads information from the memory cell array 21 via the bit lines BL and BLB. Specifically, the driver 23 writes information to the memory cell array 21 via the bit lines BL and BLB on the basis of a control signal and data supplied from the controller 11. In addition, the driver 23 reads information from the memory cell array 21 via the bit lines BL and BLB on the basis of a control signal from the controller 11, and supplies the read information to the controller 11.

Here, the inverter IV1 corresponds to a specific example of a "first circuit" in the present disclosure. The inverter IV2 corresponds to a specific example of a "second circuit" in the present disclosure. The transistor 31 corresponds to a specific example of a "first transistor" in the present disclosure. The transistor 52 corresponds to a specific example of a "second transistor" in the present disclosure. The transistor 53 corresponds to a specific example of a "third transistor" in the present disclosure. The transistor 32 corresponds to a specific example of a "fourth transistor" in the present disclosure. The transistor 56 corresponds to a specific example of a "fifth transistor" in the present disclosure. The transistor 57 corresponds to a specific example of a "sixth transistor" in the present disclosure. The transistor 51 corresponds to a specific example of a "seventh transistor" in the present disclosure. The transistor 54 corresponds to a specific example of an "eighth transistor" in the present disclosure. The transistor 55 corresponds to a specific example of a "ninth transistor" in the present disclosure. The transistor 56 corresponds to a specific example of a "tenth transistor" in the present disclosure. The memory element 33 corresponds to a specific example of a "first memory element" in the present disclosure. The memory element 34 corresponds to a specific example of a "second memory element" in the present disclosure. The drivers 22 and 23 correspond to specific examples of a "driver" in the present disclosure. The memory circuit 20 corresponds to a specific example of a "memory section" in the present disclosure.

[Operation and Workings]

Next, an operation and workings of the semiconductor circuit 1 according to the present embodiment are described.

(Overview of Overall Operation)

First, an overview of an overall operation of the semiconductor circuit 1 is described with reference to FIGS. 1 to 3. The controller 11 controls an operation of the memory circuit 20. Specifically, the controller 11 writes information to the memory circuit 20 on the basis of a write command and write data supplied from the outside, and reads information from the memory circuit 20 on the basis of a read command supplied from the outside. In addition, the controller 11 controls power supply to the memory circuit 20 by supplying the power supply control signal SPG to the power supply transistor 12 to turn on and off the power supply transistor 12. The power supply transistor 12 performs an on/off operation on the basis of a control signal supplied from the controller 11. The power supply transistor 12 is then turned on, which causes the power supply voltage VDD1 as the power supply voltage VDD to be supplied to the memory circuit 20. The driver 22 of the memory circuit 20 respectively applies the signal SWL, the signal SCTRL, the signal SRSTRL, the signal SSTRBL, and the signal SRSL to the word lines WL, the control lines CTRL, the restore control lines RSTRL, the store control lines STRBL, and the reset control lines RSL on the basis of a control signal supplied from the controller 11. The driver 23 writes information to the memory cell array 21 via the bit lines BL and BLB on the basis of a control signal and data supplied from the controller 11. In addition, the driver 23 reads information from the memory cell array 21 via the bit lines BL and BLB on the basis of a control signal supplied from the controller 11, and supplies the read information to the controller 11.

(Detailed Operation)

In a normal operation OP1, the semiconductor circuit 1 causes the SRAM circuit 40 that is a volatile memory to store information. For example, in a case where the power supply transistor 12 is turned off to perform a standby operation OP3, the semiconductor circuit 1 performs a store operation OP2 immediately before the standby operation OP3, thereby causing the memory elements 33 and 34 each of which is a nonvolatile memory to store the information stored in the SRAM circuit 40 that is a volatile memory. The semiconductor circuit 1 then performs a restore operation OP4 immediately after the standby operation OP3, thereby causing the SRAM circuit 40 to store the information stored in the memory elements 33 and 34. The semiconductor circuit 1 then performs a reset operation OP5 immediately after the restore operation OP4, thereby resetting the resistance states of the memory elements 33 and 34 to a predetermined resistance state (the low resistance state RL in this example). This operation is described in detail below.

FIG. 4 illustrates an operation example of a certain memory cell 30 of interest in the semiconductor circuit 1. FIGS. 5A, 5B, 5C, 5D, and 5E each illustrate an operation state of the memory cell 30. FIG. 5A illustrates a state in the normal operation OP1. FIG. 5B illustrates a state in the store operation OP2. FIG. 5C illustrates a state in the standby operation OP3. FIG. 5D illustrates a state in the restore operation OP4. FIG. 5E illustrates a state in the reset operation OP5. FIGS. 5A, 5B, 5C, 5D, and 5E also illustrate the transistors 24 and 25 in the driver 22. In addition, FIGS. 5A, 5B, 5C, 5D, and 5E each illustrate the inverters IV1 and IV2 with use of symbols, and each illustrate each of the transistors 24, 25, 31, 32, 51, 54, 55, and 58 with use of a switch in accordance with an operation state of a corresponding transistor.

(Normal Operation OP1)

The semiconductor circuit 1 performs the normal operation OP1 to write information to the SRAM circuit 40 that is a volatile memory, or read information from the SRAM circuit 40.

In the normal operation OP1, as illustrated in FIG. 4, the controller 11 sets a voltage of the power supply control signal SPG to a low level. This turns on the power supply transistor 12 (FIG. 1), and the power supply voltage VDD is supplied to the memory circuit 20. The driver 22 then sets a voltage of the signal SRSTRL to the low level as illustrated in FIG. 4. This turns off each of the transistors 31 and 32 as illustrated in FIG. 5A. That is, the SRAM circuit 40 is electrically separated from the memory elements 33 and 34. In addition, as illustrated in FIG. 4, the driver 22 sets a voltage of the signal SSTRBL to a high level and sets a voltage of the signal SRSL to the low level. This turns off each of the transistors 51, 54, 55, and 58 as illustrated in FIG. 5A. In addition, the driver 22 sets a voltage of the signal SCTRL to a low level voltage VL (ground level) as illustrated in FIG. 4. Specifically, the driver 22 sets a voltage of the signal SCTRBL (FIG. 3) to the high level, thereby turning off the transistor 24 and turning on the transistor 25, as illustrated in FIG. 5A. As a result, the voltage of the SCTRL is changed to the low level voltage VL.

In the normal operation OP1, the semiconductor circuit 1 writes information to the SRAM circuit 40 of the memory cell 30 or reads information from the SRAM circuit 40. Specifically, in a case where information is written to the SRAM circuit 40, first, the driver 23 applies, to the bit lines BL and BLB, signals having mutually inverted voltage levels corresponding to the information to be written. The driver 22 then sets a voltage of the signal SWL to the high level, thereby turning on the transistors 45 and 46 of the SRAM circuit 40. This causes information corresponding to voltages of the bit lines BL and BLB to be written to the SRAM circuit 40. In addition, in a case where information is read from the SRAM circuit 40, the driver 23 pre-charges each of the bit lines BL and BLB, for example, with a high level voltage. Thereafter, the driver 22 sets the voltage of the signal SWL to the high level, thereby turning on the transistors 45 and 46. This causes the voltage of one of the bit lines BL and BLB to change in accordance with the information stored in the SRAM circuit 40. The driver 23 then detects a difference between the voltages of the bit lines BL and BLB, thereby reading the information stored in the SRAM circuit 40.

At this time, as illustrated in FIG. 5A, the transistors 31, 32, 51, 54, 55, and 58 are off. Accordingly, a current does not flow to the memory elements 33 and 34, which causes the resistance states of the memory elements 33 and 34 to be maintained in a predetermined resistance state (the low resistance state RL in this example).

(Store Operation OP2)

Next, the store operation OP2 is described. The semiconductor circuit 1 performs the store operation OP2 before performing the standby operation OP3, thereby causing the memory elements 33 and 34 to store the information stored in the SRAM circuit 40.

In the store operation OP2, the driver 22 sets the voltage of the signal SWL to the low level as illustrated in FIG. 4. This turns off the transistors 45 and 46. In addition, the driver 22 sets the voltage of the signal SSTRBL to the low level as illustrated in FIG. 4. This turns on the transistors 51 and 55 as illustrated in FIG. 5B. The driver 22 then sets the voltage of the signal SCTRBL (FIG. 3) to the high level, thereby turning off the transistor 24 and turning on the transistor 25 as illustrated in FIG. 5B. As a result, the voltage of the signal SCTRL is changed to the low level voltage VL. This causes a store current Isrt to flow to one of the memory elements 33 and 34.

In this example, the voltage VN1 at the node N1 is the high level voltage VH, and the voltage VN2 at the node N2 is the low level voltage VL; therefore, the transistors 52 and 53 are on, and the transistors 56 and 57 are off. Accordingly, in the memory cell 30, the store current Istr flows in order of the transistor 51, the transistor 52, the memory element 33, and the transistor 25 as illustrated in FIG. 5B. At this time, in the memory element 33, the store current Istr flows from the pinned layer P to the free layer F, which causes the magnetization direction of the free layer F to be changed to a direction opposite to the magnetization direction of the pinned layer P (antiparallel state). As a result, the resistance state of the memory element 33 is changed to the high resistance state RH. Thus, in the memory cell 30, the resistance state of each of the memory elements 33 and 34 is set in accordance with the information stored in the SRAM circuit 40.

The store operation OP2 is performed in units of a row, for example. It is possible to set a row on which the store operation OP2 is to be performed and a row on which the store operation OP2 is not to be performed with use of the signal SSTRBL, for example. Specifically, the driver 22 sets the voltage of the signal SSTRBL to the low level for the row on which the store operation OP2 is to be performed as illustrated in FIG. 4, and the driver 22 sets the voltage of the signal SSTRBL to the high level for the row on which the store operation OP2 is not to be performed as illustrated in FIG. 6.

(Standby Operation OP3)

The semiconductor circuit 1 then turns off the power supply transistor 12 after the store operation OP2, thereby performing the standby operation OP3.

In the standby operation OP3, as illustrated in FIG. 4, the controller 11 sets the voltage of the power supply control signal SPG to the high level. This turns off the power supply transistor 12 (FIG. 1), and the power supply to the memory circuit 20 is stopped. At this time, the resistance states of the memory elements 33 and 34 are maintained as illustrated in FIG. 5C.

(Restore Operation OP4)

Next, the restore operation OP4 is described. In a case where the normal operation OP1 is performed after the standby operation OP3, the semiconductor circuit 1 performs the restore operation OP4, thereby causing the SRAM circuit 40 to store the information stored in the memory elements 33 and 34.

In the restore operation OP4, as illustrated in FIG. 4, the controller 11 sets the voltage of the power supply control signal SPG to the low level. This turns on the power supply transistor 12 (FIG. 1), and the power supply voltage VDD is supplied to the memory circuit 20. The driver 22 then sets the voltage of the signal SRSTRL to the high level only in a period of a predetermined length immediately after the power supply transistor 12 is turned on. This turns on each of the transistors 31 and 32 in this period as illustrated in FIG. 5D. That is, the SRAM circuit 40 is electrically coupled to the memory elements 33 and 34 in this period. In addition, the driver 22 sets the voltage of the signal SSTRBL to the high level and sets the voltage of the signal SRSL to the low level as illustrated in FIG. 4. This turns off each of the transistors 51, 54, 55, and 58 as illustrated in FIG. 5D. In addition, the driver 22 sets the voltage of the signal SCTRL to the low level voltage VL (ground level) as illustrated in FIG. 4. This causes the node N1 to be grounded via the memory element 33, and causes the node N2 to be grounded via the memory element 34. At this time, the resistance states of the memory elements 33 and 34 are different from each other, which causes a voltage state of the SRAM circuit 40 to be determined in accordance with the resistance states of the memory elements 33 and 34.

In this example, the resistance state of the memory element 33 is the high resistance state RH, and the resistance state of the memory element 34 is the low resistance state RL. Accordingly, the node N1 is pulled down by a high resistance value, and the node N2 is pulled down by a low resistance value, which causes the voltage VN at the node N1 and the voltage VN2 at the node N2 to be respectively set to the high level voltage VH and the low level voltage VL. Thus, in the memory cell 30, the SRAM circuit 40 stores information in accordance with the information stored in the memory elements 33 and 34.

It is to be noted that, in this example, the voltage of the signal SRSTRL is set to the high level only in the period of the predetermined length immediately after the power supply transistor 12 is turned on, but this is not limitative. Alternatively, for example, the voltage of the signal SRSTRL may be set to the high level in advance before the power supply transistor 12 is turned on.

All the memory cells 30 in the memory cell array 21 simultaneously perform the restore operation OP4, for example. It is to be noted that this is not limitative, and some of the memory cells 30 in the memory cell array 21 may perform the restore operation OP4, and the other memory cells 30 may not perform the restore operation OP4. For example, in a case where the restore operation OP4 is performed in units of a row, the driver 22 may set the signal SRSTRL to the high level only in a predetermined period, as illustrated in FIG. 4, for a row on which the restore operation OP4 is to be performed, and may maintain the signal SRSTRL in the low level for a row on which the restore operation OP4 is not to be performed.

(Reset Operation OP5)

The semiconductor circuit 1 then performs the reset operation OP5 immediately after the restore operation OP4, thereby resetting the resistance states of the memory elements 33 and 34 to a predetermined resistance state (the low resistance state RL in this example).

In the reset operation OP5, the driver 22 sets the voltage of the signal SRSL to the high level as illustrated in FIG. 4. This turns on each of the transistors 54 and 58 as illustrated in FIG. 5E. In addition, the driver 22 sets the voltage of the signal SCTRL to the high level voltage VH (power supply voltage level) as illustrated in FIG. 4. This causes a reset current Irs to flow to one of the memory elements 33 and 34.

In this example, immediately after the restore operation OP4, the voltage VN1 at the node N1 is the high level voltage VH, and the voltage VN2 at the node N2 is the low level voltage VL. Thus, the transistors 52 and 53 are on, and the transistors 56 and 57 are off. Accordingly, in the memory cell 30, as illustrated in FIG. 5E, the reset current Irs flows in order of the transistor 24, the memory element 33, the transistor 53, and the transistor 54. At this time, in the memory element 33, the reset current Irs flows from the free layer F to the pinned layer P, which causes the magnetization direction of the free layer F to be changed to the same direction as the magnetization direction of the pinned layer P (parallel state), and as a result, the resistance state of the memory element 33 is changed to the low resistance state RL.

That is, in the semiconductor circuit 1, the reset operation OP5 is performed before the information in the SRAM circuit 40 is rewritten, immediately after the restore operation OP4. Accordingly, immediately after the restore operation OP4, as illustrated in FIG. 5D, the voltage VN1 at the node N1 is the high level voltage VH and the voltage VN2 at the node N2 is the low level voltage VL, for example. Thus, performing the reset operation OP5 after the restore operation OP4 is performed and before the voltages at the nodes N1 and N2 are changed makes it possible to selectively reset the resistance state of the memory element 33 that is in the high resistance state RH of the two memory elements 33 and 34 to the low resistance state RL.

As described above, both the resistance states of the memory elements 33 and 34 are set to the low resistance state RL by the reset operation OP5.

The reset operation OP5 is performed in units of a row, for example. It is possible to set a row on which the reset operation OP5 is to be performed and a row on which the reset operation OP5 is not to be performed with use of the signal SRSL, for example. Specifically, the driver 22 sets the voltage of the signal SRSL to the high level for the row on which the reset operation OP5 is to be performed as illustrated in FIG. 4, and the driver 22 sets the voltage of the signal SRSL to the low level for the row on which the reset operation OP5 is not to be performed as illustrated in FIG. 6. In addition, in this example, the driver 22 sets the signal SCTRL to the high level voltage VH for both the row on which the reset operation OP5 is to be performed and the row on which the reset operation OP5 is not to be performed as illustrated in FIGS. 4 and 6, but this is not limitative. The signal SCTRL may be maintained in the low level voltage VL for the row on which the reset operation OP5 is not to be performed.

Thereafter, the semiconductor circuit 1 performs the normal operation OP1 (FIG. 5A). After this, the semiconductor circuit 1 then repeats the store operation OP2, the standby operation OP3, the restore operation OP4, the reset operation OP5, and the normal operation OP1 in this order.

As described above, the semiconductor circuit 1 performs the store operation OP2 immediately before the standby operation OP3, thereby causing the memory elements 33 and 34 each of which is a nonvolatile memory to store information stored in the SRAM circuit 40 that is a volatile memory. The semiconductor circuit 1 then performs the restore operation OP4 immediately after the standby operation OP3, thereby causing the SRAM circuit 40 to store the information stored in the memory elements 33 and 34. This allows the semiconductor circuit 1 to return, in a short time, the state of each of the memory cells 30 to the state in which the power supply has not yet been stopped after the power supply is restarted.

The semiconductor circuit 1 then performs the reset operation OP5 before the information in the SRAM circuit 40 is rewritten, immediately after the restore operation OP4. This allows the semiconductor circuit 1 to selectively reset the resistance state of a memory element that is in the high resistance state RH of the two memory elements 33 and 34 to the low resistance state RL and prepare for the next store operation OP2.

In addition, in a case where the semiconductor circuit 1 includes the transistors 51, 52, 55, and 56 and performs the store operation OP2, for example, the store current Istr flows to the memory elements 33 and 34 via these transistors 51, 52, 55, and 56 as illustrated in FIG. 5B. In other words, in the semiconductor circuit 1, the store current does not flow to the SRAM circuit 40. This makes it possible to reduce the possibility of occurrence of so-called disturbance in the semiconductor circuit 1, as compared with a case of a comparative example to be described below.

Comparative Example

Next, workings of the present embodiment are described as compared with a semiconductor circuit 1R according to a comparative example. The semiconductor circuit 1R includes a memory circuit 20R similarly to the semiconductor circuit 1 (FIG. 1) according to the present embodiment. The memory circuit 20R includes a memory cell array 21R, a driver 22R, and a driver 23R.

FIG. 7 illustrates a configuration example of a memory cell 30R in the memory cell array 21R. The memory cell 30R includes the SRAM circuit 40, transistors 31 and 32, and the memory elements 33 and 34. That is, the memory cell 30R differs from the memory cell 30 (FIG. 2) according to the present embodiment that the transistors 51 to 58 are not included.

The semiconductor circuit 1R causes the SRAM circuit 40 that is a volatile memory to store information in the normal operation OP1. The semiconductor circuit 1R then performs the store operation OP2 immediately before the standby operation OP3, thereby causing the memory elements 33 and 34 each of which is a nonvolatile memory to store the information stored in the SRAM circuit 40 that is a volatile memory. The semiconductor circuit 1R then performs the restore operation OP4 immediately after the standby operation OP3, thereby causing the SRAM circuit 40 to store the information stored in the memory elements 33 and 34.

FIG. 8 illustrates an operation example of a certain memory cell 30R of interest in the semiconductor circuit 1R. FIGS. 9A and 9B illustrate an operation state of the memory cell 30R in the store operation OP2. In the store operation OP2, the driver 22R sets the voltage of the signal SRSTRL to the high level as illustrated in FIG. 8. This turns on the transistors 31 and 32 as illustrated in FIGS. 9A and 9B.

In the semiconductor circuit 1R according to the comparative example, each of the memory cells 30R uses two steps to cause the memory elements 33 and 34 to store information stored in the SRAM circuit 40. First, in a first step, the driver 22R sets the voltage of the signal SCTRL to the low level voltage VL (ground level) as illustrated in FIG. 8. In this example, the voltage VN1 at the node N1 is the high level voltage VH; therefore, a store current Istr1 flows in order of the transistor 43 of the inverter IV2, the transistor 31, the memory element 33, and the transistor 25 as illustrated in FIG. 9A. At this time, in the memory element 33, the store current Istr1 flows from the pinned layer P to the free layer F, which causes the resistance state of the memory element 33 to be set to the high resistance state RH. Next, in a second step, the driver 22R sets the voltage of the signal SCTRL to the high level voltage VH (power supply voltage level) as illustrated in FIG. 8. In this example, the voltage VN2 at the node N2 is the low level voltage VL; therefore, a store current Istr2 flows in order of the transistor 24, the memory element 34, the transistor 32, and the transistor 42 of the inverter IV1 as illustrated in FIG. 9B. At this time, in the memory element 34, the store current Istr2 flows from the free layer F to the pinned layer P, which causes the resistance state of the memory element 34 to be set to the low resistance state RL.

In the semiconductor circuit 1R according to the comparative example, as described above, the store current Istr1 flows from the transistor 43 of the inverter IV2 in the first step, and the store current Istr2 flows to the transistor 42 of the inverter IV1 in the second step. Accordingly, in a case where current values of the store currents Istr1 and Istr2 are large, information stored in the SRAM circuit 40 may be lost to cause so-called disturbance. In addition, in a case where sizes of the respective transistors of the SRAM circuit 40 are increased to avoid this, an area of the semiconductor circuit 1R becomes large.

In contrast, in the semiconductor circuit 1 according to the present embodiment, the transistors 51, 52, 55, and 56 are provided, and in a case where the store operation OP2 is performed, for example, as illustrated in FIG. 5B, the store current Istr flows to the memory elements 33 and 34 via the transistors 51, 52, 55, and 56. Accordingly, in the semiconductor circuit 1, the store current does not flow to the SRAM circuit 40, which makes it possible to reduce the possibility of occurrence of disturbance.

In addition, in the semiconductor circuit 1, the store current Istr and the reset current Irs do not flow to the SRAM circuit 40, which makes it possible to make a size of each of the transistors 41 to 46 of the SRAM circuit 40 equal to a size of a transistor of a typical SRAM circuit that is not coupled to the memory elements 33 and 34. As a result, it is possible to reduce an area of the semiconductor circuit 1.

In addition, in the semiconductor circuit 1, the drain of the transistor 52 is coupled to the one end of the memory element 33, and the drain of the transistor 56 is coupled to the one end of the memory element 34. This makes it possible to easily secure the current value of the store current Istr in the semiconductor circuit 1 in a case where the store operation OP2 is performed, as illustrated in FIG. 5B. That is, for example, in the semiconductor circuit 1R according to the comparative example, in a case where the resistance state of the memory element is changed to the high resistance state RH, it may not be possible to sufficiently secure the current value of the store current. Specifically, in FIG. 9A, the store current Istr1 flows in order of the transistor 43 of the inverter IV2, the transistor 31, the memory element 33, and the transistor 25. At this time, the transistor 31 operates as a so-called source follower, which causes a so-called negative feedback effect on the voltage at the one end of the memory element 33. This makes it difficult to secure the current value of the store current Istr1. In contrast, in the semiconductor circuit 1, the drain of the transistor 52 is coupled to the one end of the memory element 33, and the drain of the transistor 56 is coupled to the one end of the memory element 34, which does not cause the so-called negative feedback effect. This makes it possible to easily secure the current value of the store current Istr.

Similarly, in the semiconductor circuit 1, the drain of the transistor 53 is coupled to the one end of the memory element 33, and the drain of the transistor 57 is coupled to the one end of the memory element 34, which makes it possible to easily secure the current value of the reset current Irs in a case where the reset operation OP5 is performed.

In addition, in the semiconductor circuit 1, as described above, it is possible to easily secure the current value of store current Istr, which makes it possible to reduce sizes of the transistors 51, 52, 55, and 56, for example. Similarly, it is possible to easily secure the current value of the reset current Irs, which makes it possible to reduce sizes of the transistors 53, 54, 57, and 58, for example. Thus, in the semiconductor circuit 1, it is possible to reduce the sizes of the transistors 51 to 58, which makes it possible to reduce an area of each of the memory cells 30 and reduce the area of the semiconductor circuit 1.

In addition, in the semiconductor circuit 1, a path (the transistors 51, 52, 55, and 56) for causing the store current Istr to flow to the memory elements 33 and 34 and a path (the transistors 53, 54, 57, and 58) for causing the reset current Irs to flow to the memory elements 33 and 34 are separately provided, which makes it possible to reduce the possibility of occurrence of so-called backhopping and to improve reliability and durability of the circuit. That is, for example, in the semiconductor circuit 1R according to the comparative example, in a case where the resistance state of the memory element 33 is changed to the high resistance state RH, for example, the store current flows in order of the transistor 43 of the inverter IV2, the transistor 31, the memory element 33, and the transistor 25 as illustrated in FIG. 9A; therefore, the transistor 31 operates as a so-called source follower, which makes it difficult to secure the current value. In contrast, in a case where the resistance state of the memory element 33 is changed to the low resistance state RL, the store current flows in order of the transistor 24, the memory element 33, the transistor 31, and the transistor 44 of the inverter IV2 similarly to the case of FIG. 9B; therefore, the transistor 31 does not operate as a so-called source follower as described above, which makes it easy to secure the current value. Accordingly, in the semiconductor circuit 1R, the size of the transistor 31 is desirably increased to allow the current value to be secured in a case where the resistance state of the memory element 33 is changed to the high resistance state RH. However, in this case, in a case where the resistance state of the memory element 33 is changed to the low resistance state RL, too much current flows. In a case where too much current flows in such a manner, for example, in the store operation OP2 and the reset operation OP5, the resistance state of the memory element 33 may be changed to a resistance state different from a desired resistance state, that is, so-called backhopping may occur. In addition, too much current flowing may cause deterioration in reliability and durability of the circuit. In contrast, in the semiconductor circuit 1, the path (the transistors 51, 52, 55, and 56) for causing the store current Istr to flow to the memory elements 33 and 34 and the path (the transistors 53, 54, 57, and 58) for causing the reset current Irs to flow to the memory elements 33 and 34 are separately provided. This makes it possible to determine the sizes of the transistors 51, 52, 55, and 56 in consideration of the current amount of the store current Istr and determine the sizes of the transistors 53, 54, 57, and 58 in consideration of the current amount of the reset current Irs. As described above, in the semiconductor circuit 1, it is possible to set the current value of the store current Istr and the current value of the reset current Irs independently of each other, which makes it possible to relax constraints on circuit design. As a result, in the semiconductor circuit 1, it is possible to reduce the possibility that too much current flows, which makes it possible to reduce the possibility of occurrence of backhopping and to improve reliability and durability of the circuit.

(Layout Example)

FIG. 10 illustrates an example of a layout of the memory cell 30 according to the present embodiment. In this example, the transistors 41 to 46, 31, and 32 are configured with transistors having a standard threshold voltage (Standard Vth) and the transistors 51 to 58 are configured with transistors having a low threshold voltage (Low Vth or Ultra-low Vth). It is to be noted that, in this example, transistors having Ultra-low Vth are used. The transistors 51 to 58 are configured with transistors having a low threshold voltage in such a manner, which makes it possible to achieve a sufficient store current Istr and a sufficient reset current Irs in a small area. It is to be noted that this is not limitative, and all transistors in the memory cell 30 may be configured with transistors having a standard threshold voltage, or may be configured with transistors having a low threshold voltage. It is possible to configure the memory cell 30 with use of, for example, transistors having the same characteristics (for example, a threshold voltage) as a transistor used in a normal SRAM. In addition, a layout rule used to lay out the normal SRAM is applicable to the layout of the memory cell 30. This makes it possible to enhance the degree of integration or to enhance operation speed.

[Effects]

As described above, in the present embodiment, the transistors 51, 52, 55, and 56 are provided, and in a case where the store operation is performed, the store current flows to the memory elements via these transistors; therefore, the store current does not flow to the SRAM circuit, which makes it possible to reduce the possibility of occurrence of disturbance. In addition, the store current does not flow to the SRAM circuit in this manner, which makes it possible to reduce the sizes of the transistors in the SRAM circuit. This makes it possible to reduce the area of the semiconductor circuit.

In the present embodiment, the drain of the transistor 52 is coupled to the one end of the memory element 33, and the drain of the transistor 56 is coupled to the one end of the memory element 34, which makes it possible to easily secure the current value of the store current in a case where the store operation is performed. Similarly, in the present embodiment, the drain of the transistor 53 is coupled to the one end of the memory element, and the drain of the transistor 57 is coupled to the one end of the memory element 34, which makes it possible to easily secure the current value of the reset current in a case where the reset operation is performed.

In the present embodiment, it is possible to easily secure the current value of the store current and the current value of the reset current, which makes it possible to reduce the sizes of the transistors 51 to 58. This makes it possible to reduce the area of the semiconductor circuit.

In the present embodiment, the path for causing the store current to flow to the memory element and the path for causing the reset current to flow to the memory element are separately provided, which makes it possible to reduce the possibility of occurrence of backhopping and to improve reliability and durability of the circuit.

Modification Example 1

In the above-described embodiment, as illustrated in FIG. 3, the driver 22 drives the store control lines STRBL in units of a row, and drives the reset control lines RSL in units of a row, but this is not limitative. Alternatively, for example, as in a semiconductor circuit 1A illustrated in FIG. 11, the store control lines STRBL may be driven in units of a plurality of rows, and the reset control lines RSL may be driven in units of a plurality of rows. The semiconductor circuit 1A includes a memory circuit 20A. The memory circuit 20A includes the memory cell array 21 and drivers 22A and 23. In this example, two store control lines STRBL are coupled to each other, and two reset control lines RSL are coupled to each other. Accordingly, the driver 22A drives the store control lines STRBL in units of two store control lines STRBL, and drives the reset control lines RSL in units of two reset control lines RSL.

Modification Example 2

In the above-described embodiment, as illustrated in FIG. 3, the driver 22 includes the inverter (the transistors 24 and 25) that generates the signal SCTRL, but this is not limitative. Alternatively, for example, each memory cell may include an inverter that generates the signal SCTRL. A semiconductor circuit 1B according to the present modification example is described in detail below. The semiconductor circuit 1B includes a memory circuit 20B. The memory circuit 20B includes a memory cell array 21B and drivers 22B and 23.

FIG. 12 illustrates a configuration example of a memory cell 30B of the memory cell array 21B. FIG. 13 illustrates a configuration example of the memory cell array 21B. The memory cell array 21B includes a plurality of control lines CTRBL. That is, in the memory cell array 21 according to the above-described embodiment includes the plurality of control lines CTRL, but the memory cell array 21B according to the present modification example includes the plurality of control lines CTRBL instead of the plurality of control lines CTRL. The control lines CTRBL extend in a horizontal direction of FIGS. 12 and 13, and one end of each of the control lines CTRBL is coupled to the driver 22B. The driver 22B applies the signal SCTRBL to each of the control lines CTRBL. This signal SCTRBL is an inverted signal of the signal SCTRL according to the above-described embodiment.

The memory cell 30B includes transistors 37 and 38. The transistor 37 is a P-type MOS transistor, and has a gate coupled to the control line CTRBL, a source to be supplied with the power supply voltage VDD, and a drain coupled to a drain of the transistor 38 and the other ends of the memory elements 33 and 34. The transistor 38 is an N-type MOS transistor, and has a gate coupled to the control line CTRBL, the drain coupled to the drain of the transistor 37 and the other ends of the memory elements 33 and 34, and a source grounded. The transistors 37 and 38 are included in an inverter. The inverter then generates the signal SCTRL on the basis of the signal SCTRBL, and supplies the signal SCTRL to the other ends of the memory elements 33 and 34. Here, the transistor 37 corresponds to a specific example of a "nineteenth transistor" in the present disclosure. The transistor 38 corresponds to a specific example of a "twentieth transistor" in the present disclosure.

The driver 22B applies the signal SCTRBL to each of the control lines CTRBL on the basis of a control signal supplied from the controller 11.

Modification Example 3

In the above-described embodiment, the control lines CTRL, the restore control lines RSTRL, the store control lines STRBL, and the reset control lines RSL extend in the horizontal direction of FIGS. 2 and 3, but this is not limitative. A semiconductor circuit 1C according to the present modification example is described in detail below. The semiconductor circuit 1C includes a memory circuit 20C. The memory circuit 20C includes a memory cell array 21C and drivers 22C and 23C.

FIG. 14 illustrates a configuration example of a memory cell 30C of the memory cell array 21C. FIG. 15 illustrates a configuration example of the memory cell array 21C. The memory cell array 21C includes a plurality of store control lines STRBL1, a plurality of store control lines STRBL2, a plurality of reset control lines RSL1, and a plurality of reset control lines RSL2. That is, the memory cell array 21 according to the above-described embodiment includes the plurality of store control lines STRBL and the reset control lines RSL, but the memory cell array 21C according to the present modification example includes the plurality of store control lines STRBL1 and the plurality of store control lines STRBL2 instead of the plurality of store control lines STRBL, and the plurality of reset control lines RSL1 and the plurality of reset control lines RSL2 instead of the plurality of reset control lines RSL. The store control lines STRBL1 and the store control lines STRBL2 extend in a horizontal direction of FIGS. 14 and 15, and the store control line STRBL1 and the store control line STRBL2 that belong to the same column are coupled to each other. The driver 23C applies the signal SSTRBL to these store control lines STRBL1 and STRBL2. The reset control lines RSL1 and RSL2 extend in the horizontal direction of FIGS. 14 and 15, and the reset control lines RSL1 and RSL2 that belong to the same column are coupled to each other. The driver 23C applies the signal SRSL to these reset control lines RSL1 and RSL2.

In the memory cell 30C, the gate of the transistor 51 is coupled to the store control line STRBL1, the gate of the transistor 55 is coupled to the store control line STRBL2, the gate of the transistor 54 is coupled to the reset control line RSL1, and the gate of the transistor 58 is coupled to the reset control line RSL2.

The driver 22C respectively applies the signal SCTRL and the signal SRSTRL to each of the control lines CTRL and each of the restore control lines RSTRL on the basis of a control signal supplied from the controller 11. The driver 23C applies the signal SSTRBL to each of the store control lines STRBL1 and STRBL2 and applies the signal SRSL to each of the reset control lines RSL1 and RSL2 on the basis of a control signal supplied from the controller 11.

It is to be noted that, in the semiconductor circuit 1C, the driver 23C drives the store control lines STRBL1 and STRBL2 in units of a column and drives the reset control lines RSL1 and RSL2 in units of a column, but this is not limitative. For example, the store control lines STRBL1 and STRBL2 may be driven in units of a plurality of columns and the reset control lines RSL1 and RSL2 may be driven in units of a plurality of columns.

Modification Example 4

In the above-described embodiment, as illustrated in FIG. 2, eight transistors 51 to 58 are provided for each of the memory cells 30, but this is not limitative. A semiconductor circuit 1D according to the present modification example is described in detail below.

FIG. 16 illustrates a configuration example of a memory cell 30D of the semiconductor circuit 1D. The memory cell 30D includes transistors 35 and 36. The memory cell 30D differs from the memory cell 30 (FIG. 2) according to the above-described embodiment in that two transistors 51 and 55 are replaced with one transistor 35 and two transistors 54 and 58 are replaced with one transistor 36. The transistor 35 is a P-type MOS transistor, and has a gate coupled to the store control line STRBL, a source to be supplied with the power supply voltage VDD, and a drain coupled to sources of the transistors 52 and 56. The transistor 36 is a N-type MOS transistor, and has a gate coupled to the reset control line RSL, a drain coupled to sources of the transistors 53 and 57, and a source grounded. Here, the transistor 35 corresponds to a specific example of an "eleventh transistor" in the present disclosure. The transistor 36 corresponds to a specific example of a "twelfth transistor" in the present disclosure.

FIG. 17A illustrates an operation state of the memory cell 30D in the store operation OP2. In the store operation OP2, the driver 22 sets the voltage of the signal SSTRBL to the low level as illustrated in FIG. 4. This turns on the transistor 35 as illustrated in FIG. 17A. In addition, the driver 22 sets the voltage of the signal SCTRL to the low level voltage VL (ground level). In this example, the voltage VN1 at the node N1 is the high level voltage VH, and the voltage VN2 at the node N2 is the low level voltage VL; therefore, the transistors 52 and 53 are on, and the transistors 56 and 57 are off. Accordingly, in the memory cell 30D, the store current Istr flows in order of the transistor 35, the transistor 52, the memory element 33, and the transistor 25 as illustrated in FIG. 17A, and the resistance state of the memory element 33 is changed to the high resistance state RH.

FIG. 17B illustrates an operation state of the memory cell 30D in the reset operation OP5. In the reset operation OP5, the driver 22 sets the voltage of the signal SRSL to the high level as illustrated in FIG. 4. This turns on the transistor 36 as illustrated in FIG. 17B. In addition, the driver 22 sets the voltage of the signal SCTRL to the high level voltage VH (power supply voltage level). In this example, the voltage VN1 at the node N1 is the high level voltage VH, and the voltage VN2 at the node N2 is the low level voltage VL; therefore, the transistors 52 and 53 are on, and the transistors 56 and 57 are off. Accordingly, in the memory cell 30D, the reset current Irs flows in order of the transistor 24, the memory element 33, the transistor 53, and the transistor 36 as illustrated in FIG. 17B, and the resistance state of the memory element 33 is changed to the low resistance state RL.

A current value of the store current Istr (FIG. 17A) flowing to the transistor 35 is substantially equal to a current value of the store current Istr (FIG. 5B) flowing to the transistor 51 or the transistor 55. That is, it is possible to make a size of the transistor 35 substantially equal to a size of each of the transistors 51 and 55. Similarly, a current value of the reset current Irs (FIG. 17B) flowing to the transistor 36 is substantially equal to a current value of the reset current Irs (FIG. 5E) flowing to the transistor 54 or the transistor 58. That is, it is possible to make a size of the transistor 36 substantially equal to a size of each of the transistors 54 and 58. Accordingly, two transistors 51 and 55 are replaced with one transistor 35 and two transistors 54 and 58 are replaced with one transistor 36, which makes it possible to reduce an area of the memory cell 30D.

In the semiconductor circuit 1D according to the present modification example, the control lines CTRL, the restore control lines RSTRL, the store control lines STRBL, and the reset control line RSL extend in the horizontal direction of FIG. 16, but this is not limitative. Alternatively, for example, store control lines and reset control lines may extend in the vertical direction. A semiconductor circuit 1E according to the present modification example is described in detail below. The semiconductor circuit 1E includes a memory circuit 20E. The memory circuit 20E includes a memory cell array 21E and drivers 22E and 23E.

FIG. 18 illustrates a configuration example of a memory cell 30E of the memory cell array 21E. FIG. 19 illustrates a configuration example of the memory cell array 21E. The memory cell array 21E includes a plurality of store control lines STRBL3 and a plurality of reset control lines RSL3. That is, the memory cell array 21 according to the above-described embodiment includes the plurality of store control lines STRBL and the reset control line RSL, but the memory cell array 21E according to the present modification example includes the plurality of store control lines STRBL3 instead of the plurality of store control lines STRBL, and the plurality of reset control lines RSL3 instead of the plurality of reset control lines RSL. The store control lines STRBL3 extend in a vertical direction of FIGS. 18 and 19, and one end of each of the store control lines STRBL3 is coupled to the driver 23E. The driver 23E applies a signal SSTRBL to each of the store control lines STRBL3. The reset control lines RSL3 extend in the vertical direction of FIGS. 18 and 19, and one end of each of the reset control lines RSL3 is coupled to the driver 23E. The driver 23E applies the signal SRSL to each of the reset control lines RSL3.

In the memory cell 30E, the gate of the transistor 35 is coupled to the store control line STRBL3, and the gate of the transistor 36 is coupled to the reset control line RSL3.

The driver 22E respectively applies the signal SCTRL and the signal SRSTRL to each of the control lines CTRL and each of the restore control line RSTRL on the basis of a control signal supplied from the controller 11.

Modification Example 5

In the above-described embodiment, as illustrated in FIG. 2, the memory cell 30 includes the transistors 51, 54, 55, and 58, but this is not limitative. Alternatively, for example, the driver 22 may include transistors corresponding to these transistors. A semiconductor circuit 1F according to the present modification example is described in detail below. The semiconductor circuit 1F includes a memory circuit 20F. The memory circuit 20F includes a memory cell array 21F and drivers 22F and 23.

FIG. 20 illustrates a configuration example of a memory cell 30F of the memory cell array 21F. FIG. 21 illustrates a configuration example of the memory cell array 21F. The memory cell array 21F includes a plurality of store control lines STRBL4 and a plurality of reset control lines RSL4. The store control lines STRBL4 extend in a horizontal direction of FIGS. 20 and 21, and one end of each of the store control lines STRBL4 is coupled to the driver 22F. The driver 22F applies a signal SSTRBL4 to each of the store control lines STRBL4. The reset control lines RSL4 extend in the horizontal direction of FIGS. 20 and 21, and one end of each of the reset control lines RSL4 is coupled to the driver 22F. The driver 22F applies a signal SRSL4 to each of the reset control lines RSL4.

The memory cell 30F includes the transistors 52, 53, 56, and 57. The sources of the transistors 52 and 56 are coupled to the store control line STRBL4, and the sources of the transistors 53 and 57 are coupled to the reset control line RSL4.

The driver 22F respectively applies the signal SCTRL, the signal SRSTRL, the signal SSTRBL4, and the signal SRSL4 to each of the control lines CTRL, each of the restore control lines RSTRL, each of the store control lines STRBL4, and each of the reset control lines RSL4 on the basis of a control signal supplied from the controller 11. As illustrated in FIG. 21, the driver 22F includes the transistors 26 and 27. The transistor 26 is a P-type MOS transistor, and has the gate to be supplied with the signal SSTRBL, the source to be supplied with the power supply voltage VDD, and the drain coupled to the store control line STRBL4. The transistor 26 corresponds to the transistors 51 and 55 of the memory cell 30 (FIG. 2) according to the above-described embodiment. The transistor 27 is an N-type MOS transistor, and has the gate to be supplied with the signal SRSL, the drain coupled to the reset control line RSL4, and the source grounded. The transistor 27 corresponds to the transistors 54 and 58 of the memory cell 30 (FIG. 2) according to the above-described embodiment.

FIG. 22 illustrates an example of a layout of the memory cell 30F according to the present embodiment. It is possible to reduce the number of transistors in the memory cell 30F in such a manner, as compared with the memory cell 30 (FIGS. 2 and 10) according to the above-described embodiment, which makes it possible to reduce an area of the memory cell 30F.

In the semiconductor circuit 1F, as illustrated in FIG. 21, each of the transistors 26 of the driver 22H drives one store control line STRBL4, and each of the transistors 27 of the driver 22H drives one reset control line RSL4, but this is not limitative. Alternatively, for example, as in a semiconductor circuit 1G illustrated in FIG. 23, each of the transistors 26 of a driver 22G may drive a plurality of (two in this example) store control lines STRBL4, and each of the transistors 27 of the driver 22G may drive a plurality of (two in this example) reset control lines RSL4.

In the semiconductor circuit 1F according to the present modification example, the control lines CTRL, the restore control lines RSTRL, the store control lines STRBL4, and the reset control line RSL4 extend in the horizontal direction of FIGS. 20 and 21, but this is not limitative. Alternatively, for example, store control lines and reset control lines may extend in the vertical direction. A semiconductor circuit 1H according to the present modification example is described in detail below. The semiconductor circuit 1H includes a memory circuit 20H. The memory circuit 20H includes a memory cell array 21H and drivers 22H and 23H.

FIG. 24 illustrates a configuration example of a memory cell 30H of the memory cell array 21H. FIG. 25 illustrates a configuration example of the memory cell array 21H. The memory cell array 21H includes a plurality of store control lines STRBL5 and a plurality of reset control lines RSL5. That is, the memory cell array 21 according to the above-described embodiment includes the plurality of store control lines STRBL and the reset control line RSL, but the memory cell array 21H according to the present modification example include the plurality of store control lines STRBL5 instead of the plurality of store control lines STRBL, and the plurality of reset control lines RSL5 instead of the plurality of reset control lines RSL. The store control lines STRBL5 extend in the vertical direction of FIGS. 24 and 25, and one end of each of the store control lines STRBL5 is coupled to the driver 23H. The driver 23H applies a signal SSTRBL5 to each of the store control lines STRBL5. The reset control lines RSL5 extend in the vertical direction of FIGS. 24 and 25, and one end of each of the reset control lines RSL5 is coupled to the driver 23H. The driver 23H applies a signal SRSL5 to each of the reset control lines RSL5.

In the memory cell 30H, the sources of the transistors 52 and 56 are coupled to the store control line STRBL5, and the sources of the transistors 53 and 57 are coupled to the reset control line RSL5.

The driver 22H respectively applies the signal SCTRL and the signal SRSTRL to each of the control lines CTRL and each of the restore control lines RSTRL on the basis of a control signal supplied from the controller 11.

The driver 23H respectively applies the signal SSTRBL5 and the signal SRSL5 to each of the store control lines STRBL5 and each of the reset control lines RSL5 on the basis of a control signal supplied from the controller 11. As illustrated in FIG. 25, the driver 23H includes transistors 28 and 29. The transistor 28 is a P-type MOS transistor, and has a gate to be supplied with the signal SSTRBL, a source to be supplied with the power supply voltage VDD, and a drain coupled to the store control line STRBL5. The transistor 29 is an N-type MOS transistor, and has a gate to be supplied with the signal SRSL, a drain coupled to the reset control line RSL5, and a source grounded.

In addition, for example, one of the store control lines and the reset control lines may extend in the horizontal direction, and the other may extend in the vertical direction. A semiconductor circuit 1J according to the present modification example is described in detail below. The semiconductor circuit 1J includes a memory circuit 20J. The memory circuit 20J includes a memory cell array 21J and drivers 22J and 23J.

FIG. 26 illustrates a configuration example of a memory cell 30J of the memory cell array 21J. FIG. 27 illustrates a configuration example of the memory cell array 21J. The memory cell array 21J includes the plurality of store control lines STRBL5 and the plurality of reset control lines RSL4. The store control lines STRBL5 extend in a vertical direction of FIGS. 26 and 27, and one end of each of the store control lines STRBL5 is coupled to the driver 23J. The driver 23J applies the signal SSTRBL5 to each of the store control lines STRBL5. The reset control lines RSL4 extend in a horizontal direction of FIGS. 26 and 27, and one end of each of the reset control lines RSL4 is coupled to the driver 22J. The driver 22J applies the signal SRSL4 to each of the reset control lines RSL4.

In the memory cell 30J, the sources of the transistors 52 and 56 are coupled to the store control line STRBL5, and the sources of the transistors 53 and 57 are coupled to the reset control line RSL4.

The driver 22J respectively applies the signal SCTRL, the signal SRSTRL, and the signal SRSL4 to each of the control lines CTRL, each of the restore control lines RSTRL, and each of the reset control lines RSL4 on the basis of a control signal supplied from the controller 11. As illustrated in FIG. 27, the driver 22J includes the transistor 27. The transistor 27 is an N-type MOS transistor, and has the gate to be supplied with the signal SRSL, the drain coupled to the reset control line RSL4, and the source grounded.

The driver 23J applies the signal SSTRBL5 to each of the store control lines STRBL5 on the basis of a control signal supplied from controller 11. As illustrated in FIG. 27, the driver 23J includes the transistor 28. The transistor 28 is a P-type MOS transistor, and has the gate to be supplied with the signal SSTRBL, the source to be supplied with the power supply voltage VDD, and the drain coupled to the store control line STRBL5.

Modification Example 6

In the above-described embodiment, the resistance states of the memory elements 33 and 34 are set to the low resistance state RL by the reset operation OP5, but this is not limitative. Alternatively, the resistance states of the memory elements 33 and 34 may be set to the high resistance state RH. A semiconductor circuit 1K according to the present modification example is described in detail below. The semiconductor circuit 1K includes a memory circuit 20K. The memory circuit 20K includes a memory cell array 21K and drivers 22K and 23.

FIG. 28 illustrates a configuration example of a memory cell 30K of the memory cell array 21K. The memory cell array 21K includes a plurality of store control lines STRL and a plurality of reset control lines RSBL. The store control lines STRL extend in a horizontal direction of FIG. 28, and one end of each of the store control lines STRL is coupled to the driver 22K. The driver 22K applies a signal SSTRL to each of the store control lines STRL. The reset control lines RSBL extend in the horizontal direction of FIG. 28, and one end of each of the reset control lines RSBL is coupled to the driver 22K. The driver 22K applies a signal SRSBL to each of the reset control lines RSBL.

The memory cell 30K includes transistors 61 to 68. The transistors 61 to 68 respectively correspond to the transistor 58 to 51.

The transistors 61 and 62 are N-type MOS transistors, and the transistors 63 and 64 are P-type MOS transistors. The transistor 61 has a gate coupled to the store control line STRL, a source grounded, and a drain coupled to a source of the transistor 62. The transistor 62 has a gate coupled to the node N2, the source coupled to the drain of the transistor 61, and a drain coupled to a drain of the transistor 63, the source of the transistor 31, and the one end of the memory element 33. The transistor 63 has a gate coupled to the node N1, the drain coupled to the drain of the transistor 62, the source of the transistor 31, and the one end of the memory element 33, and a source coupled to a drain of the transistor 64. The transistor 64 has a gate coupled to the reset control line RSBL, the drain coupled to the source of the transistor 63, and a source to be supplied with the power supply voltage VDD.

The transistors 66 and 66 are N-type MOS transistors, and the transistors 67 and 68 are P-type MOS transistors. The transistor 65 has a gate coupled to the store control line STRL, a source grounded, and a drain coupled to a source of the transistor 66. The transistor 66 has a gate coupled to the node N1, the source coupled to the drain of the transistor 65, and a drain coupled to a drain of the transistor 67, the source of the transistor 32, and the one end of the memory element 34. The transistor 67 has a gate coupled to the node N2, the drain coupled to the drain of the transistor 66, the source of the transistor 32, and the one end of the memory element 35, and a source coupled to a drain of the transistor 68. The transistor 68 has a gate coupled to the reset control line RSBL, the drain coupled to the source of the transistor 67, and a source to be supplied with the power supply voltage VDD.

The driver 22K respectively applies the signal SSTRL and the signal SRSBL to each of the store control lines STRL and each of the reset control lines RSBL on the basis of a control signal supplied from the controller 11.

FIG. 29 illustrates an operation example of a certain memory cell 30K of interest in the semiconductor circuit 1K. FIGS. 30A, 3B, and 30C each illustrate an operation state of the memory cell 30K. FIG. 30A illustrates a state in the normal operation OP1. FIG. 30B illustrates a state in the store operation OP2. FIG. 30C illustrates a state in the reset operation OP5.

In the normal operation OP1, as illustrated in FIG. 29, the controller 11 sets the voltage of the power supply control signal SPG to the low level. This turns on the power supply transistor 12 (FIG. 1), and the power supply voltage VDD is supplied to the memory circuit 20K. The driver 22K then sets the voltage of the signal SRSTRL to the low level as illustrated in FIG. 29. This turns off each of the transistors 31 and 32 as illustrated in FIG. 30A. In addition, as illustrated in FIG. 29, the driver 22K sets a voltage of the signal SSTRL to the low level and sets a voltage of the signal SRSBL to the high level. This turns off each of the transistors 61, 64, 65, and 68 as illustrated in FIG. 30A. In addition, the driver 22K sets the voltage of the signal SCTRL to the low level voltage VL (ground level) as illustrated in FIG. 29.

In this normal operation OP1, the semiconductor circuit 1K writes information to the SRAM circuit 40 of the memory cell 30K or reads information from the SRAM circuit 40. The resistance states of the memory elements 33 and 34 are each maintained in a predetermined resistance state (the high resistance state RH in this example).

In the store operation OP2, the driver 22K sets the voltage of the signal SSTRL to the high level as illustrated in FIG. 29. This turns on each of the transistors 61 and 65 as illustrated in FIG. 30B. The driver 22K then sets the voltage of the signal SCTRL to the high level voltage VH (power supply voltage level) as illustrated in FIG. 20. This causes the store current Istr to flow to one of the memory elements 33 and 34.

In this example, the voltage VN1 at the node N1 is the high level voltage VH, and the voltage VN2 at the node N2 is the low level voltage VL (VN2=VL); therefore, the transistors 66 and 67 are on, and the transistors 62 and 63 are off. Accordingly, in the memory cell 30K, as illustrated in FIG. 30B, the store current Istr flows in order of the transistor 24, the memory element 34, the transistor 66, and the transistor 66. At this time, in the memory element 34, the store current Istr flows from the free layer F to the pinned layer P, which causes the resistance state of the memory element 34 to be set to the low resistance state RL.

The standby operation OP3 and the restore operation OP4 are similar to those in the above-described embodiment (FIGS. 5C and 5D).

In the reset operation OP5, the driver 22K sets the voltage of the signal SRSBL to the low level as illustrated in FIG. 29. This turns on each of the transistors 64 and 68 as illustrated in FIG. 30C. In addition, the driver 22K sets the voltage of the signal SCTRL to the low level voltage VL (ground level) as illustrated in FIG. 29. This causes the reset current Irs to flow to one of the memory elements 33 and 34.

In this example, immediately after the restore operation OP4, the voltage VN1 at the node N1 is the high level voltage VH, and the voltage VN2 at the node N2 is the low level voltage VL. Thus, the transistors 66 and 67 are on, and the transistors 62 and 63 are off. Accordingly, in the memory cell 30K, as illustrated in FIG. 30C, the reset current Irs flows in order of the transistor 68, the transistor 67, the memory element 34, and the transistor 25. At this time, in the memory element 34, the reset current Irs flows from the pinned layer P to the free layer F, which causes the resistance state of the memory element 34 to be set to the high resistance state RH.

As described above, both the resistance states of the memory elements 33 and 34 are set to the high resistance state RH by the reset operation OP5. Thereafter, the semiconductor circuit 1K performs the normal operation OP1 (FIG. 30A).

Modification Example 7

In the above-described embodiment, as illustrated in FIG. 2, the memory element 33 includes the pinned layer P coupled to the source of the transistor 31 and the drains of the transistors 52 and 53, and the free layer F coupled to the control line CTRL, and the memory element 34 includes the pinned layer P coupled to the source of the transistor 32 and the drains of the transistors 56 and 57, and the free layer F coupled to the control line CTRL, but this is not limitative. A semiconductor circuit 1L according to the present modification example is described in detail below. The semiconductor circuit 1L includes a memory circuit 20L. The memory circuit 20L includes a memory cell array 21L and the drivers 22 and 23.

FIG. 31 illustrates a configuration example of a memory cell 30L of the memory cell array 21L. The memory cell 30L includes memory elements 33L and 34L. The memory element 33L includes the free layer F coupled to the source of the transistor 31 and the drains of the transistors 52 and 53, and the pinned layer P coupled to the control line CTRL. The memory element 34L includes the free layer F coupled to the source of the transistor 32 and the drains of the transistors 56 and 57, and the pinned layer P coupled to the control line CTRL. The gates of the transistors 52 and 57 are coupled to the node N1, and the gates of the transistors 53 and 56 are coupled to the node N2. That is, in the memory cell 30L according to the present modification example differs from the memory cell 30 (FIG. 2) according to the above-described embodiment in that the orientation of the memory elements 33 and 34 is changed and coupling of the gates of the transistors 52, 53, 56, and 57 is changed.

FIGS. 32A, 32B, and 32C each illustrate an operation state of the memory cell 30L. FIG. 32A illustrates a state in the normal operation OP1. FIG. 32B illustrates a state in the store operation OP2. FIG. 32C illustrates a state in the reset operation OP5.

In the normal operation OP1, as illustrated in FIG. 4, the controller 11 sets the voltage of the power supply control signal SPG to the low level. This turns on the power supply transistor 12 (FIG. 1), and the power supply voltage VDD is supplied to the memory circuit 20L. The driver 22 then sets the voltage of the signal SRSTRL to the low level as illustrated in FIG. 4. This turns off each of the transistors 31 and 32 as illustrated in FIG. 32A. In addition, as illustrated in FIG. 4, the driver 22 sets the voltage of the signal SSTRBL to the high level and sets the voltage of the signal SRSL to the low level. This turns off each of the transistors 51, 54, 55, and 58 as illustrated in FIG. 32A. In addition, the driver 22 sets the voltage of the signal SCTRL to the low level voltage VL (ground level) as illustrated in FIG. 4.

In this normal operation OP1, the semiconductor circuit 1L writes information to the SRAM circuit 40 of the memory cell 30L or reads information from the SRAM circuit 40. Resistance states of the memory elements 33L and 34L are each maintained in a predetermined resistance state (the high resistance state RH in this example).

In the store operation OP2, the driver 22 sets the voltage of the signal SSTRBL to the low level as illustrated in FIG. 4. This turns on each of the transistors 51 and 55 as illustrated in FIG. 32B. The driver 22 then turns off the transistor 24 and turns on the transistor 25 as illustrated in FIG. 32B, thereby setting the voltage of the signal SCTRL to the low level voltage VL (ground level). This causes the store current Istr to flow to one of the memory elements 33L and 34L.

In this example, the voltage VN1 at the node N1 is the high level voltage VH, and the voltage VN2 at the node N2 is the low level voltage VL; therefore, the transistors 56 and 57 are on, and the transistors 52 and 53 are off. Accordingly, in the memory cell 30L, as illustrated in FIG. 32B, the store current Istr flows in order of the transistor 55, the transistor 56, the memory element 34L, and the transistor 25. At this time, in the memory element 34L, the store current Istr flows from the free layer F to the pinned layer P, which causes the resistance state of the memory element 34L to be set to the low resistance state RL.

The standby operation OP3 and the restore operation OP4 are similar to those in the above-described embodiment (FIGS. 5C and 5D).

In the reset operation OP5, the driver 22 sets the voltage of the signal SRSL to the high level as illustrated in FIG. 4. This turns on each of the transistors 54 and 58 as illustrated in FIG. 32C. In addition, the driver 22 sets the voltage of the signal SCTRL to the high level voltage VH (power supply voltage level) as illustrated in FIG. 4. This causes the reset current Irs to flow to one of the memory elements 33L and 34L.

In this example, immediately after the restore operation OP4, the voltage VN1 at the node N1 is the high level voltage VH, and the voltage VN2 at the node N2 is the low level voltage VL. Thus, the transistors 56 and 57 are on, and the transistors 52 and 53 are off. Accordingly, in the memory cell 30L, as illustrated in FIG. 32C, the reset current Irs flows in order of the transistor 24, the memory element 34L, the transistor 57, and the transistor 58. At this time, in the memory element 34L, the reset current Irs flows from the pinned layer P to the free layer F, which causes the resistance state of the memory element 34L to be set to the high resistance state RH.

As described above, both the resistance states of the memory elements 33L and 34L are set to the high resistance state RH by the reset operation OP5. Thereafter, the semiconductor circuit 1L performs the normal operation OP1 (FIG. 32A).

In the semiconductor circuit 1L, the resistance states of the memory elements 33L and 34L are set to the high resistance state RH by the reset operation OP5, but this is not limitative. Alternatively, the resistance states of the memory elements 33L and 34L may be set to the low resistance state RL. A semiconductor circuit 1M according to the present modification example is described in detail below. The semiconductor circuit 1M includes a memory circuit 20M. The memory circuit 20M includes a memory cell array 21M and drivers 22K and 23.

FIG. 33 illustrates a configuration example of a memory cell 30M of the memory cell array 21M. The memory cell array 21M includes the plurality of store control lines STRL, the plurality of reset control lines RSBL, the transistors 61 to 68, and memory elements 33L and 34L. The gates of the transistors 62 and 67 are coupled to the node N1, and the gates of the transistors 63 and 66 are coupled to the node N2.

FIGS. 34A, 32B, and 34C each illustrate an operation state of the memory cell 30M. FIG. 34A illustrates a state in the normal operation OP1. FIG. 34B illustrates a state in the store operation OP2. FIG. 34C illustrates a state in the reset operation OP5.

In the normal operation OP1, as illustrated in FIG. 29, the controller 11 sets the voltage of the power supply control signal SPG to the low level. This turns on the power supply transistor 12 (FIG. 1), and the power supply voltage VDD is supplied to the memory circuit 20M. The driver 22K then sets the voltage of the signal SRSTRL to the low level as illustrated in FIG. 29. This turns off each of the transistors 31 and 32 as illustrated in FIG. 34A. In addition, as illustrated in FIG. 29, the driver 22K sets the voltage of the signal SSTRL to the low level and sets the voltage of the signal SRSBL to the high level. This turns off each of the transistors 61, 64, 65, and 68 as illustrated in FIG. 34A. In addition, the driver 22K sets the voltage of the signal SCTRL to the low level voltage VL (ground level) as illustrated in FIG. 29.

In this normal operation OP1, the semiconductor circuit 1M writes information to the SRAM circuit 40 of the memory cell 30M or reads information from the SRAM circuit 40. The resistance states of the memory elements 33L and 34L are each maintained in a predetermined resistance state (the high resistance state RH in this example).

In the store operation OP2, the driver 22K sets the voltage of the signal SSTRL to the high level as illustrated in FIG. 29. This turns on each of the transistors 61 and 65 as illustrated in FIG. 34B. The driver 22K then turns on the transistor 24 and turns off the transistor 25 as illustrated in FIG. 34B, thereby setting the voltage of the signal SCTRL to the high level voltage VH (power supply voltage level). This causes the store current Istr to flow to one of the memory elements 33L and 34L.

In this example, the voltage VN1 at the node N1 is the high level voltage VH, and the voltage VN2 at the node N2 is the low level voltage VL; therefore, the transistors 62 and 63 are on, and the transistors 66 and 67 are off. Accordingly, in the memory cell 30M, as illustrated in FIG. 34B, the store current Istr flows in order of the transistor 24, the memory element 33L, the transistor 62, and the transistor 61. At this time, in the memory element 34L, the store current Istr flows from the pinned layer P to the free layer F, which causes the resistance state of the memory element 33L to be set to the high resistance state RH.

The standby operation OP3 and the restore operation OP4 are similar to those in the above-described embodiment (FIGS. 5C and 5D).

In the reset operation OP5, the driver 22K sets the voltage of the signal SRSBL to the low level as illustrated in FIG. 29. This turns on each of the transistors 64 and 68 as illustrated in FIG. 34C. In addition, the driver 22K sets the voltage of the signal SCTRL to the low level voltage VL (power supply voltage level) as illustrated in FIG. 29. This causes the reset current Irs to flow to one of the memory elements 33L and 34L.

In this example, immediately after the restore operation OP4, the voltage VN1 at the node N1 is the high level voltage VH, and the voltage VN2 at the node N2 is the low level voltage VL. Thus, the transistors 62 and 63 are on, and the transistors 66 and 67 are off. Accordingly, in the memory cell 30M, as illustrated in FIG. 34C, the reset current Irs flows in order of the transistor 64, the transistor 63, the memory element 33L, and the transistor 25. At this time, in the memory element 33L, the reset current Irs flows from the free layer F to the pinned layer P, which causes the resistance state of the memory element 33L to be set to the low resistance state RL.

As described above, both the resistance states of the memory elements 33L and 34L are set to the low resistance state RL by the reset operation OP5. Thereafter, the semiconductor circuit 1M performs the normal operation OP1 (FIG. 34A).

Modification Example 8

In the above-described embodiment, each of the memory elements 33 and 4 is configured using the magnetic tunneling junction element, but this is not limitative, and as in a memory cell 30N illustrated in FIG. 35, it is possible to use any of various memory elements 33N and 34N of which a resistance state is reversibly changed. For example, the memory elements 33N and 34N may each have a resistance state changed in accordance with the direction of a current flowing between two terminals, or a resistance state changed in accordance with polarity of a voltage applied between the two terminals. The memory elements 33N and 34N may each be a unipolar element or a bipolar element. Specifically, it is possible to use, for example, any of a variable resistance memory element, a phase-change memory element, a ferroelectric memory element, a carbon nanotube memory element, and the like for the memory elements 33N and 34N.

Modification Example 9

In the above-described embodiment, the power supply transistor 12 is configured using the P-type MOS transistor, but this is not limitative. Alternatively, for example, as in a semiconductor circuit 1P illustrated in FIG. 36, a power supply transistor may be configured using an N-type MOS transistor. The semiconductor circuit 1P includes a controller 11P, a power supply transistor 12P, and a memory circuit 20P. The power supply transistor 12P is an N-type MOS transistor in this example, and has a gate to be supplied with a power supply control signal, a drain coupled to the memory circuit 20P, and a source to be supplied with a ground voltage VSS1. With this configuration, in the semiconductor circuit 1P, in a case where the memory circuit 20P is used, the power supply transistor 12P is turned on, and the ground voltage VSS1 is supplied as the ground voltage VSS to the memory circuit 20P. In addition, in the semiconductor circuit 1P, in a case where the memory circuit 20P is not used, the power supply transistor 12P is turned off.

Modification Example 10

In the above-described embodiment, the present technology is applied to the SRAM circuit, but this is not limitative. For example, the present technology may be applied to a flip-flop circuit, for example. The present modification example is described in detail with some examples.

FIG. 37 illustrates a configuration example of a flip-flop circuit 101 according to the present application example.

The flip-flop circuit 101 includes a master latch circuit 101M and a slave latch circuit 101S. A technology similar to that in the memory cell 30 (FIG. 2) according to the above-described embodiment is applied to the slave latch circuit 101S. The slave latch circuit 101S includes inverters IV13 and IV14, a transmission gate TG2, a transistor TR2, the transistors 31, 32, and 51 to 58, and the memory elements 33 and 34. The inverter IV13 corresponds to the inverter IV1 in the above-described embodiment, has an input terminal coupled to a node N14 and an output terminal coupled to a node N15. The inverter IV14 corresponds to the inverter IV2 in the above-described embodiment, and has an input terminal coupled to the node N15 and an output terminal coupled to a node N16. The transmission gate TG2 has one end coupled to the node N16, and another end coupled to the node N14. The transistor TR2 is an N-type MOS transistor in this example, and has a gate to be supplied with the signal SRSTRL, a source coupled to the node N16, and a drain coupled to the node N14. The node N16 corresponds to the node N1 in the above-described embodiment, and the node N15 corresponds to the node N2 in the above-described embodiment. The drain of the transistor 31 is coupled to the node N16, and the drain of the transistor 32 is coupled to the node N15.

It is to be noted that, in the flip-flop circuit 101, the drain of the transistor 31 and the gates of the transistors 53 and 56 are coupled to the node N16, but this is not limitative. Alternatively, for example, as in a slave latch circuit 102S of a flip-flop circuit 102 illustrated in FIG. 38, the drain of the transistor 31 and the gates of the transistors 53 and 56 may be coupled to the node N14.

FIG. 39 illustrates a configuration example of a flip-flop circuit 103 according to the present application example. The flip-flop circuit 103 includes a master latch circuit 103M and a slave latch circuit 103S. The technology similar to that in the memory cell 30 according to the above-described embodiment is applied to the master latch circuit 103M. The master latch circuit 103M includes inverters IV11 and IV12, a transmission gate TG1, the transistor TR1, the transistors 31, 32, and 51 to 58, and the memory elements 33 and 34. The inverter IV11 corresponds to the inverter IV1 in the above-described embodiment, and has an input terminal coupled to a node N11 and an output terminal coupled to a node N12. The inverter IV12 corresponds to the inverter IV2 in the above-described embodiment, and has an input terminal coupled to the node N12 and an output terminal coupled to a node N13. The transmission gate TG1 has one end coupled to the node N13 and another end coupled to the node N11. The transistor TR1 is an N-type MOS transistor in this example, and has the gate to be supplied with the signal SRSTRL, the source coupled to the node N13, and the drain coupled to the node N11. The node N13 corresponds to the node N1 in the above-described embodiment, and the node N12 corresponds to the node N2 in the above-described embodiment. The drain of the transistor 31 is coupled to the node N13, and the drain of the transistor 32 is coupled to the node N12.

It is to be noted that, in the flip-flop circuit 103, the drain of the transistor 31 and the gates of the transistors 53 and 56 are coupled to the node N13, but this is not limitative. Alternatively, for example, as in a master latch circuit 104M of a flip-flop circuit 104 illustrated in FIG. 40, the drain of the transistor 31 and the gates of the transistors 53 and 56 may be coupled to the node N11.

It is to be noted that the technology similar to that in the memory cell 30 (FIG. 2) according to the above-described embodiment is applied to these flip-flop circuits 101 to 104, but this is not limitative, and a technology similar to that in any of various memory cells according to the above-described modification examples is applicable. [Another Modification Example]

In addition, two or more of these modification examples may be combined together.

2. Application Example

Next, description is given of an application example of the technology described in the embodiment and the modification examples described above.

FIG. 41 illustrates an example of an information processor 300 according to the present application example. The information processor 300 is a so-called multi-core processor, and includes two processor core sections 310 and 320, a secondary cache memory section 330, and a power supply controller 301. It is to be noted that, in this example, the two processor core sections 310 and 320 are provided, but this is not limitative, and three or more processor core sections may be provided. The information processor 300 may be implemented with a single semiconductor chip, or may be implemented with use of a plurality of semiconductor chips.

The processor core section 310 includes a power supply transistor 311 and a processor core 312. The power supply transistor 311 is a P-type MOS transistor in this example, and has a gate to be supplied with a power supply control signal, a source to be supplied with the power supply voltage VDD1, and a drain coupled to the processor core 312. The processor core 312 includes a flip-flop circuit 313 and a primary cache memory 314. It is possible to use, for example, any of flip-flop circuits 101 to 104 (FIGS. 37 to 40) for the flip-flop circuit 313. It is possible to use various memory cells described in the above-described embodiment for the primary cache memory 314. The processor core 312 is configured to perform the normal operation OP1, the store operation OP2, the standby operation OP3, the restore operation OP4, and the reset operation OP5 on the basis of a control signal supplied from the power supply controller 301.

The processor core section 320 has a configuration similar to that of the processor core section 310. A power supply transistor 321, a processor core 322, a flip-flop circuit 323, and a primary cache memory 324 of the processor core section 320 respectively correspond to the power supply transistor 311, the processor core 312, the flip-flop circuit 313, and the primary cache memory 314 of the processor core section 310.

The secondary cache memory section 330 includes a power supply transistor 331 and a secondary cache memory 332. The power supply transistor 331 is a P-type MOS transistor in this example, and has a gate to be supplied with the power supply control signal, a source to be supplied with the power supply voltage VDD1, and a drain coupled to the secondary cache memory 332. It is possible to use various memory cells described in the above-described embodiment for the secondary cache memory 332. The secondary cache memory 332 is configured to perform the normal operation OP1, the store operation OP2, the standby operation OP3, the restore operation OP4, and the reset operation OP5 on the basis of a control signal supplied from the power supply controller 301.

The power supply controller 301 determines a processor core section to be operated of the processor core sections 310 and 320 on the basis of a load of processing to be performed by the information processor 300, a method of supplying power to the information processor 300 (for example, whether or not power is supplied from a battery), and the like, and controls operations of the processor core sections 310 and 320 and the secondary cache memory section 330 on the basis of a result of such determination.

Specifically, in a case where the power supply controller 301 operates the processor core section 310 and does not operate the processor core section 320, the power supply controller 301 turns on the power supply transistor 311 of the processor core section 310 and the power supply transistor 331 of the secondary cache memory section 330, and turns off the power supply transistor 321 of the processor core section 320, for example. In addition, for example, in a case where the power supply controller 301 operates the processor core sections 310 and 320, the power supply controller 301 turns on the power supply transistor 311 of the processor core section 310, the power supply transistor 321 of the processor core section 320, and the power supply transistor 331 of the secondary cache memory section 330. In addition, for example, in a case where the power supply controller 301 does not operate the processor core sections 310 and 320, the power supply controller 301 turns off the power supply transistor 311 of the processor core section 310, the power supply transistor 321 of the processor core section 320, and the power supply transistor 331 of the secondary cache memory section 330.

In addition, in a case where it is desired to stop the operation of the processor core section 310, the power supply controller 301 instructs the processor core section 310 to perform the store operation OP2 immediately before turning off the power supply transistor 311 of the processor core section 310, for example. In addition, in a case where it is desired to start the operation of the processor core section 310, the power supply controller 301 instructs the processor core section 310 to perform the restore operation OP4 immediately after turning on the power supply transistor 311 of the processor core section 310, for example. The same applies to the processor core section 320 and the secondary cache memory section 330.

In this information processor 300, each of the processor core sections 310 and 320 and the secondary cache memory section 330 includes the power supply transistor, but this is not limitative. Alternatively, for example, as in an information processor 300A illustrated in FIG. 42, a power supply transistor may be provided in a power supply controller. The information processor 300A includes processor cores 312 and 322, a secondary cache memory 332, and a power supply controller 340. The power supply controller 340 includes power supply transistors 341 to 343. The power supply transistors 341 to 343 are P-type MOS transistors in this example. The power supply transistor 341 has a source to be supplied with the power supply voltage VDD1 and a drain coupled to the processor core 312. The power supply transistor 342 has a source to be supplied with the power supply voltage VDD1 and a drain coupled to the processor core 322. The power supply transistor 343 has a source to be supplied with the power supply voltage VDD1 and a drain coupled to the secondary cache memory 332.

Although the present technology has been described above with reference to the embodiment, some modification examples, and application examples thereof, the present technology is not limited to the embodiment and the like, and may be modified in a variety of ways.

For example, in the embodiment and the like described above, the present technology is applied to the SRAM circuit and a D-type flip-flop circuit, but is not limited thereto.

Specifically, for example, the present technology may be applied to another flip-flop circuit, or may be applied to a latch circuit.

It is to be noted that the effects described herein are merely illustrative and are not limitative, and other effects may be included.

It is to be noted that the present technology may have any of the following configurations.

(1)

A semiconductor circuit including:

a first circuit that is configured to generate an inverted voltage of a voltage at a first node and apply the inverted voltage to a second node;

a second circuit that is configured to generate an inverted voltage of a voltage at the second node and apply the inverted voltage to the first node;

a first transistor that is configured to couple the first node to a third node by being turned on;

a first memory element that has a first terminal coupled to the third node and a second terminal to which a control voltage is to be applied, and is allowed to take a first resistance state or a second resistance state;

a second transistor having a source to which a first voltage is to be applied, a drain coupled to the third node, and a gate coupled to a first predetermined node, the first predetermined node being one of the first node and the second node;

a third transistor having a source to which a second voltage is to be applied, a drain coupled to the third node, and a gate coupled to a second predetermined node, the second predetermined node being the other of the first node and the second node;

a fourth transistor that is configured to couple the second node to a fourth node by being turned on;

a second memory element that has a first terminal coupled to the fourth node and a second terminal to which the control voltage is to be applied, and is allowed to take the first resistance state or the second resistance state;

a fifth transistor having a source to which the first voltage is to be applied, a drain coupled to the fourth node, and a gate coupled to the second predetermined node;

a sixth transistor having a source to which the second voltage is to be applied, a drain coupled to the fourth node, and a gate coupled to the first predetermined node; and a driver that is configured to control operations of the first transistor and the fourth transistor and set the control voltage.

(2)

The semiconductor circuit according to (1), further including:

a seventh transistor having a source to which the first voltage is applied and a drain coupled to the source of the second transistor;

an eighth transistor having a source to which the second voltage is applied and a drain coupled to the source of the third transistor;

a ninth transistor having a source to which the first voltage is applied and a drain coupled to the source of the fifth transistor; and a tenth transistor having a source to which the second voltage is applied and a drain coupled to the source of the sixth transistor, in which the driver is configured to further control operations of the seventh transistor, the eighth transistor, the ninth transistor, and the tenth transistor.

(3)

The semiconductor circuit according to (2), in which, in a first period, the driver is configured to turn off the first transistor, the fourth transistor, the eighth transistor, and the tenth transistor, turn on the seventh transistor and the ninth transistor, and set the control voltage to a third voltage.

(4)

The semiconductor circuit according to (3), in which, in a second period after the first period, the driver is configured to turn on the first transistor and the fourth transistor and turn off the seventh transistor, the eighth transistor, the ninth transistor, and the tenth transistor.

(5)

The semiconductor circuit according to (4), in which, in a third period before a voltage at the first node is changed after the second period, the driver is configured to turn off the first transistor, the fourth transistor, the seventh transistor, and the ninth transistor, turn on the eighth transistor and the tenth transistor, and set the control voltage to a fourth voltage.

(6)

The semiconductor circuit according to (4) or (5), further including a controller that is configured to control power supply to the first circuit and the second circuit and is configured to stop the power supply to the first circuit and the second circuit in a fourth period between the first period and the second period.

(7)

The semiconductor circuit according to (1), further including:

an eleventh transistor having a source to which the first voltage is to be applied and a drain coupled to the source of the second transistor and the source of the fifth transistor; and a twelfth transistor having a source to which the second voltage is to be applied and a drain coupled to the source of the third transistor and the source of the sixth transistor.

(8)

The semiconductor circuit according to (1), further including:

a first control line coupled to the source of the second transistor and the source of the fifth transistor; and a second control line coupled to the source of the third transistor and the source of the sixth transistor, in which the driver is configured to further drive the first control line and the second control line.

(9)

The semiconductor circuit according to (8), further including:

a third circuit that is configured to generate an inverted voltage of a voltage at a fifth node and apply the inverted voltage to a sixth node;

a fourth circuit that is configured to generate an inverted voltage of a voltage at the sixth node and apply the inverted voltage to the fifth node;

an thirteenth transistor that is configured to couple the fifth node to a seventh node by being turned on;

a third memory element that has a first terminal coupled to the seventh node and a second terminal to which the control voltage is to be applied, and is allowed to take the first resistance state or the second resistance state;

a fourteenth transistor having a source coupled to the first control line, a drain coupled to the seventh node, and a gate coupled to a third predetermined node, the third predetermined node being one of the fifth node and the sixth node;

a fifteenth transistor having a source coupled to the second control line, a drain coupled to the seventh node, and a gate coupled to a fourth predetermined node, the fourth predetermined node being the other of the fifth node and the sixth node;

an sixteenth transistor that is configured to couple the sixth node to an eighth node by being turned on;

a fourth memory element that has a first terminal coupled to the eighth node and a second terminal to which the control voltage is to be applied, and is allowed to take the first resistance state or the second resistance state;

a seventeenth transistor having a source coupled to the first control line, a drain coupled to the eighth node, and a gate coupled to the second predetermined node; and an eighteenth transistor having a source coupled to the second control line, a drain coupled to the eighth node, and a gate coupled to the first predetermined node.

(10)

The semiconductor circuit according to any one of (1) to (9), in which the driver is configured to generate the control voltage.

(11)

The semiconductor circuit according to any one of (1) to (9), further including:

a nineteenth transistor having a source to which the first voltage is to be applied and a drain coupled to the second terminal of the first memory element and the second terminal of the second memory element; and a twentieth transistor having a source to which the second voltage is to be applied and a drain coupled to the second terminal of the first memory element and the second terminal of the second memory element, in which the driver is configured to set the control voltage by controlling operations of the nineteenth transistor and the twentieth transistor.

(12)

The semiconductor circuit according to any one of (1) to (11), further including a power supply transistor that is configured to supply power to the first circuit and the second circuit by being turned on.

(13)

The semiconductor circuit according to any one of (1) to (12), in which each of the first memory element and the second memory element is configured to store information with use of a resistance state reversibly changed in accordance with a direction of a current flowing between the first terminal and the second terminal.

(14)

The semiconductor circuit according to any one of (1) to (13), in which each of the first memory element and the second memory element includes a unipolar or bipolar element.

(15)

The semiconductor circuit according to any one of (1) to (14), in which each of the first memory element and the second memory element includes one of a magnetic tunneling junction memory element, a variable resistance memory element, a phase-change memory element, a ferroelectric memory element, and a nanotube memory element.

(16)

The semiconductor circuit according to any one of (1) to (12), in which each of the first memory element and the second memory element is configured to store information with use of a resistance state reversibly changed in accordance with polarity of a voltage applied between the first terminal and the second terminal.

(17)

The semiconductor circuit according to any one of (1) to (16), in which the first circuit and the second circuit are included in an SRAM circuit.

(18)

The semiconductor circuit according to any one of (1) to (16), in which the first circuit and the second circuit are included in a latch circuit.

(19)

A semiconductor circuit system comprising:

a memory section; and a controller that controls power supply to the memory section, the memory section including a first circuit that is configured to generate an inverted voltage of a voltage at a first node and apply the inverted voltage to a second node, a second circuit that is configured to generate an inverted voltage of a voltage at the second node and apply the inverted voltage to the first node, a first transistor that is configured to couple the first node to a third node by being turned on, a first memory element that has a first terminal coupled to the third node and a second terminal to which a control voltage is to be applied, and is allowed to take a first resistance state or a second resistance state, a second transistor having a source to which a first voltage is to be applied, a drain coupled to the third node, and a gate coupled to a first predetermined node, the first predetermined node being one of the first node and the second node, a third transistor having a source to which a second voltage is to be applied, a drain coupled to the third node, and a gate coupled to a second predetermined node, the second predetermined node being the other of the first node and the second node, a fourth transistor that is configured to couple the second node to a fourth node by being turned on, a second memory element that has a first terminal coupled to the fourth node and a second terminal to which the control voltage is to be applied, and is allowed to take the first resistance state or the second resistance state, a fifth transistor having a source to which the first voltage is to be applied, a drain coupled to the fourth node, and a gate coupled to the second predetermined node, a sixth transistor having a source to which the second voltage is to be applied, a drain coupled to the fourth node, and a gate coupled to the first predetermined node, and a driver that is configured to control operations of the first transistor and the fourth transistor and set the control voltage.

This application claims the benefit of Japanese Priority Patent Application JP2017-237979 filed with the Japan Patent Office on Dec. 12, 2017, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A semiconductor circuit, comprising:
 a first circuit configured to generate an inverted voltage of a voltage at a first node and apply the inverted voltage to a second node;
 a second circuit configured to generate an inverted voltage of a voltage at the second node and apply the inverted voltage, of the voltage at the second node, to the first node;
 a first transistor configured to couple the first node to a third node by being turned on;
 a first memory element that has a first terminal coupled to the third node and a second terminal to which a control voltage is to be applied, and is allowed to take a first resistance state or a second resistance state;
a second transistor having a source to which a first voltage is to be applied, a drain coupled to the third node, and a gate coupled to a first predetermined node, the first predetermined node being one of the first node and the second node;
a third transistor having a source to which a second voltage is to be applied, a drain coupled to the third node, and a gate coupled to a second predetermined node, the second predetermined node being the other of the first node and the second node;
a fourth transistor configured to couple the second node to a fourth node by being turned on;
a second memory element that has a first terminal coupled to the fourth node and a second terminal to which the control voltage is to be applied, and is allowed to take the first resistance state or the second resistance state;
a fifth transistor having a source to which the first voltage is to be applied, a drain coupled to the fourth node, and a gate coupled to the second predetermined node;
a sixth transistor having a source to which the second voltage is to be applied, a drain coupled to the fourth node, and a gate coupled to the first predetermined node; and
a driver configured to control operations of the first transistor and the fourth transistor and set the control voltage.

2. The semiconductor circuit according to claim 1, further comprising:
a seventh transistor having a source to which the first voltage is applied and a drain coupled to the source of the second transistor;
an eighth transistor having a source to which the second voltage is applied and a drain coupled to the source of the third transistor;
a ninth transistor having a source to which the first voltage is applied and a drain coupled to the source of the fifth transistor; and
a tenth transistor having a source to which the second voltage is applied and a drain coupled to the source of the sixth transistor, wherein
the driver is configured to further control operations of the seventh transistor, the eighth transistor, the ninth transistor, and the tenth transistor.

3. The semiconductor circuit according to claim 2, wherein, in a first period, the driver is configured to turn off the first transistor, the fourth transistor, the eighth transistor, and the tenth transistor, turn on the seventh transistor and the ninth transistor, and set the control voltage to a third voltage.

4. The semiconductor circuit according to claim 3, wherein, in a second period after the first period, the driver is configured to turn on the first transistor and the fourth transistor and turn off the seventh transistor, the eighth transistor, the ninth transistor, and the tenth transistor.

5. The semiconductor circuit according to claim 4, wherein, in a third period before the voltage at the first node is changed after the second period, the driver is configured to turn off the first transistor, the fourth transistor, the seventh transistor, and the ninth transistor, turn on the eighth transistor and the tenth transistor, and set the control voltage to a fourth voltage.

6. The semiconductor circuit according to claim 4, further comprising a controller configured to control a power supply to the first circuit and the second circuit and is configured to stop the power supply to the first circuit and the second circuit in a fourth period between the first period and the second period.

7. The semiconductor circuit according to claim 1, further comprising:
an eleventh transistor having a source to which the first voltage is to be applied and a drain coupled to the source of the second transistor and the source of the fifth transistor; and
a twelfth transistor having a source to which the second voltage is to be applied and a drain coupled to the source of the third transistor and the source of the sixth transistor.

8. The semiconductor circuit according to claim 1, further comprising:
a first control line coupled to the source of the second transistor and the source of the fifth transistor; and
a second control line coupled to the source of the third transistor and the source of the sixth transistor, wherein
the driver is configured to further drive the first control line and the second control line.

9. The semiconductor circuit according to claim 8, further comprising:
a third circuit configured to generate an inverted voltage of a voltage at a fifth node and apply the inverted voltage, of the voltage at the fifth node, to a sixth node;
a fourth circuit configured to generate an inverted voltage of a voltage at the sixth node and apply the inverted voltage, of the voltage at the sixth node, to the fifth node;
an thirteenth transistor configured to couple the fifth node to a seventh node by being turned on;
a third memory element that has a first terminal coupled to the seventh node and a second terminal to which the control voltage is to be applied, and is allowed to take the first resistance state or the second resistance state;
a fourteenth transistor having a source coupled to the first control line, a drain coupled to the seventh node, and a gate coupled to a third predetermined node, the third predetermined node being one of the fifth node and the sixth node;
a fifteenth transistor having a source coupled to the second control line, a drain coupled to the seventh node, and a gate coupled to a fourth predetermined node, the fourth predetermined node being the other of the fifth node and the sixth node;
an sixteenth transistor configured to couple the sixth node to an eighth node by being turned on;
a fourth memory element that has a first terminal coupled to the eighth node and a second terminal to which the control voltage is to be applied, and is allowed to take the first resistance state or the second resistance state;
a seventeenth transistor having a source coupled to the first control line, a drain coupled to the eighth node, and a gate coupled to the second predetermined node; and
an eighteenth transistor having a source coupled to the second control line, a drain coupled to the eighth node, and a gate coupled to the first predetermined node.

10. The semiconductor circuit according to claim 1, wherein the driver is configured to generate the control voltage.

11. The semiconductor circuit according to claim 1, further comprising:
a nineteenth transistor having a source to which the first voltage is to be applied and a drain coupled to the second terminal of the first memory element and the second terminal of the second memory element; and a twentieth transistor having a source to which the second voltage is to be applied and a drain coupled to the second terminal of the first memory element and the second terminal of the second memory element, wherein
the driver is configured to set the control voltage by controlling operations of the nineteenth transistor and the twentieth transistor.

12. The semiconductor circuit according to claim 1, further comprising a power supply transistor configured to supply power to the first circuit and the second circuit by being turned on.

13. The semiconductor circuit according to claim 1, wherein each of the first memory element and the second memory element is configured to store information with use of a resistance state reversibly changed in accordance with a direction of a current flowing between the respective first terminal and the respective second terminal.

14. The semiconductor circuit according to claim 1, wherein each of the first memory element and the second memory element includes a unipolar or bipolar element.

15. The semiconductor circuit according to claim 1, wherein each of the first memory element and the second memory element includes one of a magnetic tunneling junction memory element, a variable resistance memory element, a phase-change memory element, a ferroelectric memory element, and a nanotube memory element.

16. The semiconductor circuit according to claim 1, wherein each of the first memory element and the second memory element is configured to store information with use of a resistance state reversibly changed in accordance with polarity of a voltage applied between the respective first terminal and the respective second terminal.

17. The semiconductor circuit according to claim 1, wherein the first circuit and the second circuit are included in an SRAM circuit.

18. The semiconductor circuit according to claim 1, wherein the first circuit and the second circuit are included in a latch circuit.

19. A semiconductor circuit system, comprising:
a memory section; and
a controller that controls power supply to the memory section,
the memory section including:
a first circuit configured to generate an inverted voltage of a voltage at a first node and apply the inverted voltage to a second node,
a second circuit configured to generate an inverted voltage of a voltage at the second node and apply the inverted voltage, of the voltage at the second node, to the first node,
a first transistor configured to couple the first node to a third node by being turned on,
a first memory element that has a first terminal coupled to the third node and a second terminal to which a control voltage is to be applied, and is allowed to take a first resistance state or a second resistance state,
a second transistor having a source to which a first voltage is to be applied, a drain coupled to the third node, and a gate coupled to a first predetermined node, the first predetermined node being one of the first node and the second node,
a third transistor having a source to which a second voltage is to be applied, a drain coupled to the third node, and a gate coupled to a second predetermined node, the second predetermined node being the other of the first node and the second node,
a fourth transistor configured to couple the second node to a fourth node by being turned on,
a second memory element that has a first terminal coupled to the fourth node and a second terminal to which the control voltage is to be applied, and is allowed to take the first resistance state or the second resistance state,
a fifth transistor having a source to which the first voltage is to be applied, a drain coupled to the fourth node, and a gate coupled to the second predetermined node,
a sixth transistor having a source to which the second voltage is to be applied, a drain coupled to the fourth node, and a gate coupled to the first predetermined node, and
a driver configured to control operations of the first transistor and the fourth transistor and set the control voltage.

* * * * *